(12) United States Patent
Hidaka

(10) Patent No.: US 7,489,001 B2
(45) Date of Patent: Feb. 10, 2009

(54) MAGNETIC THIN-FILM MEMORY DEVICE FOR QUICK AND STABLE READING DATA

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/708,030

(22) Filed: Feb. 20, 2007

(65) Prior Publication Data

US 2007/0147110 A1  Jun. 28, 2007

Related U.S. Application Data

(63) Continuation of application No. 10/891,109, filed on Jul. 15, 2004, now Pat. No. 7,254,057, which is a continuation of application No. 09/887,321, filed on Jun. 25, 2001, now Pat. No. 6,778,430.

(30) Foreign Application Priority Data

Sep. 22, 2000  (JP) .............................. 2000-288642
Jan. 29, 2001  (JP) .............................. 2001-020277

(51) Int. Cl.
*H01L 27/108* (2006.01)

(52) U.S. Cl. .............................. 257/295; 257/E21.665; 365/171; 365/173

(58) Field of Classification Search ................. 257/295, 257/E21.665, 315; 365/171, 173, 158
See application file for complete search history.

(56) References Cited

U.S. PATENT DOCUMENTS 3,849,768 A   11/1974  Durvasula et al.
4,903,238 A   2/1990   Miyatake et al.
5,640,343 A   6/1997   Gallagher et al.
5,646,903 A   7/1997   Johnson
5,650,958 A   7/1997   Gallagher et al.
5,691,950 A   11/1997  McClure
5,734,605 A   3/1998   Zhu et al.
5,835,314 A   11/1998  Moodera et al.

(Continued)

OTHER PUBLICATIONS

Roy Scheuerlein, William Gallagher, Stuart Parkin, Alex Lee, Sam Ray, Ray Robertazzi, and William Reohr, "A 10ns Read and Write Non-Volatile Memory Array Using a Magnetic Tunnel Junction and FET Switch in each Cell," ISSCC Digest of Technical Papers, TA 7.2, Feb. 2000, pp. 94-95, 128-129, and 409-410.

M. Durlam, P. Naji, M. DeHerrera, S. Tehrani, G. Kerszykowski, K. Kyler, "Nonvolatile RAM Based on Magnetic Tunnel Junction Elements," ISSCC Digest Of Technical Papers, TA 7.3, Feb. 2000, pp. 96-97, 130-131, and 410-411.

(Continued)

*Primary Examiner*—Andy Huynh
*Assistant Examiner*—Thinh T Nguyen
(74) *Attorney, Agent, or Firm*—McDermott Will & Emery LLP

(57) ABSTRACT

An MTJ memory cell is independently provided with a write word line and a read word line used for data write and data read. By separately arranging read word lines every two regions formed by dividing a memory array in the column direction, it is possible to reduce signal propagation delays of the read word lines and accelerate the data read operation. Activation of each read word line is controlled by a write word line in accordance with a row selection result in a hierarchical manner. A word-line-current control circuit forms and cuts off the current path of a write word line correspondingly to data write and data read.

4 Claims, 40 Drawing Sheets

U.S. PATENT DOCUMENTS

| | | | |
|---|---|---|---|
| 5,852,574 | A | 12/1998 | Naji |
| 5,946,227 | A | 8/1999 | Naji |
| 6,097,626 | A | 8/2000 | Brug et al. |
| 6,219,273 | B1 * | 4/2001 | Katti et al. ............... 365/158 |
| 6,269,018 | B1 | 7/2001 | Monsma et al. |
| 6,272,041 | B1 | 8/2001 | Naji |
| 6,278,631 | B1 | 8/2001 | Naji |
| 6,349,054 | B1 | 2/2002 | Hidaka |
| 6,359,805 | B1 | 3/2002 | Hidaka et al. |
| 6,385,078 | B2 | 5/2002 | Jeon |
| 6,515,896 | B1 * | 2/2003 | Tran ............... 365/171 |
| 6,608,776 | B2 | 8/2003 | Hidaka |
| 6,778,430 | B2 | 8/2004 | Hidaka |

OTHER PUBLICATIONS

Scheuerlein, Roy., et al. "TA 7.2: A 10ns Read and Write Non-Volatile Memory Array Using a Magnetic Tunnel Junction and FET Switch in each Cell." 2000 IEEE International Solid State Circuits Conference, pp. 1 (Front Page Only).

Durlam, M., et al. "TA 7.3; Nonvolatile RAM based on Magnetic Tunnel Junctions Elements." 2000 IEEE International Solid State Circuits Conference, pp. 1 (Front Page Only).

Yoshimoto, Masahiko., et al. "Session VI: CMOS Memory: WPM 6.2: A 64Kb Full CMOS RAM with Divided Word Line Structure." Feb. 1983, IEEE International Solid State Circuits Conference, vol. XXVI, Digest of Technical Papers, pp. 58, 59 and 287.

* cited by examiner

MAGNETIC THIN-FILM MEMORY DEVICE FOR QUICK AND STABLE READING DATA

RELATED APPLICATIONS

This application is a continuation of application Ser. No. 10/891,109, filed Jul. 15, 2004 now U.S. Pat. No. 7,254,057, which is a continuation of application Ser. No. 09/887,321 filed Jun. 25, 2001, now U.S. Pat. No. 6,778,430, in turn claims priority to Japanese Application Nos. 2000-288642, filed Sep. 22, 2000 and 2001-020277, filed Jan. 29, 2001, the contents of which are hereby incorporated by reference.

BACKGROUND OF THE INVENTION

1. Field of the Invention

The present invention relates to a magnetic thin-film memory device, particularly to a random access memory provided with a memory cell having a magnetic tunneling junction (MTJ).

2. Description of the Background Art

An MRAM (Magnetic Random Access Memory) device is watched as a memory device capable of storing data in a nonvolatile manner at a low power consumption. The MRAM device is a memory device for storing data in a nonvolatile manner by using a plurality of magnetic thin films formed on a semiconductor integrated circuit and capable of random-accessing each magnetic thin film.

Particularly, it is recently announced that performances of an MRAM device is remarkably advanced by using a magnetic thin film utilizing a magnetic tunnel junction (MTJ) as a memory cell. An MRAM device provided with a memory cell having a magnetic tunnel junction is disclosed in technical documents, such as "A ions Read and Write Non-Volatile Memory Array Using a Magnetic Tunnel Junction and FET Switch in each Cell", ISSCC Digest of Technical Papers, TA7.2, February 2000 and "Nonvolatile RAM based on Magnetic Tunnel Junction Elements", ISSCC Digest of Technical Papers, TA7.3, February 2000.

FIG. 42 is a schematic diagram showing a configuration of a memory cell having a magnetic tunnel junction (hereafter also merely referred to as MTJ memory cell).

Referring to FIG. 42, an MTJ memory cell is provided with a magnetic tunnel junction portion MTJ whose resistance values are changed in accordance with the level of storage data and an access transistor ATR. The access transistor ATR is constituted of a field-effect transistor and connected between the magnetic tunnel junction portion MTJ and a ground voltage Vss.

A write word line WWL for designating data write, a read word line RWL for designating data read, and a bit line BL serving as a data line for transferring an electrical signal corresponding to the level of storage data under data read and data write are arranged on an MTJ memory cell.

FIG. 43 is a conceptual diagram for explaining the operation for reading data from an MTJ memory.

Referring to FIG. 43, a magnetic tunnel junction portion MTJ has a magnetic layer having a constant-directional fixed magnetic field (hereafter also simply referred to as a fixed magnetic layer) FL and a magnetic layer having a free magnetic field (hereafter also simply referred to as a free magnetic layer) VL. A tunnel barrier TB constituted of an insulating film is set between the fixed magnetic layer FL and the free magnetic layer VL. A magnetic field having a direction same as or different from the direction of the fixed magnetic layer FL is written in the free magnetic layer VL in a nonvolatile manner in accordance with the level of storage data.

Under data read, the access transistor ATR is turned on in accordance with activation of the read word line RWL. Thereby, a sense current Is supplied from a not-illustrated control circuit is circulated as a constant current through a current path from the bit line BL to the magnetic tunnel junction portion MTJ, access transistor ATR, and ground voltage Vss.

Resistance values of the magnetic tunnel junction portion MTJ are changed in accordance with the magnetic-field-directional relative relation between the fixed magnetic layer FL and the free magnetic layer VL. Specifically, when the magnetic-field direction of the fixed magnetic layer FL is the same as a magnetic-field direction written in the free magnetic layer VL, the resistance value of the magnetic tunnel junction portion MTJ decreases compared to the case in which the both magnetic-field directions are different from each other.

Therefore, under data read, a voltage drop caused at the magnetic tunnel junction portion MTJ by the sense current Is differs in accordance with a magnetic direction stored in the free magnetic layer VL. Thereby, by starting the supply of the sense current Is after once precharging the bit line BL to a high voltage, it is possible to read the level of the data stored in an MTJ memory cell by monitoring a change of voltage levels of the bit line BL.

FIG. 44 is a conceptual diagram for explaining the operation for writing data in an MTJ memory cell.

Referring to FIG. 44, under data write, a read word line RWL is inactivated and an access transistor ATR is turned off. Under the above state, a data write current for writing a magnetic field in a free magnetic layer VL is supplied to a write word line WWL and a bit line BL. The magnetic-field direction of the free magnetic layer VL is decided by a combination of directions of data write currents flowing through the write word line WWL and bit line BL.

FIG. 45 is a conceptual diagram for explaining the relation between directions of a data write current and a magnetic field under data write.

Referring to FIG. 45, a magnetic field Hx shown by a horizontal axis shows the direction of a magnetic field H (WWL) generated by a data write current flowing through a write word line WWL. A magnetic field Hy shown by a vertical axis shows the direction of a magnetic field H (BL) generated by a data write current flowing through a bit line BL.

A magnetic-field direction stored in a free magnetic layer VL is newly written only when the sum of the magnetic fields H (WWL) and H (BL) reaches the region outside of the asteroid curve shown in FIG. 25. That is, when a magnetic field corresponding to the region inside of the asteroid curve is applied, a magnetic-field direction to be stored in the free magnetic layer VL is not updated.

Therefore, to update the data stored in a magnetic tunnel junction portion MTJ through the write operation, it is necessary to supply current to both the write word line WWL and bit line BL. A magnetic-field direction once stored in the magnetic tunnel junction portion MTJ, that is, storage data is held in a nonvolatile manner until new data is written.

Also under the data read operation, the sense current Is flows through the bit line BL. However, because the sense current Is is set so as to be smaller than the above data write current by 1 digit or 2 digits, the data stored in an MTJ memory cell is not easily erroneously rewritten due to the sense current is under data read.

The above technical documents disclose an art for integrating the above MTJ memory cell on a semiconductor substrate to constitute an MRAM device serving as a random access memory.

FIG. 46 is a conceptual diagram showing MTJ memory cells integrated and arranged in a matrix.

Referring to FIG. 46, it is possible to realize a highly-integrated MRAM device by arranging the MTJ memory cells on a semiconductor substrate as a row. FIG. 46 shows a case in which the MTJ memory cells are arranged in n rows×m columns (n, m: natural number).

As already described, it is necessary to arrange bit line BL, write word line WWL, and read word line RWL on each MTJ memory cell. Therefore, it is necessary to arrange n write word lines WWL1 to WWLn, n read word lines RWL1 to RWLn, and m bit lines BL1 to BLn on n×m MTJ memory cells arranged in a matrix.

Thus, it is general to set an independent word line to an MTJ memory cell correspondingly to the read operation and write operation respectively.

FIG. 47 is a structural drawing of an MTJ memory cell formed on a semiconductor substrate.

Referring to FIG. 47, an access transistor ATR is constituted in a p-type region PAR on a semiconductor substrate SUB. The access transistor ATR has source/drain regions 110 and 120 and a gate 130. The source/drain region 110 is connected with a ground voltage Vss through a metallic wiring formed on a first metallic-wiring layer M1. A metallic wiring formed on a second metallic-wiring layer M2 is used for a write word line WWL. Moreover, a bit line BL is provided for a third metallic-wiring layer M3.

A magnetic tunnel junction portion MTJ is set between the second metallic-wiring layer M2 on which a write word line WWL will be formed and the third metallic-wiring layer M3 on which a bit line BL will be formed. The source/drain region 120 of the access transistor ATR is electrically connected with the magnetic tunnel junction portion MTJ through a metallic film 150 formed on a contact hole, the first and second metallic-wiring layers M1 and M2, and a barrier metal 140. The barrier metal 140 serves as a cushion set to electrically connect a magnetic tunnel junction portion MTJ with a metallic wiring.

As already described, in the case of an MTJ memory cell, a read word line RWL is formed as a wiring independent of a write word line WWL. Moreover, it is necessary to supply a data write current for generating a magnetic field having an intensity equal to or larger than a predetermined value under data write to the write word line WWL and bit line BL.

On the other hand, the read word line RWL is formed to control the gate voltage of the access transistor ATR but it is unnecessary to positively supply current to the line RWL. Therefore, to improve an integration degree, a read word line RWL has been constituted of a polysilicon layer or polycide structure on the same wiring layer as the gate 130 without newly forming an independent metallic wiring layer.

By using the above configuration, it is possible to control the number of metallic wiring layers and integrate and arrange MTJ cells on a semiconductor substrate. However, because a read word line RWL is constituted of a polysilicon layer or the like, it has a comparatively large resistance value. Thereby, problems occur that a signal propagation delay increases in the read word line RWL under data read and acceleration of data read operation is impeded.

Moreover, a configuration is known which uses a PN-junction diode as an access device instead of an access transistor as the structure of an MTJ memory cell which can be further integrated compared with the MTJ memory cell shown in FIG. 42.

FIG. 48 is a schematic illustration showing the configuration of an MTJ memory cell using a diode. Referring to FIG. 48, the MTJ memory cell MCDD using the diode is provided with a magnetic tunnel junction portion MTJ and an access diode DM. The access diode DM is connected between the magnetic tunnel junction portion MTJ and a word line WL by assuming the direction from the junction MTJ toward the word line WL as the forward direction. A bit line BL is set so as to intersect with the word line WL and connected with the magnetic tunnel junction portion MTJ.

Data is written in the MTJ memory cell MCDD by supplying a data-write current to the word line WL and bit line BL. The direction of the data-write current is set in accordance with the level of write data similarly to the case of a memory using an access transistor.

A word line WL corresponding to a selected memory cell is set to a low-voltage (e.g. ground voltage Vss) state when data is read. In this case, by precharging a bit line BL to a high-voltage (e.g. power-supply voltage Vcc) state, it is possible to supply a sense current Is to the magnetic tunnel junction portion MTJ because the access diode DM is turned on. However, because a word line WL corresponding to an unselected memory cell is set to a high-voltage state, a corresponding access diode DM is kept turned off and the sense current Is does not circulate.

Thus, also in the case of an MJT memory cell using an access diode, it is possible to execute data read and data write.

FIG. 49 is a structural drawing when setting the MTJ memory cell shown in FIG. 48 on a semiconductor substrate.

Referring to FIG. 49, an access diode DM is formed with an N-type region NWL on a main semiconductor substrate SUB and a P-type region PAR formed on the N-type region NWL. FIG. 49 shows an N well as a case of forming an N-type region.

The N-type region NWL corresponding to the cathode of an access diode DM is connected with a word line WL set to a metallic wiring layer M1. The P-type region PAR corresponding to the anode of the access diode DM is electrically connected with a magnetic tunnel junction portion MTJ through a barrier metal 140 and a metallic film 150. A bit line BL is set to a metallic-wiring layer M2 and connected with the magnetic tunnel junction portion MTJ. Thus, by using an access diode instead of an access transistor, it is possible to constitute an MTJ memory cell advantageous for high integration.

However, because a data-write current circulates through the word line WL and bit line BL under data write, a voltage drop due to the data-write current occurs in these wirings, respectively. Because the voltage drop occurs, the PN junction of the access diode DM may be turned on at a part of the MTJ memory cell in which data will not be written depending on a voltage distribution on the word line WL and bit line BL. As a result, erroneous data write may be executed because an unexpected current circulates through the MTJ memory cell.

Thus, a conventional MTJ memory cell MCDD using an access diode is advantageous for high integration but it has a problem that the data write operation becomes unstable.

The present invention is made to solve the above problem and its object is to accelerate and stabilize the data read operation of an MRAM device having an MTJ memory cell.

SUMMARY OF THE INVENTION

It is an object of the present invention to accelerate the data read operation of an MRAM having an MTJ memory cell.

In short, the present invention is regarding to a magnetic thin-film memory device comprising a memory array, a plurality of write word lines, a plurality of read word lines, a word-line-current control circuit, a plurality of data lines, and a read/write control circuit.

The memory array has a plurality of magnetic memory cells arranged in a matrix. Each of the magnetic memory cells includes a storing section whose resistance values are changed in accordance with the level of storage data to be written when a data-write magnetic field to be applied by first and second data-write currents is larger than a predetermined magnetic field and a memory-cell selection gate connected in series with the storing section. The magnetic memory cells are provided correspondingly to rows of a plurality of write-word-line magnetic memory cells and respectively constituted of a wiring having a first resistivity. Each of a plurality of write word lines is selectively activated in accordance with a row selection result under data write and data read. The word-line-current control circuit forms and cuts off the current path of the first data write current for at least activated one of the write word lines under data write and data read. A plurality of the data lines are provided corresponding to columns of the magnetic memory cells. Upon data writing and data reading, the read/write control circuit respectively supplies the second data write current and data read current to at least that one of the data lines, which corresponds to the selected column, under data write and data read. A plurality of the read word lines are provided corresponding to rows of the magnetic memory cells and are respectively constituted of a wiring having a second resistivity higher than the first resistivity. Each read word line is selectively activated together with corresponding one of the write word lines under data read and at least activated one of the read word lines turns ON a corresponding memory-cell selection gate.

Therefore, main advantage of the present invention lies in the fact that it is possible to reduce the signal propagation delay of a read word line and accelerate the data read operation by controlling a read word line having a large resistance value together with a write word line having a small resistance value.

Moreover, because row selection under data read is executed in accordance with the hierarchical control of a main read word line having a small resistance value and a read word line divided for each region, it is possible to independently control the read word line and write word line and accelerate the data read operation.

According to another aspect of the present invention, a magnetic thin-film memory device comprises a memory array, a plurality of write word lines, a plurality of data lines, a read/write control circuit, a plurality of main read word lines, a plurality of read word lines, and a plurality of read-word-line drivers. The memory array has a plurality of magnetic memory cells arranged in a matrix. The memory array is divided into a plurality of regions along the column direction. Each of the magnetic memory cells includes a storing section whose resistance values are changed in accordance with the level of storage data written by a data-write magnetic field generated by first and second data-write currents and a memory-cell selection gate connected in series with the storing section. A plurality of write word lines correspond to rows of magnetic memory cells in common to a plurality of regions and are respectively constituted of a wiring having a first resistivity. The write word lines are selectively activated in accordance with a row selection result in order to supply a first data-write current under data write. A plurality of the data lines are provided corresponding to columns of the magnetic memory cells. Upon data writing and data reading, the read/write control circuit respectively supplies the second data-write current and data read current to at least that one of the data lines, which corresponds to the selected column, under data write and data read, respectively. A plurality of the main read word lines are provided in common to a plurality of regions and respectively constituted of a wiring having a second resistivity. The read word lines correspond to rows of the magnetic memory cells each of the plurality of regions and are respectively constituted of a wiring having a third resistivity higher than the first and second resistivities. Each of the read word lines corresponds to any one of the main read word lines. The read-word-line drivers correspond to the read word lines. Each of the read-word-line drivers activates corresponding one of the read word lines in accordance with the activation of corresponding one of the main read word lines. At least activated one of the read word lines turns ON a corresponding memory-cell selection gate.

Therefore, because a word line having a small resistance value can be used for both data read and data write, it is possible to reduce the number of wirings and accelerate the data read operation.

Still another aspect of the present invention is a magnetic thin-film memory device comprising a memory array, a plurality of data lines, a read/write control circuit, a plurality of word lines, and a word-line-current control circuit.

The memory array has a plurality of magnetic memory cells arranged in a matrix. Each of the magnetic memory cells includes a storing section whose resistance values are changed in accordance with the level of storage data written by a data-write magnetic field according to first and second data-write currents and an access transistor connected in series with the storing section. The data lines correspond to columns of the magnetic memory cells. Upon data writing and data reading, the read/write control circuit respectively supplies first data-write current and data-read current to at least that one of the data lines, which corresponds to the selected column under data write and data read. The word lines correspond to rows of the magnetic memory cells and are respectively activated in accordance with a row selection result. At least activated one of the word lines turns ON a corresponding access transistor. The word-line-current circuit forms a current path of the second data-write current on at least activated one of the word lines. The word-line-current control circuit cuts off the current path of each of the word lines under data read.

Therefore, because a word line can be used for both data read and data write, it is possible to reduce the number of wirings and accelerate the data read operation.

According to another aspect of the present invention, a magnetic thin-film memory device includes a memory array, a plurality of write word lines, a word-line driving circuit, a plurality of data lines, a read/write control circuit, and a plurality of read word lines. The memory array has a plurality of magnetic memory cells arranged in a matrix. Each of the magnetic memory cells includes a storing section in which resistance values are changed in accordance with the level of storage data written when a data-write magnetic field applied by first and second data-write currents is larger than a predetermined magnetic field and a memory-cell selection gate for passing a data read current through the storage section during data read. The write word lines are provided respectively corresponding to rows of magnetic memory cells to constitute a write-word-line pair every two lines. Two write word lines constituting each word-line pair are electrically connected at least at one ends of the memory array. The word-line driving circuit is provided at the other end of the memory array to set two write word lines constituting a write-word-line pair corresponding to a selected row to first and second voltages one each in order to supply a first data-write current under data write. The data lines are set respectively so as to correspond to columns of magnetic memory cells. The read/write control circuit respectively supplies a second data-write current and a second data read current to at least that one of the data lines, which corresponds to the selected column, under data write and data read. The read word lines are respectively set so as to correspond to rows of magnetic memory cells and each of the lines turns ON a corresponding memory-cell-selection gage in accordance with a row selection result under data read.

Therefore, a data-write current is circulated by forming a reciprocating-current path by a write-word-line pair corresponding to a selected memory cell row. As a result, it is possible to execute row selection by selecting write-word-line pair half the number of write word lines. Therefore, it is possible to simplify the configuration of the word-line driving circuit. Moreover, because magnetic fields generated around a magnetic memory cell by data-write currents circulating through two write word lines constituting one same write-word-line pair corresponding to a selected memory cell row work so as to be cancelled each other, it is possible to reduce magnetic-field noises around the memory cell.

Still another aspect of the present invention, a magnetic thin-film memory device is including a memory array, a plurality of write word lines, a word-line-current control circuit, a word-line driving circuit, a plurality of data lines, a read/write control circuit, and a plurality of read word lines. The memory array has a plurality of magnetic memory cells arranged in a matrix. Each of the magnetic memory cells includes a storage section in which resistance values are changed in accordance with the level of storage data written when a data-write magnetic field applied by first and second data-write currents is larger than a predetermined magnetic field and a memory-cell selection gate for passing a data read current through the storage section under data read. Each magnetic memory cell is set correspondingly to a row of a plurality of write-word magnetic memory cells and shared by every two rows. The word-line-current control circuit forms and cuts off the path of the first data-write current to at least activated one of the write word lines under data write and data read. The word-line driving circuit activates a write word line corresponding to a selected row under both data read and data write, respectively. The data lines are set respectively so as to correspond to a column of magnetic memory cells. The read/write control circuit respectively supplies a second data-write current and a second data read current to at least that one of data lines which corresponds to the selected column under data read and data write. The read word lines are set respectively so as to correspond to a row of magnetic memory cells and each of the lines turns ON the corresponding memory-cell selection gate in accordance with a row selection result. Each read word line is selectively activated together with a corresponding write word line in accordance with a row selection result under data read.

Therefore, it is possible to secure a sectional area by securing the wiring pitch of the write word line WWL with sharing a write word line WWL. As a result, it is possible to control occurrence of electromigration and improve the operational reliability by reducing the current density of a write word line. Furthermore it is possible to accelerate the data read operation by reducing the signal propagation delay of a read word line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below in detail by referring the accompanying drawings.

First Embodiment

Figure 1:
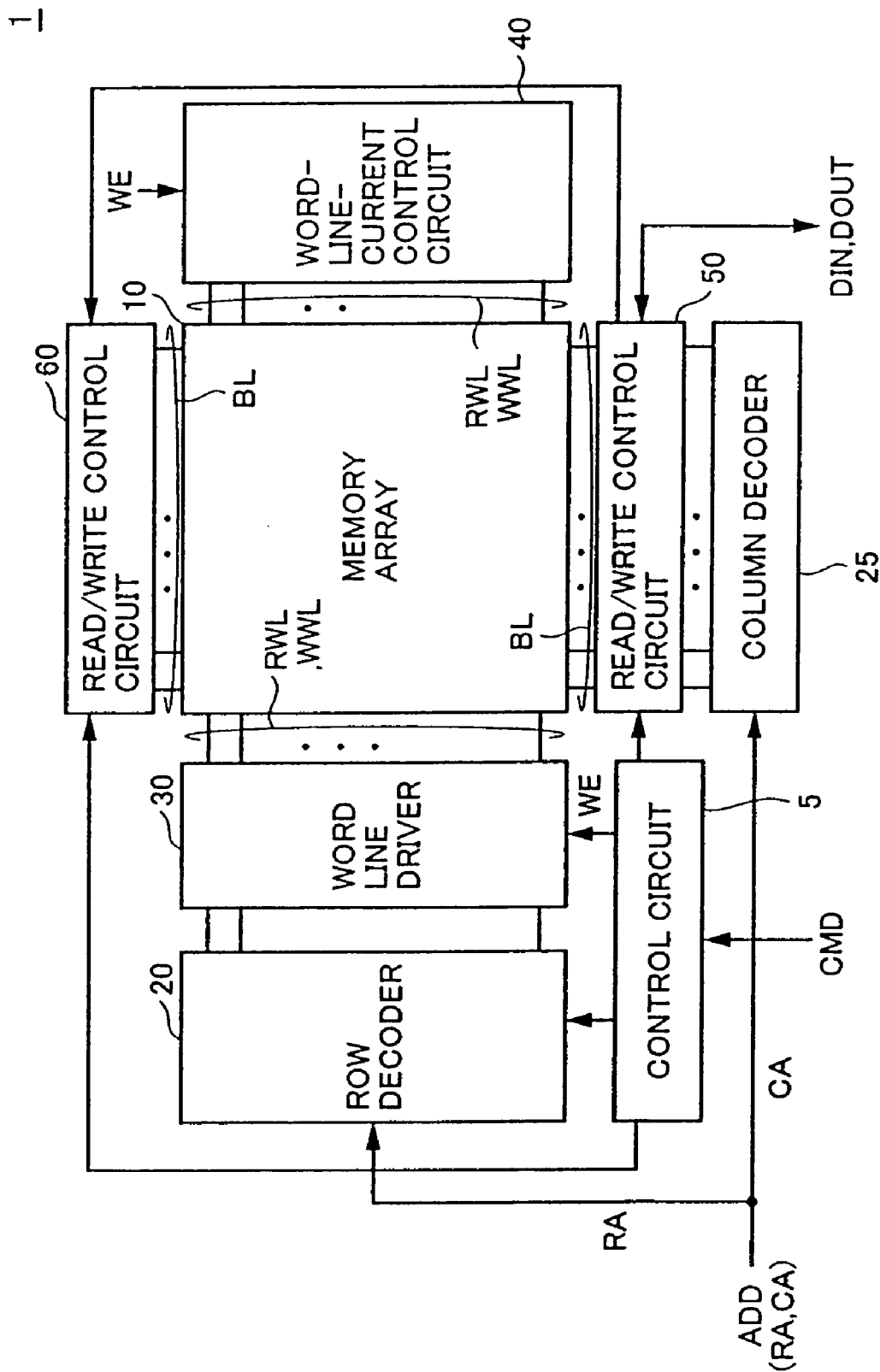
FIG. 1 is a schematic block diagram showing the general configuration of an MRAM device 1 of a first embodiment of the present invention.

Referring to FIG. 1, an MRAM device 1 of the first embodiment of the present invention performs random access in response to a control signal CMD and an address signal ADD supplied from an external unit to input write data DIN and output read data OUT.

The MRAM device 1 is provided with a control circuit 5 for controlling all operations of the MRAM device 1 in response to the control signal CMD and a memory array 10 having a plurality of MTJ memory cells arranged in a matrix (n rows×m columns). Though the configuration of the memory array 10 will be described later in detail, a plurality of write word lines WWL and a plurality of read word lines RWL are arranged correspondingly to rows of MTJ memory cells and a plurality of bit lines BL are arranged correspondingly to columns of the MTJ memory cells.

The MRAM device 1 is further provided with a row decoder 20 for executing row selection in the memory array 10 correspondingly to a row address RA shown by an address signal ADD, a column decoder 25 for executing column selection in the memory array 10 correspondingly to a column address CA shown by an address signal ADD, a word-line driver 30 for selectively activating a read word line RWL and a write word line WWL in accordance with a row selection result of the row decoder 20, a word-line-current control circuit 40 for supplying a data write current to a write word line WWL under data write, and read/write control circuits 50 and 60 for supplying a data write current and a sense current under data read and data write.

The read/write control circuits 50 and 60 control the voltage level of a bit line BL at the both ends of the memory array 10 to supply a data write current and a sense current for executing data write and data read to the bit line BL.

Figure 2:
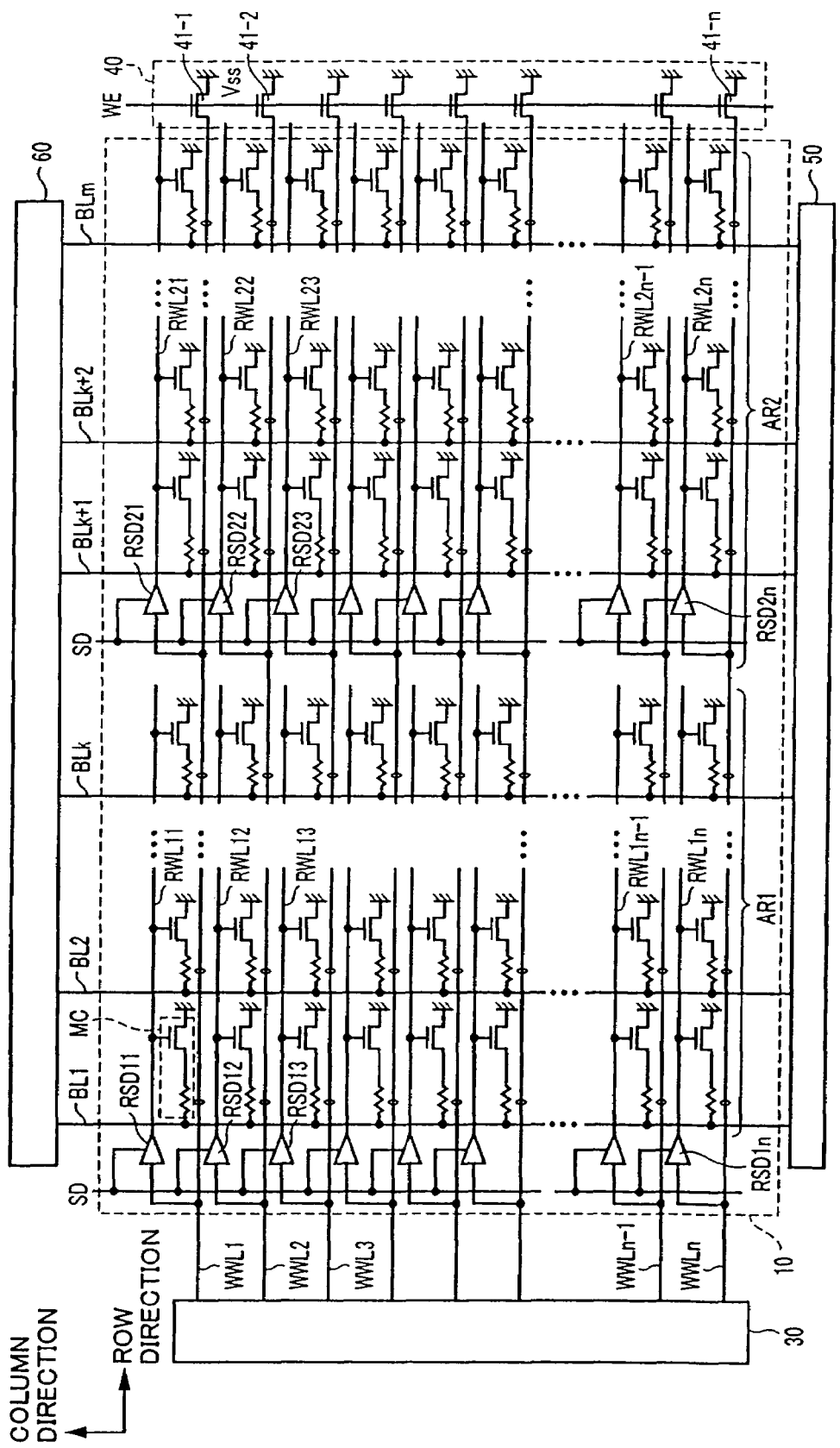
FIG. 2 is an illustration for explaining a configuration of a memory array 10 of the first embodiment in detail.
Figure 22:
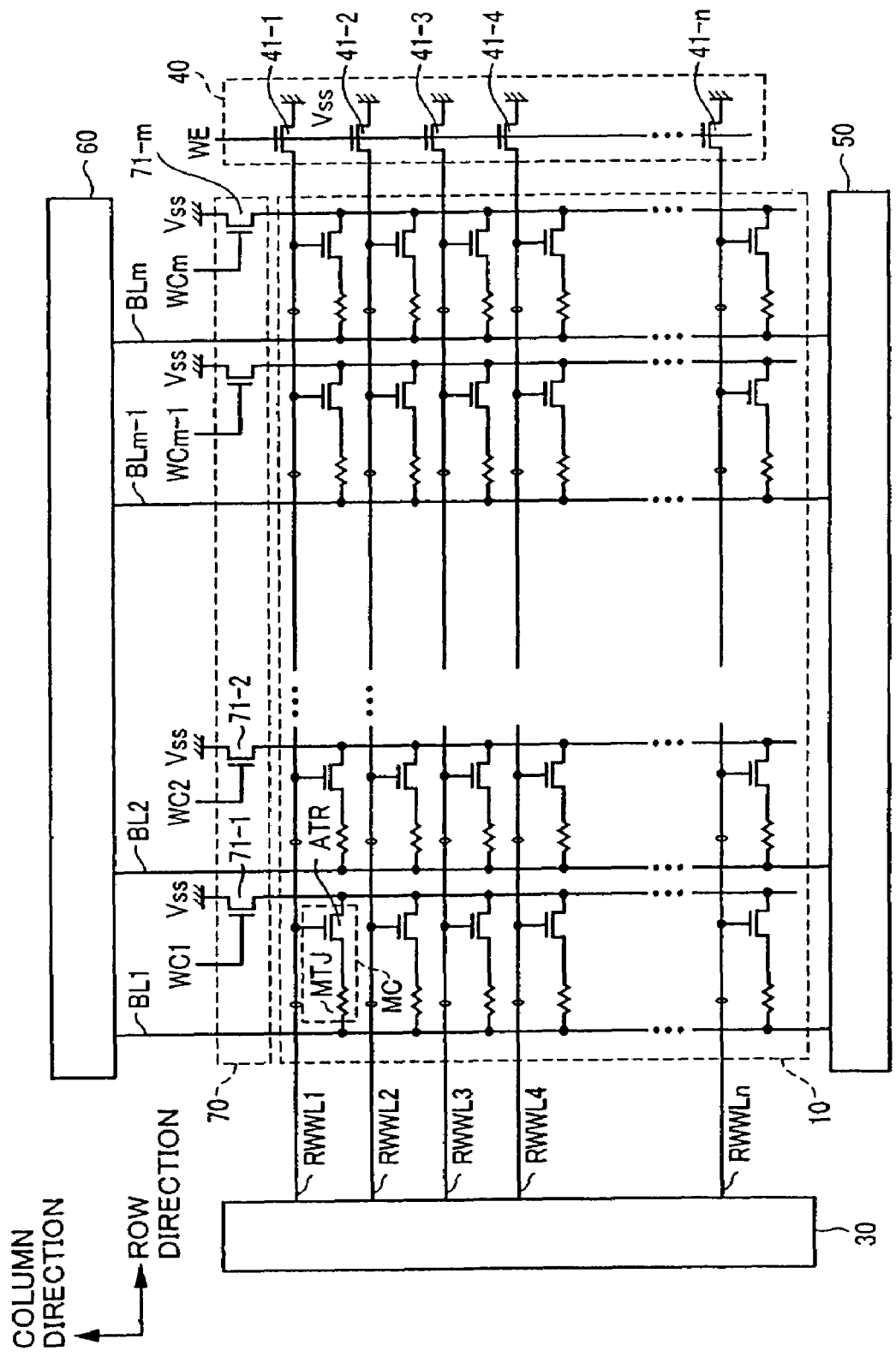
FIG. 22 is an illustration for explaining a configuration of the memory array of the third modification of the third embodiment.

Referring to FIG. 2, the memory array 10 is constituted of MTJ memory cells MC having the configuration shown in FIG. 22 in which the cells MC are arranged in n rows×m columns. The memory array 10 is divided into regions AR1 and AR2 along the column direction.

Read word lines RWL are independently provided for the regions AR1 and AR2. For example, a read word line corresponding to the first row of a memory cell is divided into a read word line RWL11 corresponding to the region AR1 and a read word line RWL21 corresponding to the region AR2. A read word line corresponding to each of other rows is also divided into the regions AR1 and AR2.

It is merely an example to divide the memory array 10 into two parts but application of the present invention is not restricted to the above case. Some of the embodiments of the present invention for the divided memory array 10 can be also applied to a case of dividing a memory array into a plurality of parts.

A write word line WWL is formed correspondingly to each row of memory cells in common to the regions AR1 and AR2. Therefore, write word lines WWL1 to WWLn are arranged for the whole of the memory array 10. Read word lines RWL1 to RWLn and write word lines WWL 1 to WWLn are arranged along the row direction.

Bit lines BL are arranged along the column direction correspondingly to each column of memory cells. Therefore, bit lines BL1 to BLn are arranged for the whole of the memory array 10.

Hereafter, write word line, read word line, and bit line are collectively expressed by symbols WWL RWL, and BL and specific write word line, read word line, and bit line are expressed by adding an suffix to each of the above symbols such as RWL11 or RWL21.

The word-line-current control circuit 40 has current control transistors 41-1 to 41-$n$ corresponding to write word lines WWL1 to WWLn. The current control transistors 41-1 to 41-$n$ are turned on in response to a control signal WE to be activated under data write and electrically connect a corresponding write word line WWL with a ground voltage Vss. Thereby, it is possible to supply a data write current to a write word line activated to a selective state (high-voltage state: H level).

However, because the control signal WE is inactivated except the time of data write, the current control transistors 41-1 to 41-$n$ are turned off. Therefore, no current flows through even an activated write word line WWL.

Subdrivers RSD11 to RWD1$n$ and RSD21 to RWSD2$n$ correspond to read word lines RWL11 to RWL1$n$ and RWL21 to RWL2$n$. A common control signal SD is supplied to these subdrivers. Each subdriver activates a corresponding read word line RWL to a selective state (high-voltage state: H level) in accordance with the level of a control signal SD and the voltage of a corresponding write word line WWL.

As already described, the write word lines WWL1 to WWLn are formed on a metallic wiring layer because it is necessary to supply a comparatively large data-write current (approx. several mA per write word line) to the lines WWL1 to WWLn in order to generate a magnetic field necessary for data write. It is preferable that the metallic wiring layer has a small resistance value and is constituted of a wiring structure having a high electromigration resistance. Therefore, it is preferable to form a wiring layer on which a write word line WWL will be formed so that the wiring thickness of the layer becomes larger than that of other metallic wiring layer and form the layer with a metal having a resistance smaller than that of other metallic wiring layer. For example, when other metallic wiring layer is formed with an aluminum alloy, it is necessary to form a metallic wiring layer on which a write word line WWL will be constituted of a Cu (copper) wiring.

To realize high integration of memory cells, a read word line RWL is constituted of the same wiring layer as the gate of an access transistor ATR and by a polysilicon or polycide structure. In the case of the first embodiment, the signal propagation delay of read word lines RWL is reduced without increasing the number of wiring layers or the number of wirings by separately arranging the read word lines RWL, decreasing the wiring length of the read word lines RWL having a high electric resistance described above, forming a hierarchical structure between the read word lines RWL with write word lines WWL and thereby, activating the read word lines RWL in accordance with a row selection result. Thereby, it is possible to realize high integration of memory cells and moreover, accelerate the data read operation.

Then, data read operation and data write operation of the memory array 10 are described below by referring to FIG. 3.

First, the data write operation is described.

The word-line driver 30 drives the voltage of a write word line WWL corresponding to a selected row into a selective state (H level) in accordance with the row selection result of the row decoder 20. In the case of an unselected row, the voltage level of a write word line WWL is kept in an unselective state (L level: ground voltage Vss).

Under data write, a control signal WE is activated to H level. Therefore, a data write current Ip flows through a write word line WWL corresponding to a selected row in accordance with the fact that the current control transistors 41-1 to 41-$n$ are turned on. However, because a control signal SD is kept inactivated to L level, each read word line RWL is not activated even if a write word line WWL is selectively driven to H level. Therefore, the voltage of each read word line RWL is kept L-level.

The read/write control circuits 50 and 60 generate a data write current in a direction corresponding to the level of write data by controlling voltages of bit lines BL at the both ends of the memory array 10. For example, to write storage data of "1", the bit-line voltage of the read/write control circuit 60 is set to a high-voltage state (power-supply voltage Vcc) and the bit-line voltage of the opposite-side read/write control circuit 50 is set to a low-voltage state (ground voltage Vss). Thereby, a data write current +Iw flows through a bit line BL in the direction from the read/write control circuit 60 to 50. However, to write storage data of "0", the bit-line voltage of the read/write control circuit 50 is set to a high-voltage state (power-supply voltage Vcc) and that of the read/write control circuit 60 is set to a low-voltage state (ground voltage Vss). Thereby, a data write current –Iw flows through a bit line BL in the direction from the read/write control circuit 50 to 60.

In this case, it is unnecessary to supply the data write currents ±Iw to each bit line but it is necessary to control the above bit-line-BL voltage so that the read/write control circuits 50 and 60 selectively supply the data write currents ±Iw to some bit lines corresponding to a selected column in accordance with a column selection result of the column decoder 25.

Figure 4:
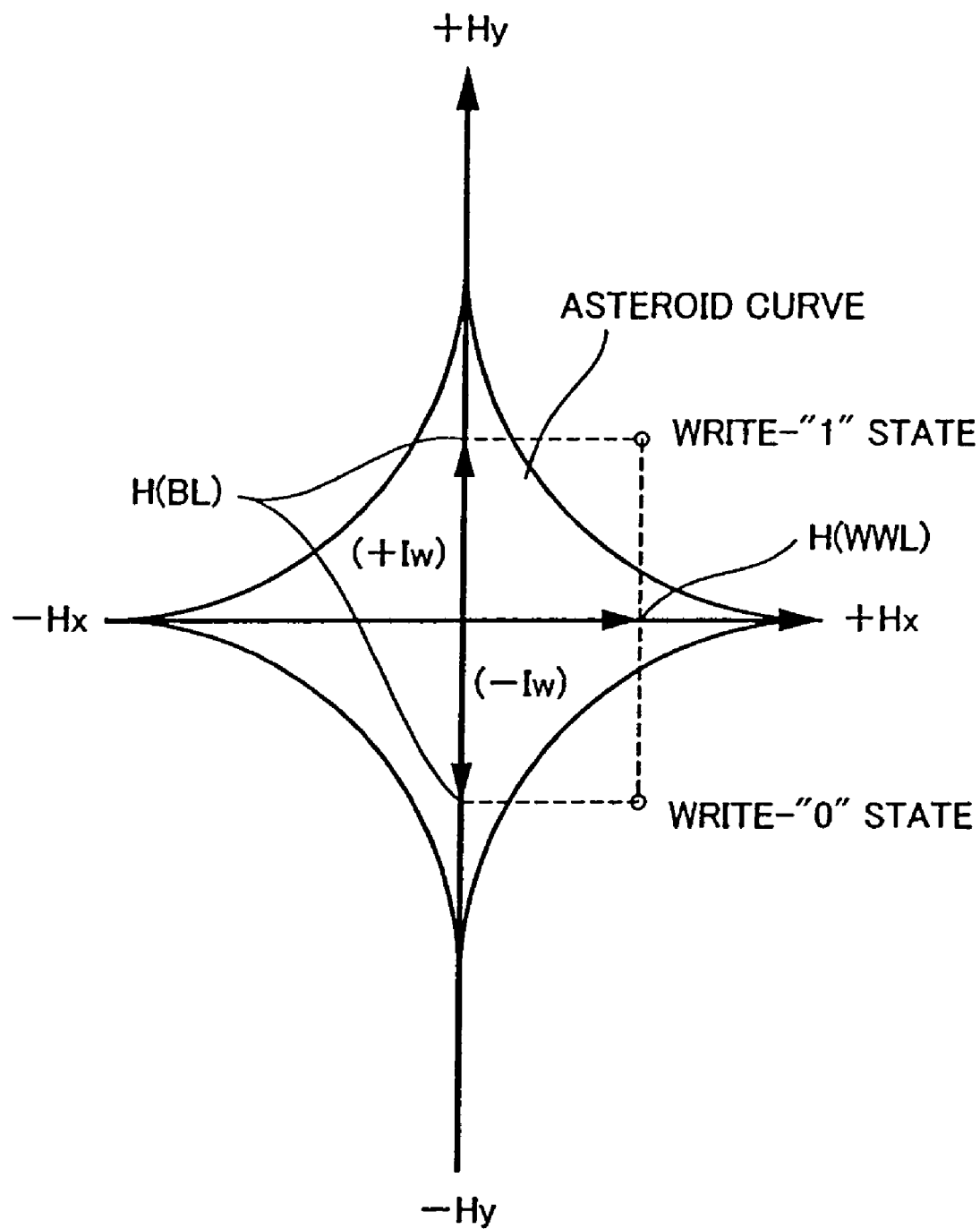
FIG. 4 is a conceptual diagram for explaining a data write current under data write and the direction of a magnetic field generated in an MTJ memory cell.

Referring to FIG. 4, under data write, a data write current Ip for generating a magnetic field H (WWL) in +Hx direction is supplied to a write word line WWL. However, a data write current +Iw or –Iw for generating a magnetic field H (BL) in +Hy or –Hy direction correspondingly to a written data level is supplied to a bit line BL.

Thereby, it is possible to generate a magnetic field corresponding to the outside region of an asteroid curve and write the direction of a magnetic field corresponding to a data level in a free magnetic layer VL in an MTJ memory cell in accordance with a combination of magnetic field H (WWL) with magnetic field H (BL).

Thus, by selecting either of the data write currents +Iw and –Iw in opposite direction each other and fixing the data write current Ip of a write word line WWL to a certain direction independently of a data level, it is possible to simply constitute the word-line-current control circuit 40 of only the current control transistors 41-1 to 41-$n$ shown in FIG. 2. Moreover, though not illustrated in detail, because the voltage setting of a write word line corresponding to a selected row can be made constant independently of a data level, it is possible to simply constitute the word-line driver 30.

Then, operations for data read are described below.

Figure 3:
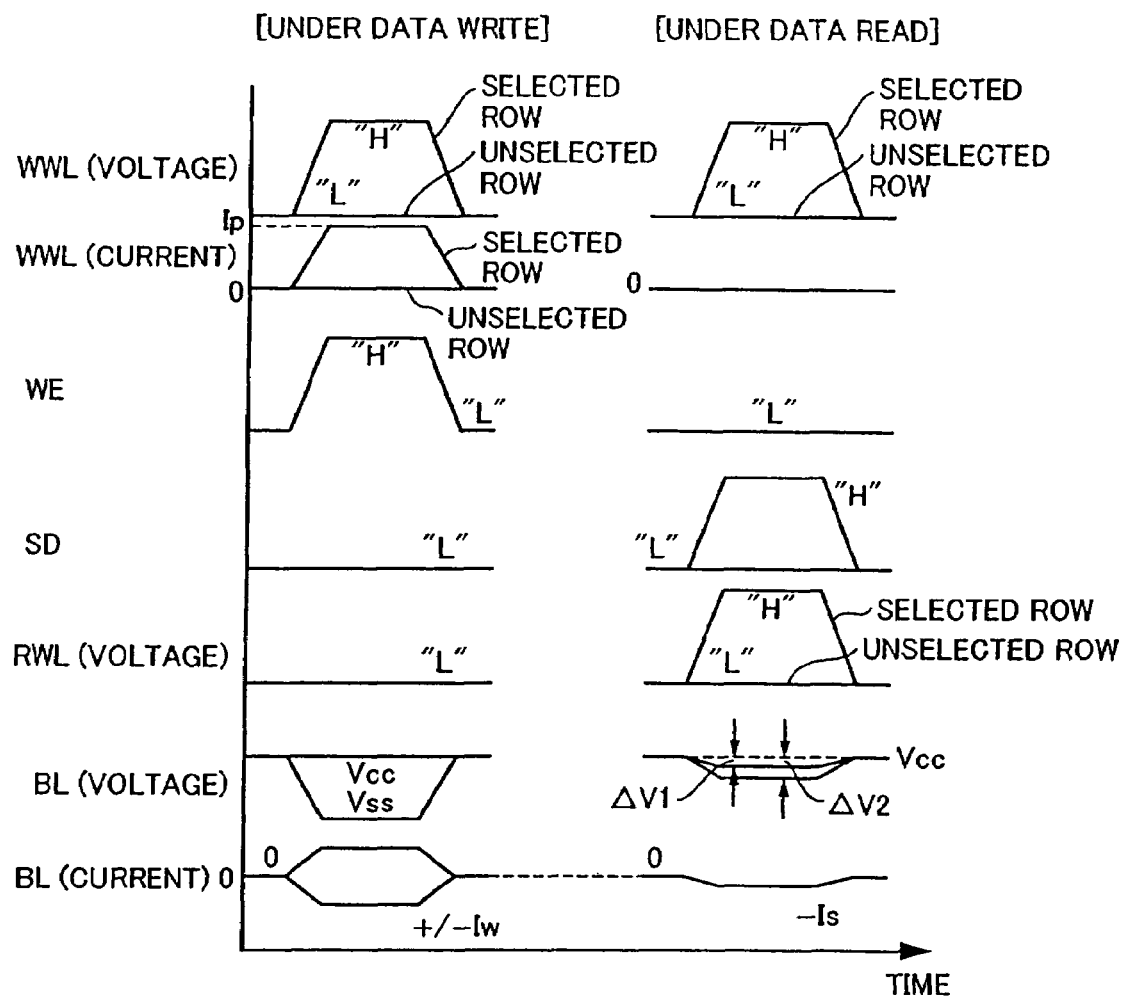
FIG. 3 is a timing chart for explaining operations for reading and writing data from and in the memory array 10 of the first embodiment.

Referring to FIG. 3, the word-line driver 30 drives a write word line WWL corresponding to a selected row into a selective state (H level) in accordance with a row selection result of the row decoder 20 also under data read. In an unselected row, the voltage level of a write word line WWL is kept in an unselective state (L level: ground voltage Vss).

Under data read, because a control signal SE is kept inactivated to L level, the current control transistors 41-1 to 41-$n$ respectively keep an off state. Therefore, no current is supplied to write word lines WWL even at a selected row. However, because a control signal SD is activated to H level, the subdrivers SRWD11 to RSD2n activate corresponding read word lines RWL in a selected row to a selective state (H level).

Before the data read operation, a bit line BL is precharged to, for example, a high-voltage state (power-supply voltage Vcc). When a read word line RWL is activated to H level in a selected row, a corresponding access transistor ATR is turned on. Correspondingly to the above operation, in an MTJ memory cell, the current path of a sense current Is is formed between a bit line BL and a ground voltage Vss via access transistor ATR.

The read/write control circuit 50 supplies a constant sense current Is to a bit line BL during the data read operation. In general, a sense current Is is a current smaller than bit-line currents ±Iw for data write by approx. 2 digits. For example, data write currents ±Iw for data write are currents of 10-mA order while a sense current Is is a current of 0.1-mA order. Therefore, in the case of the configuration of the first embodiment, though a write word line WWL corresponding to a selected row is activated to H level also under data read, no current is supplied to read word lines RWL and a sense current Is flowing through a bit line is small. Therefore, the probability is low that erroneous data write is executed under data read and the data stored in an MTJ memory is broken.

A voltage drop occurs in a bit line BL depending on the level of storage data in an MTJ memory cell. In FIG. 3, if the magnetic-field direction in a fixed magnetic layer FL and that in a free magnetic-field layer VL are aligned when a data level to be stored is "1", a voltage drop $\Delta V1$ of a bit line BL is small when storage data is "1" and a voltage drop $\Delta V2$ of the bit line BL when the storage data is "0" becomes larger than $\Delta V1$. By detecting the difference between these voltage drops $\Delta V1$ and $\Delta V2$, it is possible to read data from an MTJ memory cell at a high speed.

Figure 5:
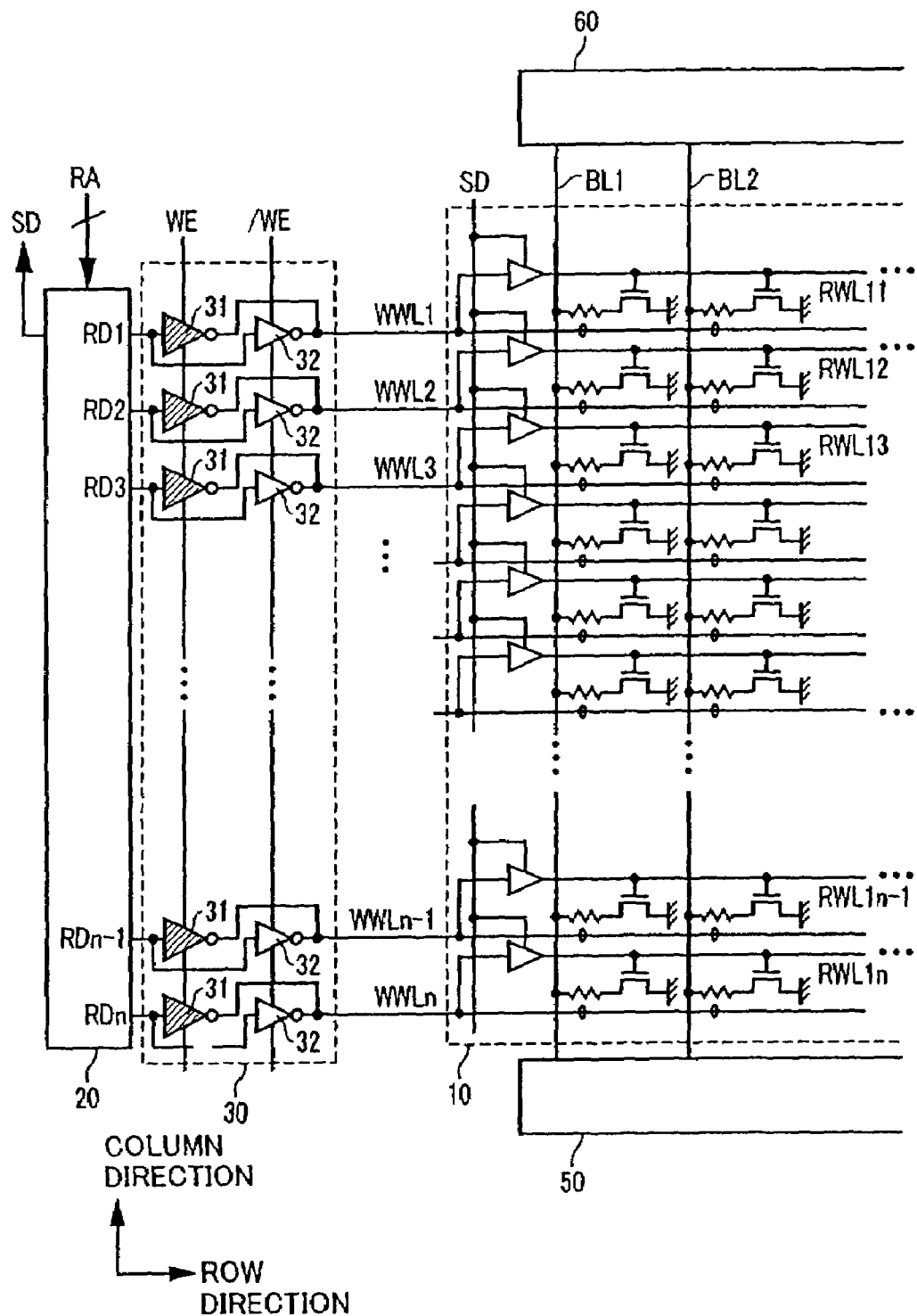
FIG. 5 is a circuit diagram showing a configuration of a word-line driver 30.

Referring to FIG. 5, the word line driver 30 has inverters 31 and 32 corresponding to write word lines WWL1 to WWLn. Each inverter 31 operates in response to a control signal WE. Each inverter 32 operates in response to /We which is an inversion signal of the control signal WE. That is, each inverter 31 operates under data write and each inverter 32 operates under data read.

The row decoder 20 activates one of row decode signals RD1 to RDn which corresponds to a selected row to L level. The row decoder 20 further generates a control signal SD to be transferred to a subdriver.

The row decode signals RD1 to RDn are transmitted to the word line driver 30. In the word line driver 30, each of the inverters 31 and inverters 32 receives the row decode signal RD1. The inverters 31 and 32 activates corresponding write word lines WWL to a selective state (H level) when a row decode signal to be transferred is activated to L level.

Under data write and data read, write word lines WWL corresponding to a selected row are activated to a selective state (H level). Therefore, also under data read, a transient charge current is supplied to a write word line WWL in a course of activating the write word line WWL from an unselective state (L level) to a selective state (H level). If a magnetic field of a region exceeding the asteroid curve shown in FIG. 4 is generated, an erroneous data write operation is executed and the storage data in an MTJ memory cell is broken. However, under data write, it is necessary to supply a comparatively-large data write current Ip to write word lines WWL.

Therefore, in the word line driver 30, the inverters 31 for supplying a current to corresponding write word lines WWL under data write is set independently of the inverters 32 for charging corresponding write word lines WWL under data read. The current-driving capacity of the inverter 31 is set to a value larger than the current-driving capacity of the inverter 32 in accordance with the value of data write current Ip. However, the current-driving capacity of the inverter 32 is controlled so that a generated magnetic field is brought to the inside region of the asteroid curve in FIG. 4.

A current-driving capacity can be adjusted by designing the size of a MOS transistor constituting the inverters 31 and 32. Thereby, it is possible to further prevent the storage data in an MTJ memory cell from breaking.

Figure 6:
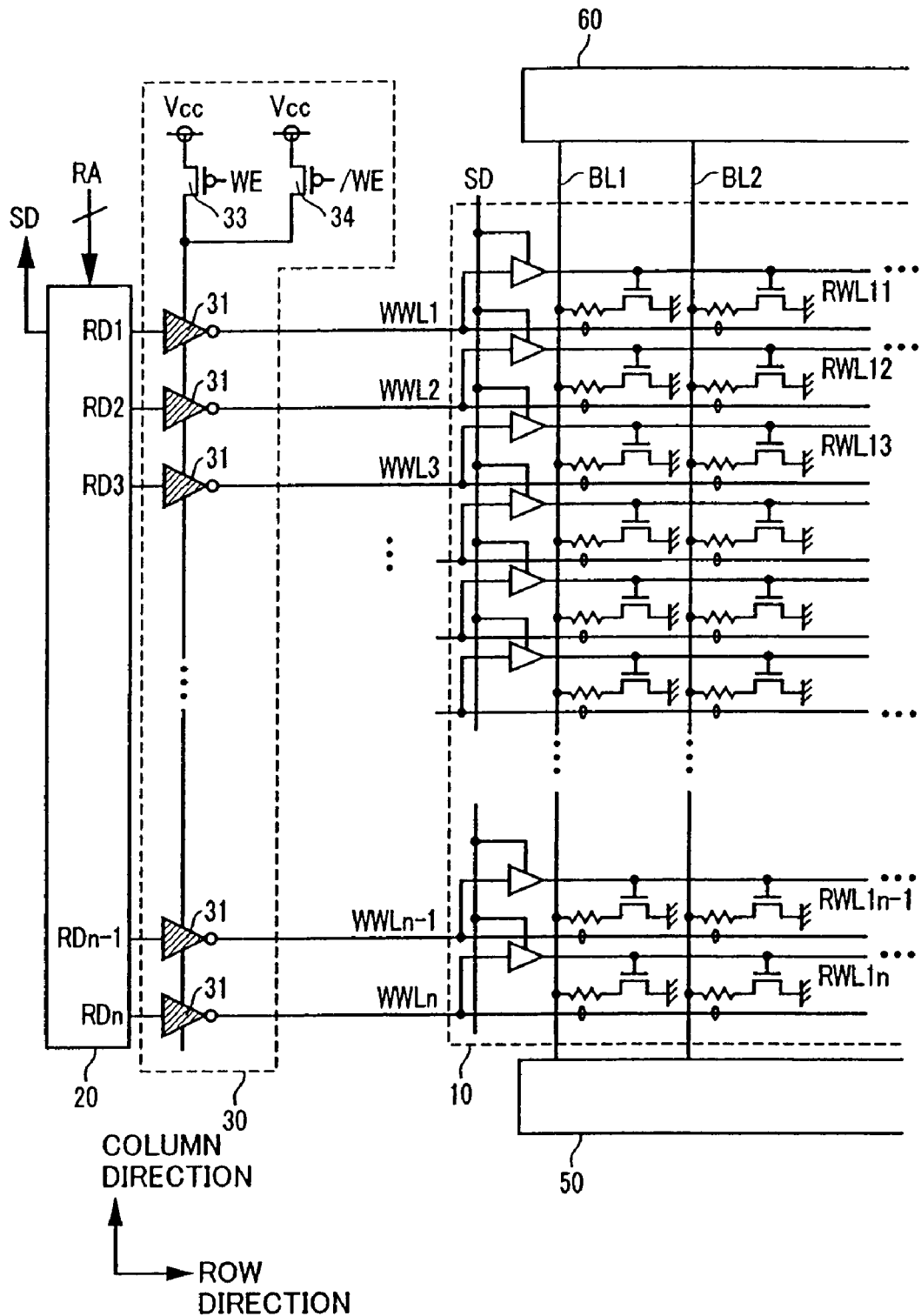
FIG. 6 is a circuit diagram showing another configuration of the word-line driver 30.

FIG. 6 shows another configuration of the word line driver 30.

Referring to FIG. 6, the word line driver 30 has inverters 31 corresponding to write word lines WWL1 to WWLn and P-type MOS transistors 33 and 34 for supplying an operating current to the inverters 31. The transistors 33 and 34 are arranged in parallel between an inverter 33 and a power-supply voltage Vcc. A control signal WE is input to the gate of the transistor 33 and an inversion signal /WE of the control signal WE is input to the gate of the transistor 34. Therefore, the transistor 33 is turned on under data write and the transistor 34 is turned on correspondingly to data read.

The current-driving capacity of the transistor 33 is set similarly to the case of the inverter 31 in FIG. 5. The current-driving capacity of the transistor 34 is set similarly to the case of the inverter 32 in FIG. 5. Also by using the above configuration, it is possible to more securely prevent the storage data in a MTJ memory cell from breaking under data read. Moreover, the word line driver 30 shown in FIG. 6 can be constituted of transistor devices less than those of the word line driver 30 shown in FIG. 5.

Then, the structure of a MTJ memory cell conforming to the first embodiment is described below.

Figure 27:
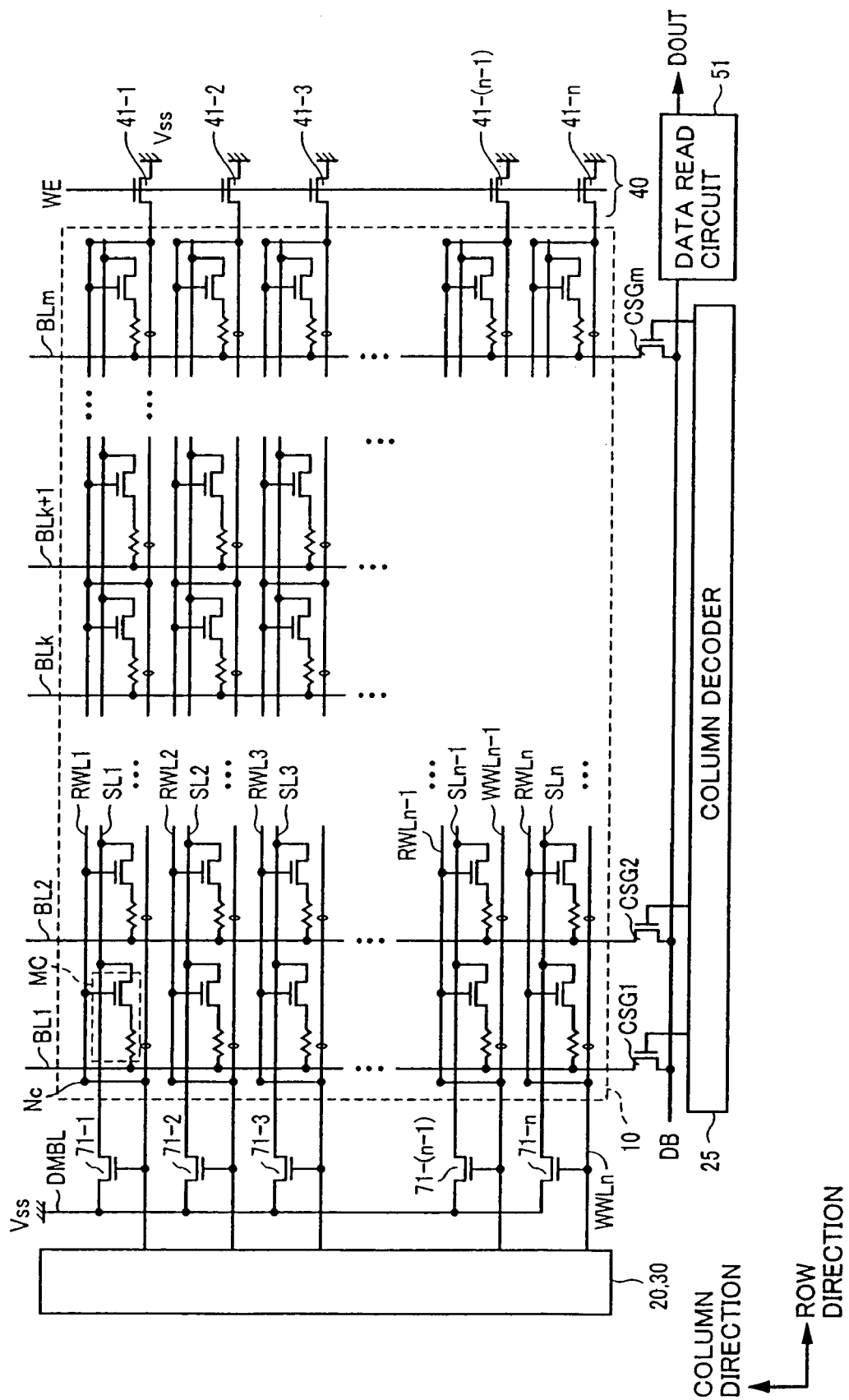
FIG. 27 is an illustration for explaining a configuration relating to data read by the memory array and its peripheral circuit of the second modification of the fourth embodiment of the present invention.

It is also possible to constitute an MTJ cell of the memory array 10 on a semiconductor substrate in accordance with the same structure as that in FIG. 27 described for the prior art. However, an MTJ-memory-cell structure is described below which is suitable for the configuration of the first embodiment for accelerating data read by activating a write word line WWL also under data read.

Figure 7:
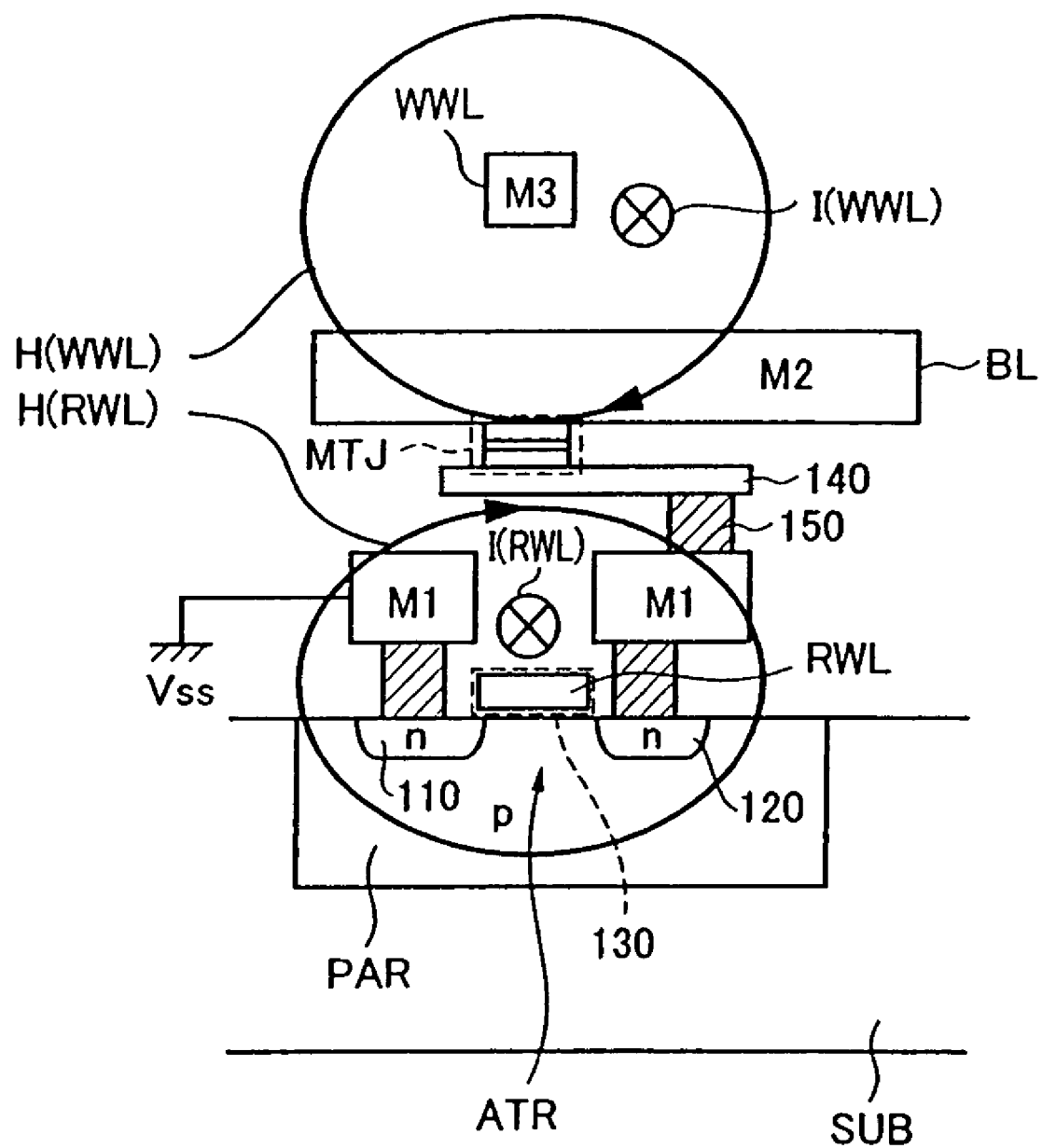
FIG. 7 is a structural drawing of an MTJ memory cell formed on a semiconductor substrate.

Referring to FIG. 7, an access transistor ATR is constituted on a main semiconductor substrate SUB in accordance with the same structure as that in FIG. 27 and connected with a ground voltage Vss. Moreover, a read word line RWL is constituted of a polysilicon or polycide structure on the same wiring layer as the gate 130 of the access transistor ATR.

A magnetic tunnel junction portion MTJ is formed between metallic wiring layers M1 and M2 differently from the structure shown in FIG. 27. Moreover, a bit line BL is formed on the metallic wiring layer M2 and a write word line WWL is formed on the metallic wiring layer M3. By using the above structure, the magnetic tunnel junction portion MTJ is formed so as to be held by a read word line RWL and a write word line WWL in the height direction.

Thereby, under data read, it is possible to set directions of magnetic fields H (WWL) and H (RWL) so as to be offset each other by charge currents I (WWL) and I (RWL) transiently generated to drive a write word line WWL and a read word line RWL to a selective state (H level). As a result, it is possible to further securely prevent storage data in a transient state under data read from breaking also from the viewpoint of the configuration of an MTJ memory cell.

First Modification of the First Embodiment

Figure 8:
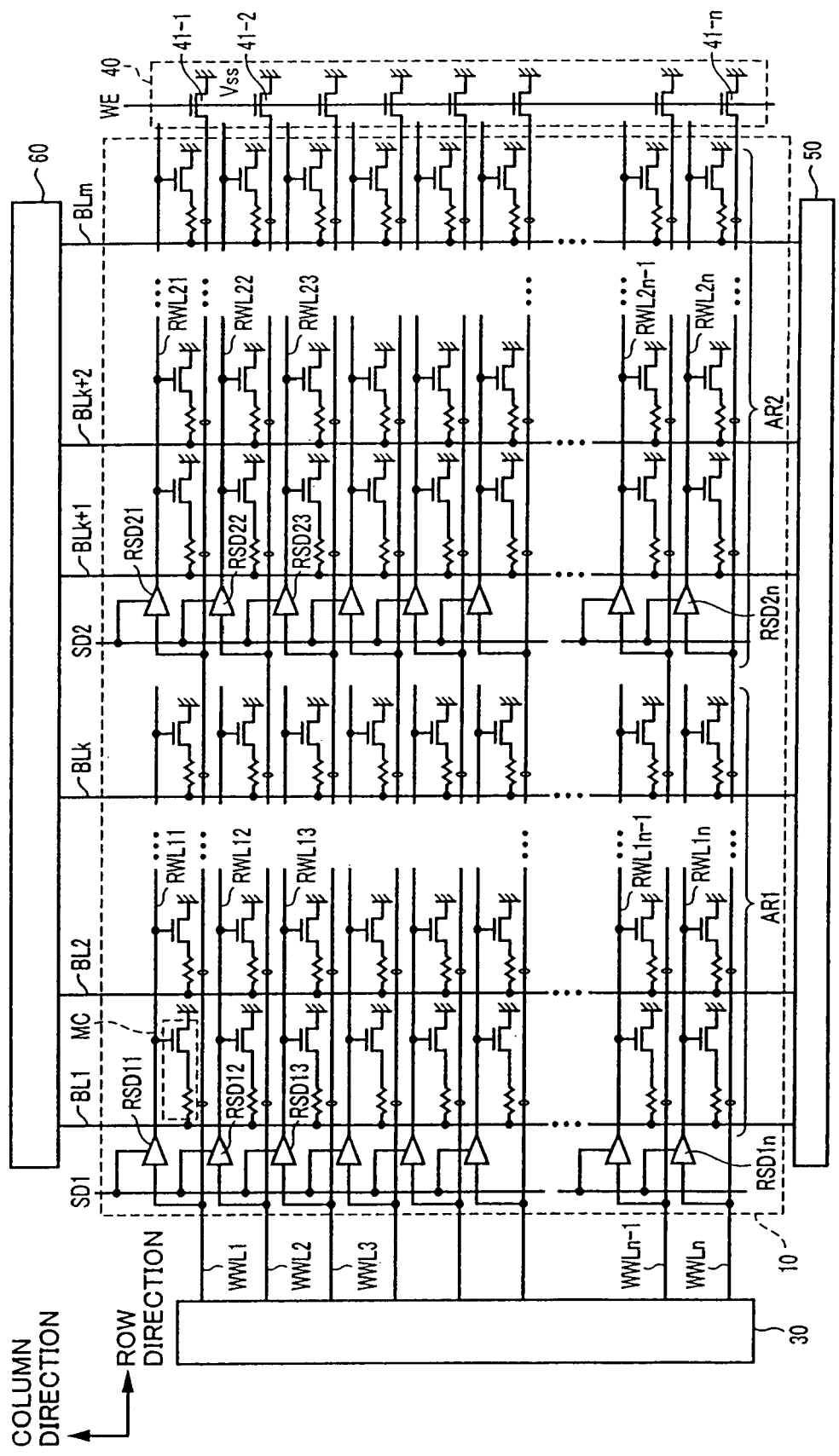
FIG. 8 is an illustration for explaining a configuration of a memory array of a first modification of the first embodiment.

Referring to FIG. 8, in the case of a memory array 10 according to a first modification of the first embodiment, independent control signals SD1 and SD2 are generated correspondingly to regions AR1 and AR2 in which read word lines RWL are independently arranged.

Subdrivers RSD11 to RSD1n in the region AR1 operate in response to a control signal SD1 to activate corresponding read word lines RWL11 to RWL1n in accordance with activation of write word lines WWL1 to WWn. Similarly, subdrivers RSD21 to RSD2n in the region AR2 operate in response to a control signal SD2 to activate corresponding read word lines RWL21 to RWL2n in accordance with activation of the write word lines WWL1 to WWn. Because configurations and operations of other portions are the same as those of the first embodiment, their descriptions are not repeated.

Thereby, it is possible to independently perform memory access every region in which read word lines RWL are separately arranged. As a result, it is not necessary to access unnecessary memory cells under data read. Therefore, it is possible to reduce the current consumption and power consumption under the data read operation. In the case of the first modification of the first embodiment, it is necessary to reflect a column selection result of a column decoder 25 on generation of the control signals SD1 and SD2. Therefore, it is preferable to transfer the column selection result to the row decoder 20 or directly generate the control signals SD1 and SD2 by the column decoder 25.

Second Modification of the First Embodiment

Figure 9:
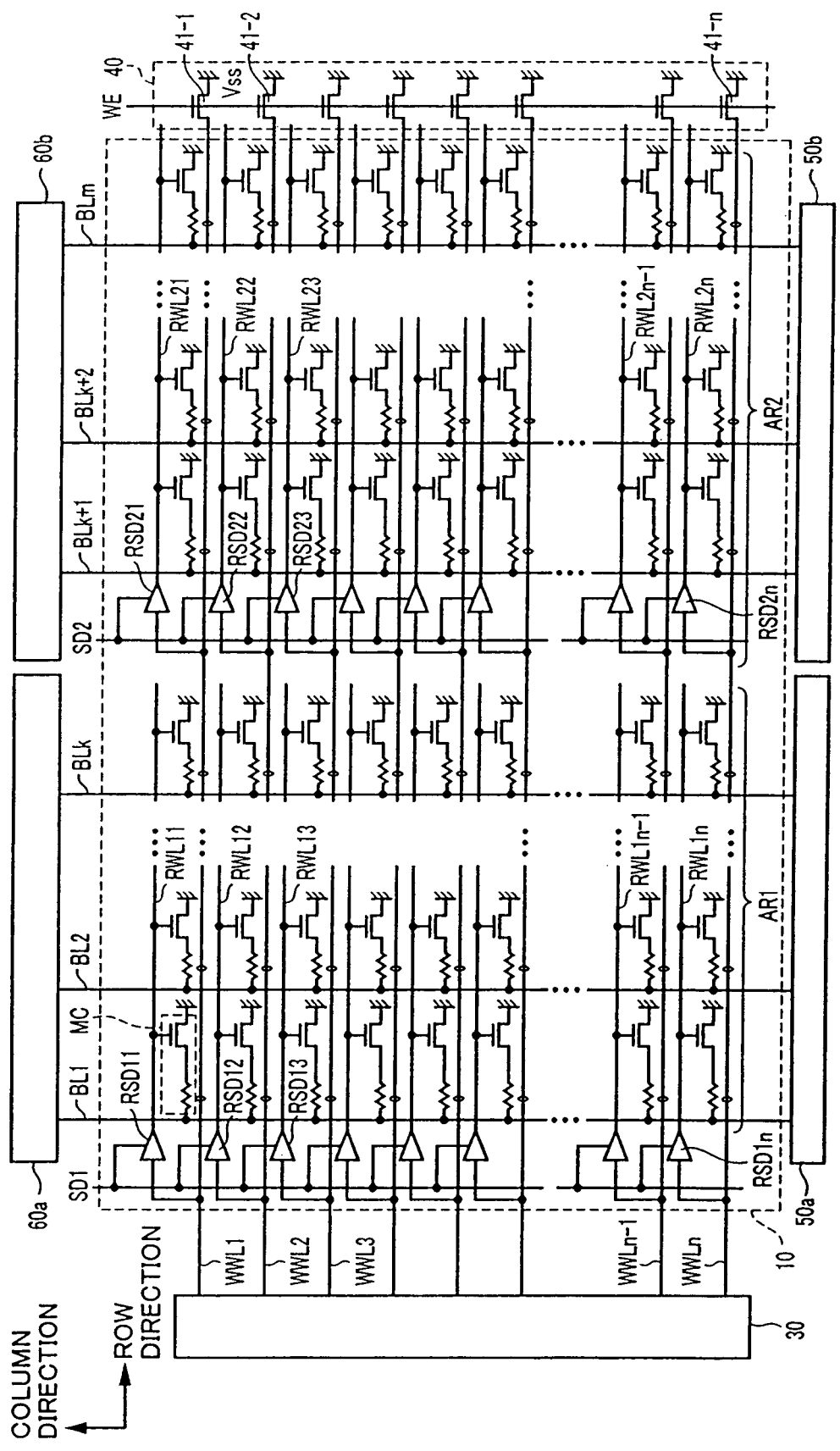
FIG. 9 is an illustration for explaining a configuration of a memory array of a second modification of the first embodiment.

Referring to FIG. 9, in the case of a memory array 10 according to the second modification of the first embodiment, read/write control circuits 50 and 60 are separately arranged every regions AR1 and AR2. Specifically, read/write control circuits 50a and 60a are arranged correspondingly to the region AR1 and read/write control circuits 50b and 60b are arranged correspondingly to the region AR2. Because configurations and operations of other portions are the same as those of the first modification of the first embodiment, their descriptions are not repeated.

As described above, it is possible to independently execute data-read and data-write operations in each region in which independent read word lines RWL are formed by setting a read/write control circuit to each region. For example, it is possible to execute the data read operation in the region AR1 and simultaneously execute the data write operation in the region AR2. As a result, when continuously executing memory access, it is possible to further reduce the total memory access time.

Second Embodiment

Figure 10:
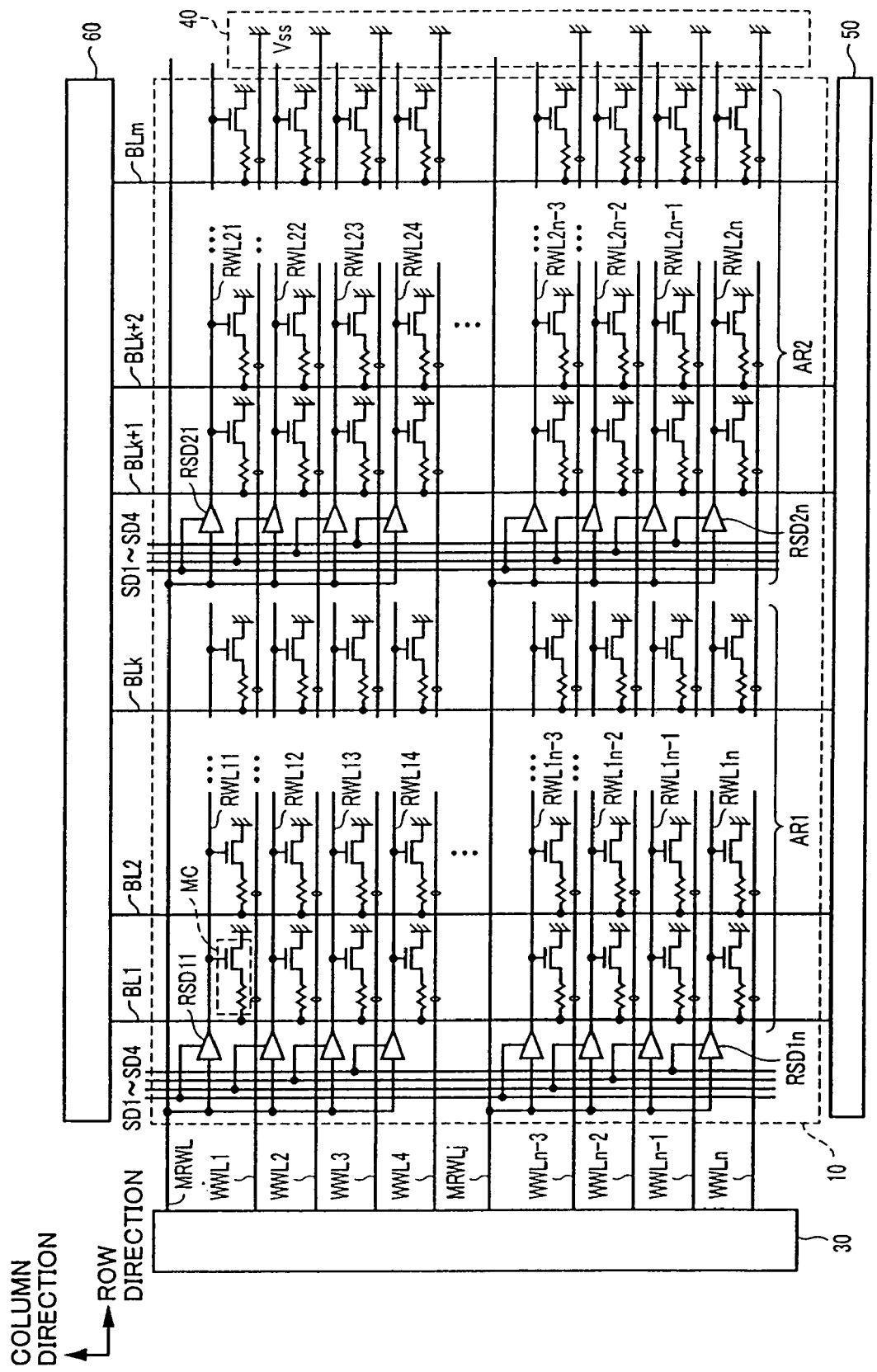
FIG. 10 is an illustration for explaining a configuration of an memory array 10 of a second embodiment.

Referring to FIG. 10, in the case of a memory array 10 according to the second embodiment, read word lines RWL are hierarchically arranged with main read word lines MRWL. The read word lines RWL are arranged every memory cell row independently of regions AR1 and AR2 similarly to the case of the first embodiment. Therefore, read word lines RWL11 to RWL1n and RWL21 to RWL2n are arranged on the whole of a memory array 10. Subdrivers RSD11 to RSD1n and RSD21 to RWD2n correspond to read word lines.

The main read word line MRWL is provided along the column direction in common to the regions AR1 and AR2. The main read word line MRWL is provided every L (L: natural number) memory cell rows. Thereby, each read word line RWL is related with any one of main read word lines MRWL1 to MRWLj (j=natural number shown by n/L).

FIG. 9 shows a case of L=4 as an example, that is, a configuration in which one main read word line MRWL is arranged every four memory cell rows. Thus, by arranging a main read word line MRWL every plurality of memory cell rows, it is possible to reduce the number of main read word lines MRWL to 1/L of write word lines WWL arranged every memory cell row. As a result, it is possible to form main read word lines MRWL on a semiconductor substrate as low-resistance wirings by sharing an existing metallic wiring layer without forming a new metallic wiring layer.

The operation for selecting one memory cell row out of four memory cell rows related to one main read word line MRWL is executed in accordance with 4-bit control signals SD1 to SD4. The control signals SD1 to SD4 are generated by, for example, the row decoder 20 in accordance with a row address RA. The control signals SD1 to SD4 are transferred to the subdrivers RSD11 to RSD1n and RSD21 to RSD2n. Each subdriver selectively activates one of four (L) corresponding read word lines RWL in accordance with the control signals SD1 to SD4 when a corresponding main read word line MRWL is activated to a selective state.

Thus, by dividing a read word line RWL into short wirings and forming a hierarchical structure with a main read word line MRWL constituted of a metallic wiring and having a small resistance value, it is possible to reduce the signal propagation delay of a read word line RWL and accelerate data read similarly to the case of the first embodiment.

Moreover, the configuration of the second embodiment makes it possible to control the activation of a read word line RWL and a write word line WWL independently each other under data read and data write. As a result, in the case of a word-line-current control circuit 40, it is allowed to connect write word lines WWL1 to WWLn with a ground voltage Vss and it is unnecessary to use the current control transistors 41-1 to 41-n shown in the first embodiment. In the case of the configuration of the second embodiment, a write word line WWL is not activated under data read but it is activated only under data write. Therefore, when a write word line WWL is activated, it is possible to always flow a data write current Ip and it is unnecessary to control formation/cut-off of a current path through which the data write current Ip flows. Thus, it is also possible to simplify the configuration of the word-line-current control circuit 40.

Figure 11:
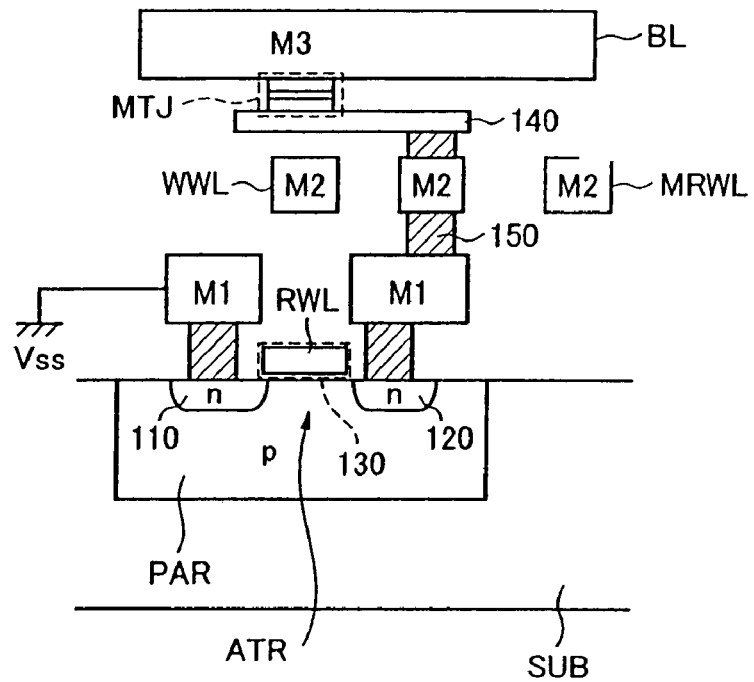
FIG. 11 is a structural drawing for explaining a first example of the arrangement of a main read word line.
Figure 12:
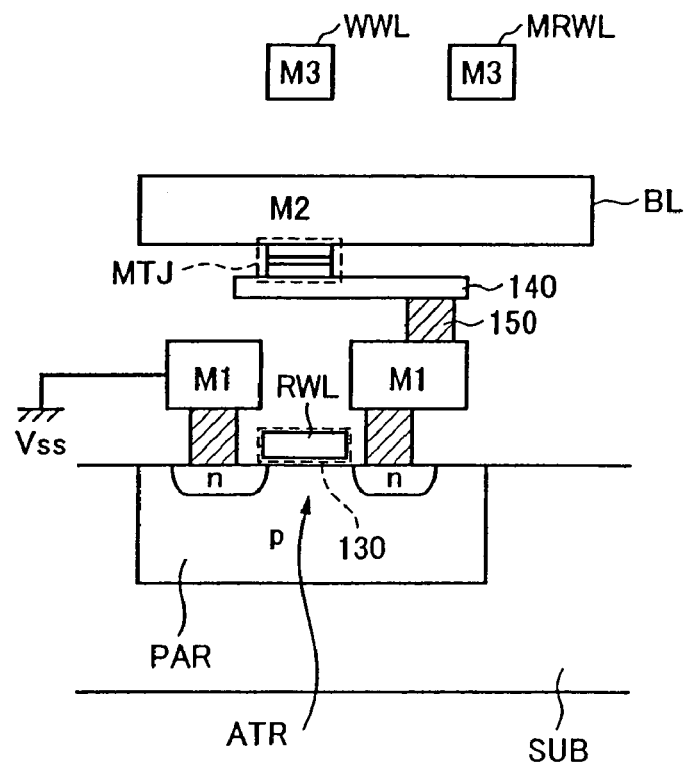
FIG. 12 is a structural drawing for explaining a second example of the arrangement of a main read word line.
Figure 13:
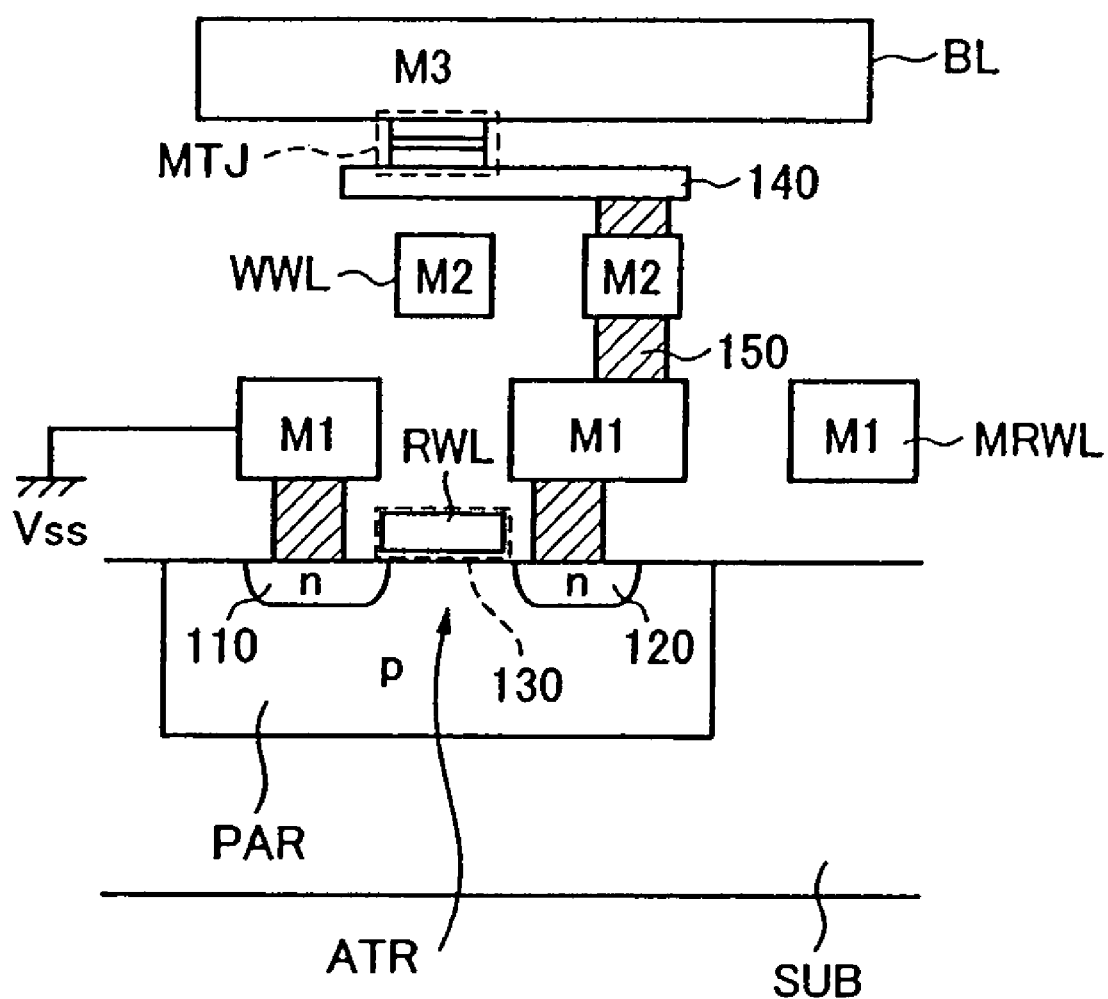
FIG. 13 is a structural drawing for explaining a third example of an arrangement of a main read word line.

FIGS. 11, 12, and 13 are structural drawings for explaining first, second, and third examples of the arrangement of main read word lines MRWL.

Referring to FIG. 11, access transistor ATR, bit line BL, write word line WWL, and read word line RWL are arranged in the same structure as that in FIG. 27. Main read word lines MRWL are arranged on a metallic wiring layer M2 together with write word lines WWL.

Referring to FIG. 12, access transistor ATR, bit line BL, write word line WWL, and read word line RWL are arranged in the same structure as that in FIG. 7. A main read word line MRWL is formed on a metallic wiring layer M3 together with the write word line WWL.

As shown in FIGS. 11 and 12, because the number of main read word lines MRWL arranged every plurality of memory cell rows is small, it is possible to arrange the lines MRWL on a metallic wiring layer together with write word lines WWL. Thereby, it is possible to form main read word lines MRWL on a semiconductor substrate by sharing an existing metallic wiring layer without forming a new metallic wiring layer.

Referring to FIG. 13, because the number of main read word lines MRWL is small, it is also possible to arrange them on a metallic wiring layer M1 used to connect layers each other in MTJ memory cells. Also in the case of the above structure, it is possible to arrange main read word lines MRWL without forming a new metallic wiring layer.

Third Embodiment

Figure 14:
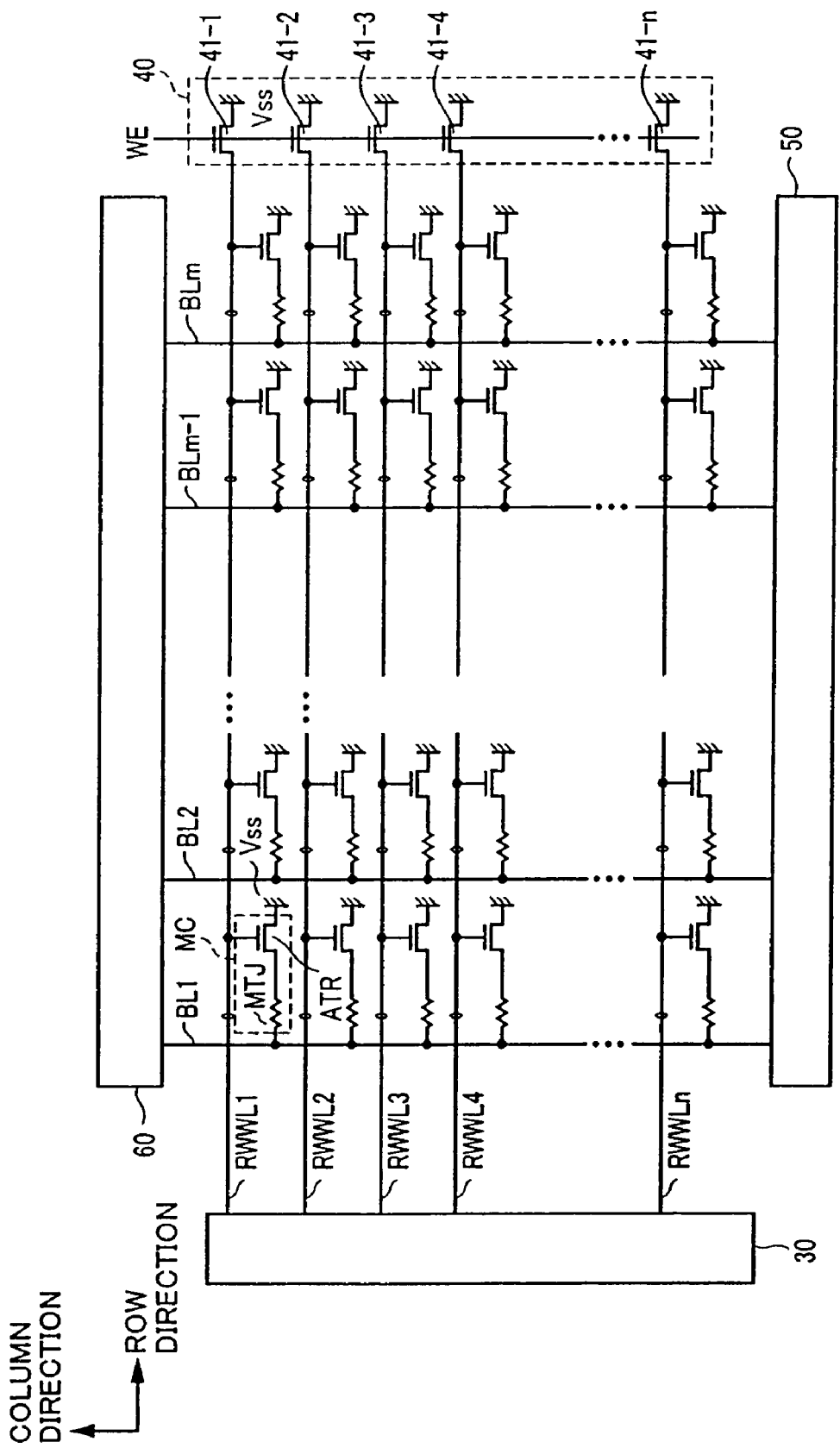
FIG. 14 is an illustration for explaining a configuration of a memory array 10 of a third embodiment.

Referring to FIG. 14, in the memory array 10 of the third embodiment, a read word line and a write word line are respectively constituted of a common word line RWWL. That is, in the case of the memory array 10 of the third embodiment, word lines RWWL1 to RWWLn are arranged for each memory cell row and the word line RWWL is used for data read and data write in common. A word-line-current control circuit 40 has current control transistors 41-1 to 41-$n$ corresponding to the word lines RWWL1 to RWWLn.

Figure 15:
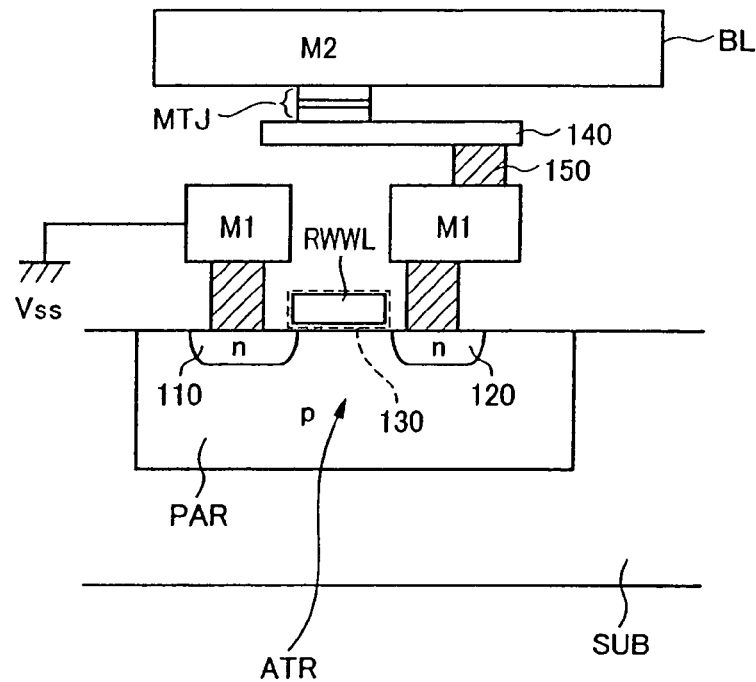
FIG. 15 is a structural drawing showing an arrangement of a word line of the third embodiment.

Referring to FIG. 15, a word line RWWL is constituted as a metallic wiring on the same layer as the gate 130 of an access transistor ART made of a low-resistance material. The low-resistance material for constituting the gate of the access transistor ATR can use a metal such as tungsten. Thereby, it is possible to omit a metallic wiring layer (metallic wiring layer M2 in FIG. 27) on which write word lines WWL have been arrange so far, compared to the structure of a conventional MTJ memory cell. Thus, it is possible to reduce the number of metallic wiring layers.

Figure 16:
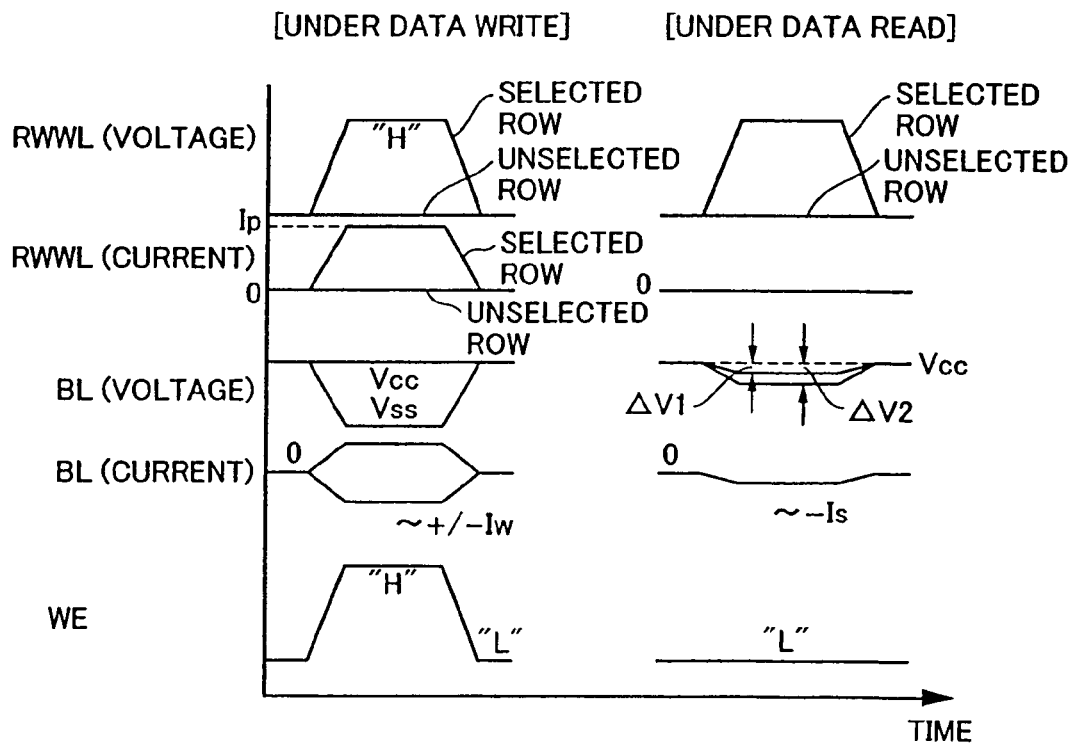
FIG. 16 is a timing chart for explaining operations for reading and writing data from and in a memory array of the third embodiment.

Referring to FIG. 16, the voltage of a word line RWWL corresponding to a selected row is activated to a selective state (H level) under data write and data read. However, because current control transistors 41-1 to 41-$n$ are operated in response to a control signal WE, it is possible to supply a current to the word line RWWL only under data write.

Thus, the voltage waveform of the word line RWWL under data write in FIG. 16 is equal to that of the write word line WWL under data read shown in FIG. 3 and the voltage waveform of the word line RWWL under data read in FIG. 16 is equal to that of the read word line RWL shown in FIG. 3. Moreover, the current waveform of the word line RWWL is equal to that of the write word line WWL shown in FIG. 3. Thereby, it is possible to execute data read and data write same as the case of the first embodiment for the memory array 10 constituted of MTJ memory cells by using the word line RWWL.

Because the word line RWWL is a metallic wiring, it has a small resistance value. Therefore, it is possible to secure a data write current Ip under data write. Moreover, because the word line RWWL is quickly charged and changed to a selective state (H level) also under data read, it has a small signal propagation delay.

Thus, by constituting the gate of an access transistor ATR of a low resistance material and using a word line and forming a word line to be used as a read word line RWL and a write word line WWL in common on the same layer as a metallic wiring, it is possible to accelerate the data read operation and improve the integration degree according to reduction of the number of metallic wiring layers.

First Modification of the Third Embodiment

Figure 17:
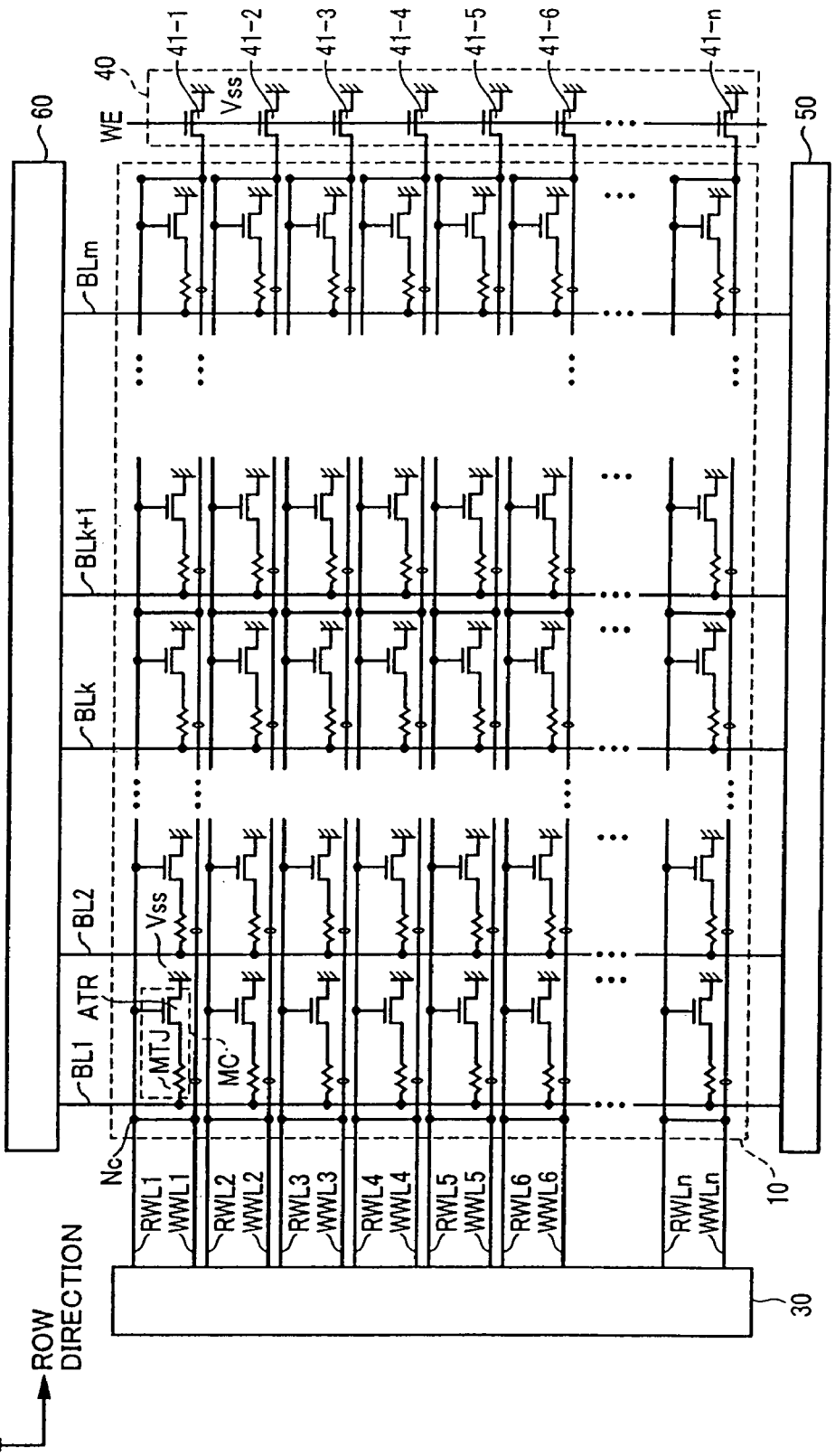
FIG. 17 is an illustration for explaining a configuration of a memory array of a first modification of the third embodiment.

Referring to FIG. 17, a memory array 10 of the first modification of the third embodiment shows a configuration capable of accelerating the data read operation without forming read word lines into a hierarchical structure even when constituting the gate of an access transistor ATR without using a low resistance material.

Referring to FIG. 17, a read word line RWL and a write word line WWL are arranged correspondingly to each memory cell row along the row direction. Read word lines RWL1 to RWLn and write word lines WWL1 to WWLn are arranged on the whole memory array 10.

In the case of the first modification of the third embodiment, it is assumed that the gate of an access transistor ATR is constituted of polysilicon or the like similarly to the case of the first and second embodiments. Correspondingly to the above mentioned, a read word line RWL is constituted of polysilicon or the like on the same wiring layer as the gate of the access transistor ATR. A write word line WWL is constituted of a low-resistance material on a metallic wiring layer in order to generate a magnetic field necessary for data write.

A set of read word lines RWL and a set of write word lines WWL corresponding to each memory cell row are electrically connected each other at least one connective node. For example, a read word line RWL1 is connected with a write word line WWL1 at least one node including a connective node Nc.

Thereby, also when activating a read word line RWL, it is possible to reduce the effective wiring resistance of the read word line RWL by shunting the line RWL with a write word line WWL constituted of a low-resistance material. That is, when activating a read word line RWL from an unselective state (L level) to a selective state (H level), because it is only necessary to charge all word lines in which read word lines RWL and write word lines WWL are connected each other in parallel, it is possible to reduce the effective wiring resistances of the read word lines RWL. Thereby, it is possible to control the signal propagation delay of a read word line RWL and accelerate data read.

Figure 18:
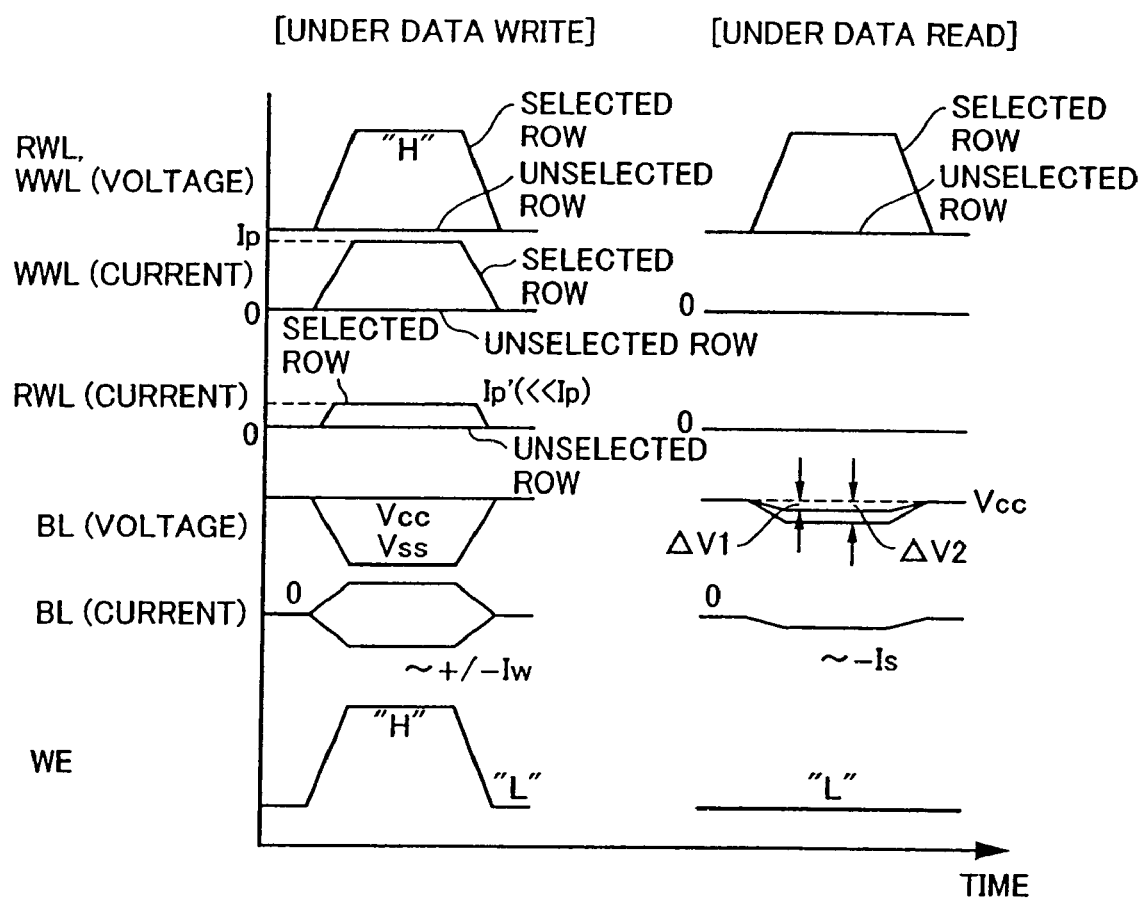
FIG. 18 is a timing chart for explaining operations for reading and writing data from and in the memory array of the first modification of the third embodiment.

FIG. 18 is a timing chart for explaining the data read operation and data write operation of the first modification of the third embodiment.

Referring to FIG. 18, voltage waveforms of a read word line RWL and a write word line WWL electrically connected each other become equalized under data write and data read. Because the voltage waveforms of these word lines are equal to those of the word line RWWL explained for FIG. 16, their descriptions are not repeated.

Moreover, because the resistance value of a read word line RWL is considerably larger than that of a write word line WWL, it is possible to set the current of the write word line WWL to a value almost the same as the case in FIG. 16 and secure a data write current Ip under data write. Similarly, because a current Ip' generated in a read word line RWL under data write is considerably smaller than the data write current Ip, the current Ip' does not affect data write.

However, under data read, the current control transistors 41-1 to 41-$n$ are turned off in response to a control signal WE. Therefore, no current does not flow through a write word line WWL or read word line RWL similarly to the case of the word line RWWL in FIG. 16.

Thereby, it is possible to execute the data read operation and data write operation same as those described for the first, second, and third embodiments for the memory array 10 constituted of MTJ memory cells.

Second Modification of the Third Embodiment

Figure 19:
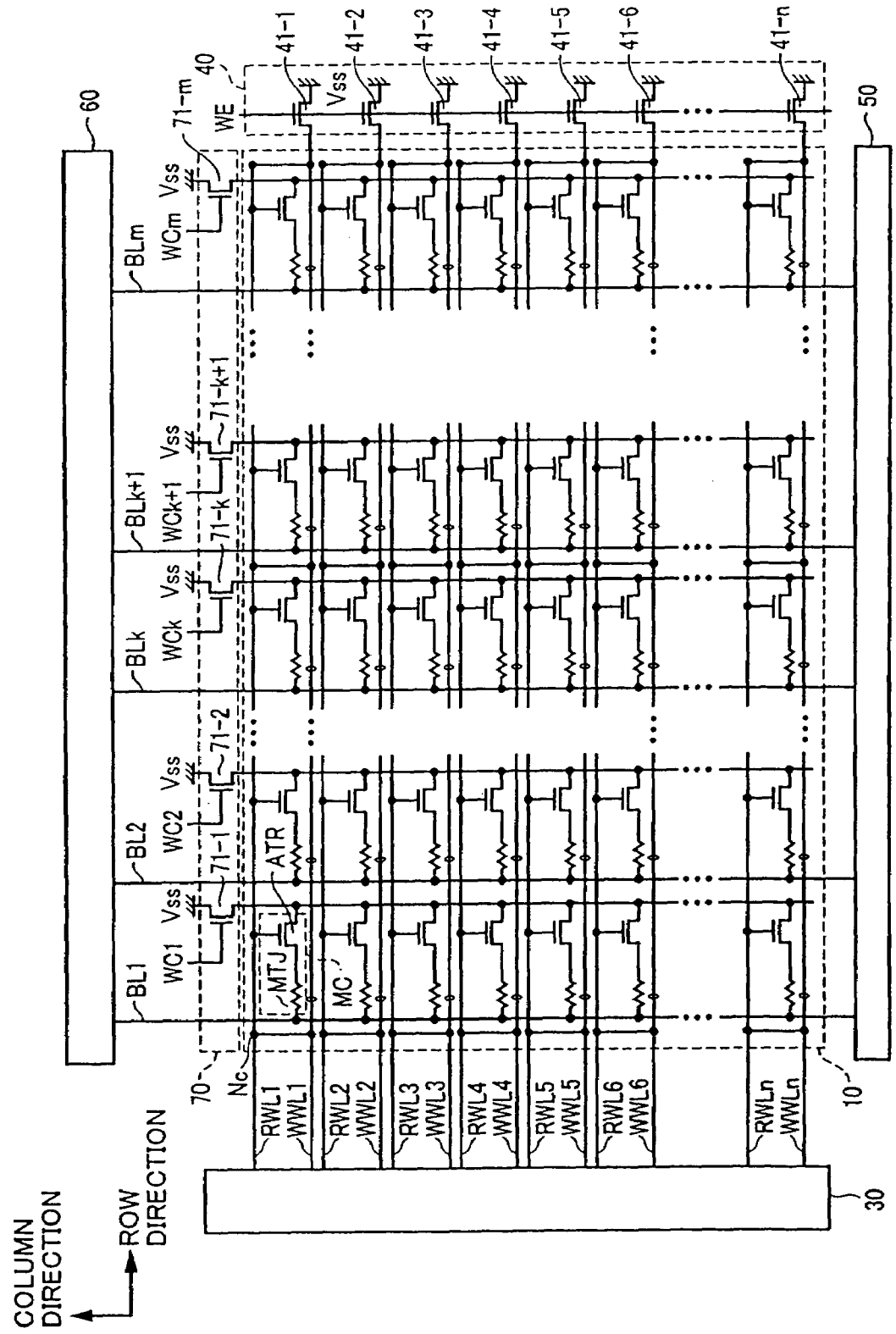
FIG. 19 is an illustration for explaining a configuration of a memory array of a second modification of the third embodiment.

FIG. 19 is an illustration for explaining a configuration of a memory array 10 of the second modification of the third embodiment.

Referring to FIG. 19, a leak-current cutoff circuit 70 is further set to the second modification of the third embodiment in addition to the configuration in FIG. 17. The leak-current cutoff circuit 70 is different in that it is further provided with current cutoff transistors 71-1 to 71-m corresponding to m memory cell columns. Each of the current cutoff transistors 71-1 to 71-n is connected between the source of an access transistor ATR in an MTJ memory cell included in a corresponding memory cell column and a ground voltage Vss. Control signals WC1 to WCm are input to gates of the current cutoff transistors 71-1 to 71-m one to one. Hereafter, these current cutoff transistors are generally expressed by symbol 71.

Referring to FIG. 17, because a read word line RWL is electrically connected with a write word line WWL in the configuration of the first modification of the third embodiment, an access transistor ATR in an MTJ memory cell is turned on also under data write. Because the source terminal of the access transistor ATR is connected to the ground voltage Vss, a leak-current path is formed which passes through a bit line BL (data write currents of ±Iw), magnetic tunnel junction portion MTJ, access transistor ATR, and ground voltage Vss. Therefore, unnecessary power consumption occurs due to a leak current.

Referring to FIG. 19, the leak-current cutoff circuit 70 turns off a portion corresponding to a memory cell column to which data will be written among the current cutoff transistors 71-1 to 71-m corresponding to bit lines. Thereby, it is possible to cut off a leak-current path under data write described above and avoid unnecessary power consumption. Even if the current cutoff transistors 71-1 to 71-m are turned off, it is possible to normally perform the data write operation.

Figure 20:
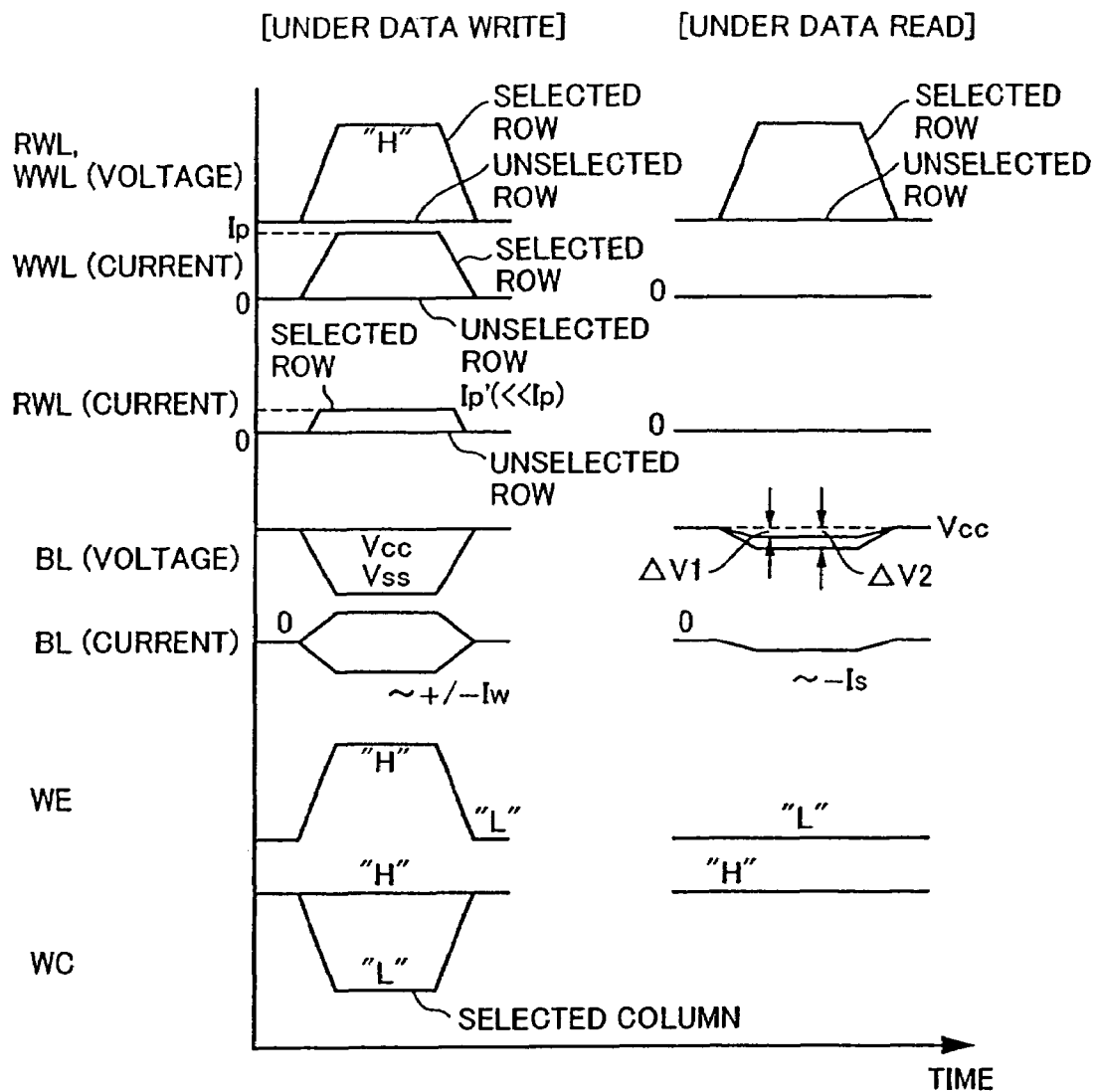
FIG. 20 is a timing chart for explaining operations for reading and writing data from and in the memory array of the second modification of the third embodiment.

Referring to FIG. 20, when generically showing control signals WC1 to WCm as WC, the control signal WC is set to L level correspondingly to a memory cell column in which data will be written. In response to the above operation, a corresponding current cutoff transistor is turned off to disconnect the source of an access transistor ATR from a ground voltage Vss. As a result, it is possible to avoid an unnecessary leak current from occurring in an MTJ memory cell in which data will be written.

In the case other than the above data write, however, the control signal WC is set to H level correspondingly to each current cutoff transistor. Thereby, the source voltage of an access transistor ATR in each MTJ memory cell is set to the ground voltage Vss under data read. Therefore, it is possible to normally read data from the memory array 10 constituted of MTJ memory cells similarly to the case described for the first to third embodiments.

Then, the structure of an MTJ memory cell having a read word line RWL shunted by a write word line WWL is described below.

Figure 21:
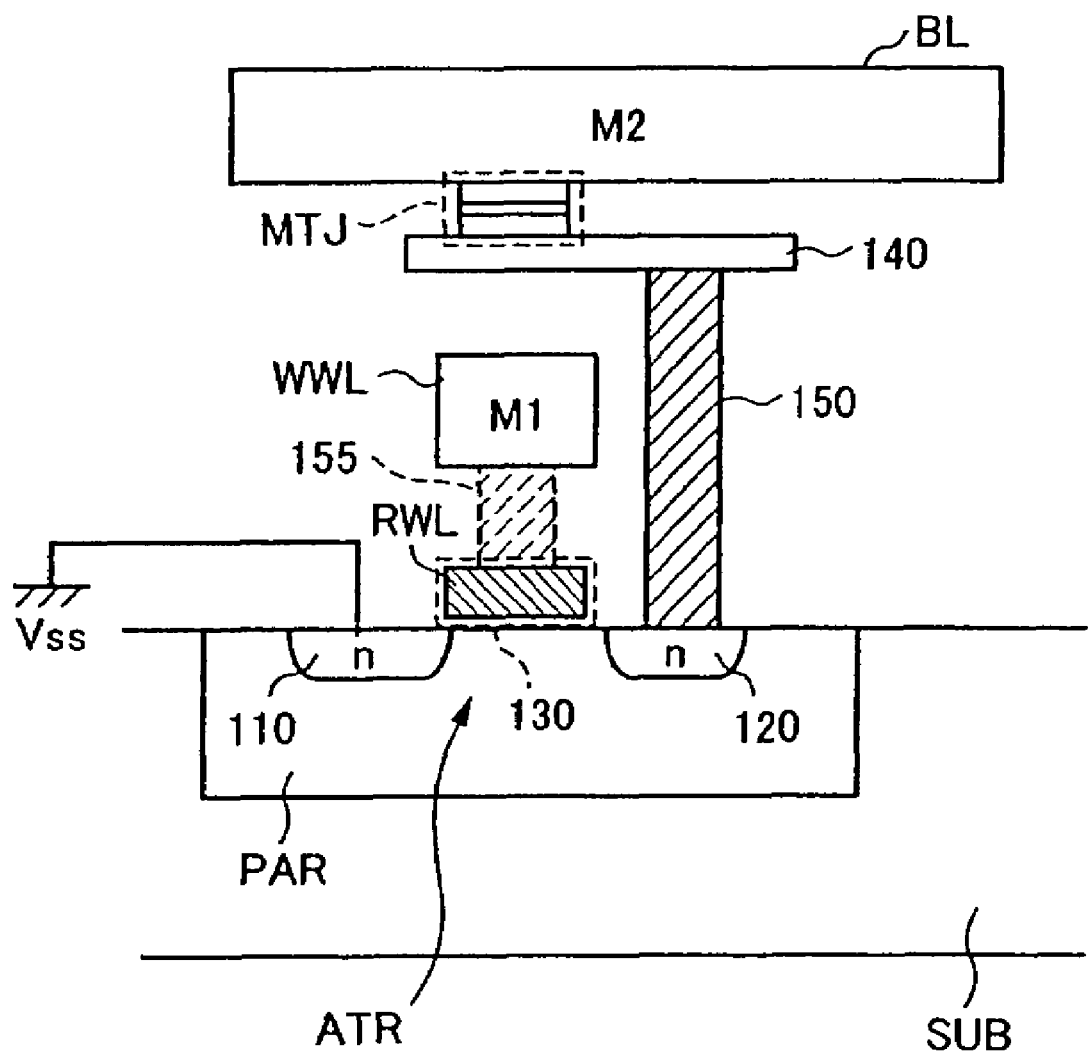
FIG. 21 is a structural drawing of an MTJ memory cell conforming to the first and second modifications of the third embodiment set on a semiconductor substrate.

FIG. 21 is a structural drawing of an MTJ memory cell of the first and second modifications of the third embodiment set on a semiconductor substrate.

Referring to FIG. 21, an n-type region corresponding to the source/drain region 110 of an access transistor ATR formed on a main semiconductor substrate SUB is directly connected with a ground voltage Vss. For example, in the case of MTJ memory cells included in the same memory-cell row or memory-cell column, efficient arrangement is realized by electrically connecting n-type regions corresponding to the source/drain region 110 each other and simultaneously connecting them with the ground voltage Vss.

A write word line WWL and a bit line BL are set to first and second metallic wiring layers M1 and M2, respectively. The bit line BL is electrically connected with a magnetic tunnel junction portion MTJ. The magnetic tunnel junction portion MTJ is electrically connected to the source/drain region 120 of an access transistor ATR through a barrier metal 140 and a metallic film 150.

The write word line WWL is electrically connected with a read word line RWL formed on the same layer as the gate 130 of the access transistor ATR at least one connection node by a metallic film 155 formed at a contact hole.

Thus, by shunting the high-resistance read word line RWL with the write word line WWL made of a low-resistance material, it is possible to form an MTJ memory cell from which data can be quickly read by a simple longitudinal structure using a on the semiconductor substrate.

Third Modification of the Third Embodiment

In FIG. 19, a configuration for voiding an unnecessary leak current from occurring under data write is shown for the memory array 10 of the first modification of the third embodiment. However, the same leak current also occurs in the memory array 10 of the third embodiment having a common word line RWWL.

FIG. 22 is an illustration for explaining a configuration of the memory array 10 of the third modification of the third embodiment.

Referring to FIG. 22, a leak-current cutoff circuit 70 same as that shown in FIG. 19 is further used in addition to the configuration of the memory array 10 of the third embodiment shown in FIG. 15 in which word lines RWWL correspond to rows of memory cells. The leak-current cutoff circuit 70 includes current cutoff transistors 71-1 to 71-m corresponding to m memory cell columns. Control signals WC1 to VCm are input to gates of the current cutoff transistors 71-1 to 71-m one to one. Setting of the control signals WC1 to WCm is not repeatedly described because it is already described for FIG. 20.

Also in the case of a configuration in which word lines RWWL are arranged, because an access transistor ATR is turned on under data write, an unnecessary current is consumed when a leak-current path passing through a bit line BL, magnetic tunnel junction portion MTJ, access transistor ATR, and ground voltage Vss is formed.

Therefore, similarly to the description for the second modification of the third embodiment, transistors corresponding to a memory cell column in which data will be written among the current cutoff transistors 71-1 to 71-m are turned off. Thereby, it is possible to cut off a leak-current path for data write and avoid unnecessary power consumption from occurring.

Fourth Embodiment

Figure 23:
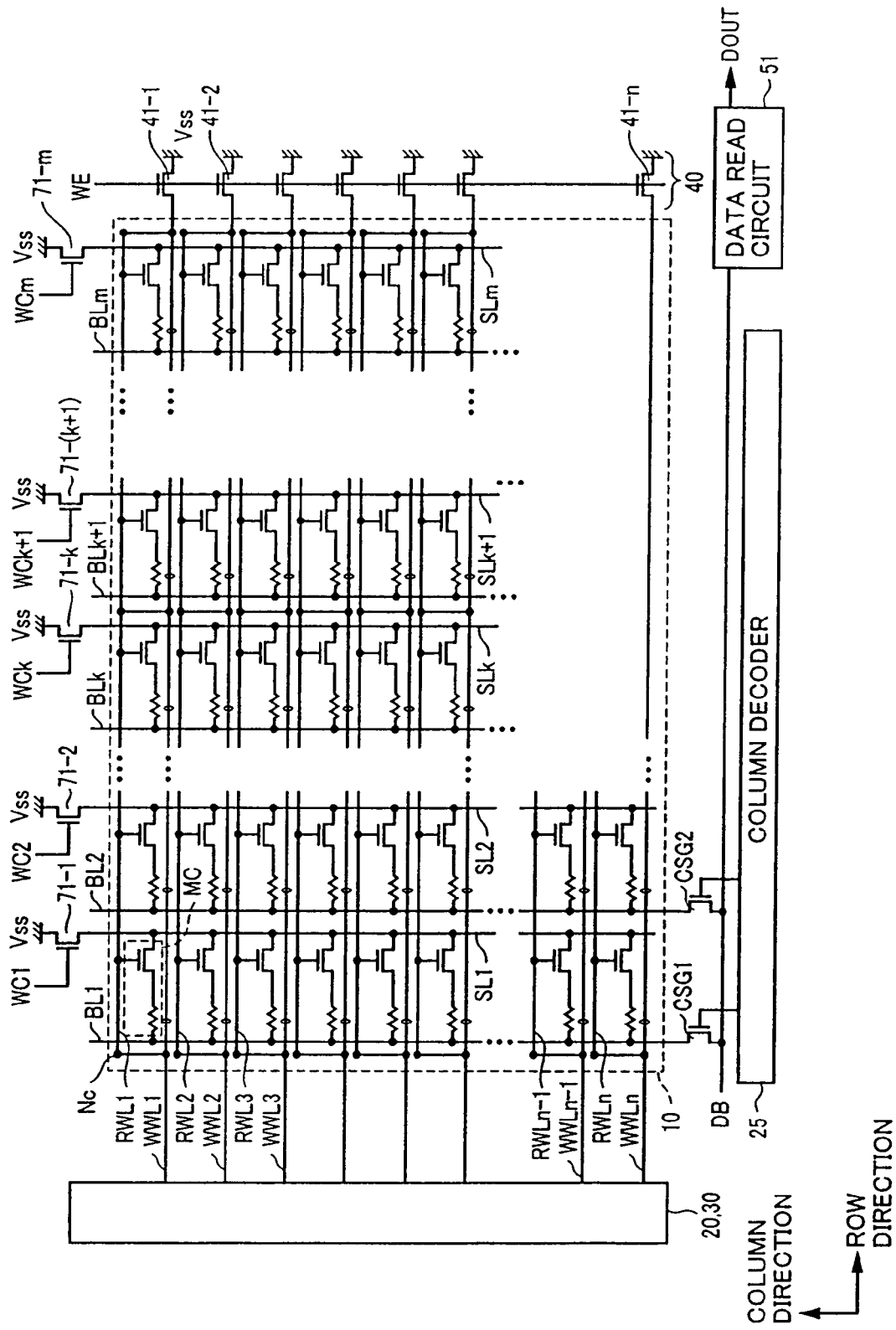
FIG. 23 is an illustration for explaining a configuration relating to data read by a memory array and its peripheral circuit of a fourth embodiment of the present invention.

Referring to FIG. 23, a data bus DB and a data read circuit 51 provided for bit lines BL1 to BLm in common are further added to the configuration of the fourth embodiment in addition to the configuration of the memory array 10 of the second modification of the third embodiment shown in FIG. 19. The data read circuit 51 supplies a sense current Is to the data bus DB under data read.

Moreover, column selection gates are arranged between one end of the bit lines BL1 to BLm and the data bus DB. Column selection gates CSG1, CSG2, . . . are turned on/off in response to a column selection result by a column decoder 25. Hereafter, the column selection gates CSG1, CSG2, . . . are also generally referred to as column selection gate CSG.

Therefore, corresponding bit line BL and data bus DB are electrically connected each other through the column selection gate CSG at a memory-cell column corresponding to a column selection result.

Because configurations of other portions are the same as those of the memory cell array 10 of the second modification of the third embodiment shown in FIG. 19, detailed description is not repeated.

Moreover, a wiring electrically connected with the source of an access transistor ATR in each memory-cell column is referred to as source line SL. That is, in the whole of the memory array 10, source lines SL1 to SLm are provided which are electrically connected with a ground voltage Vss through current cutoff transistors 71-1 to 71-*m* correspondingly to each memory-cell column.

Figure 24:
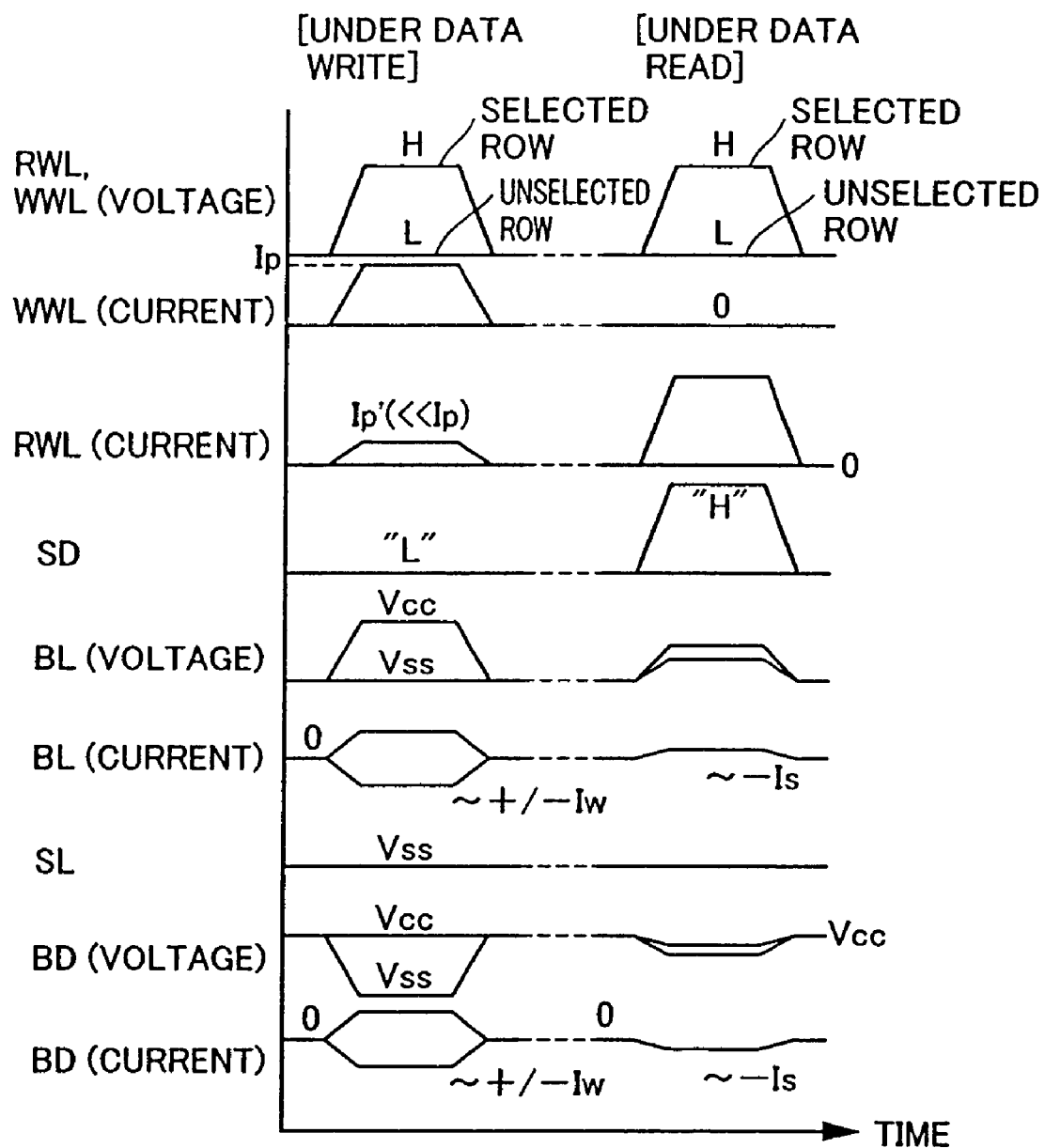
FIG. 24 is a timing chart for explaining the data read operation and data write operation for the memory array of the fourth embodiment.

Referring to FIG. 24, setting of voltages and currents of bit line BL, write word line WWL, and read word line when data is written in the memory array 10 of the fourth embodiment is the same as the case in FIG. 20 except that the voltage level of a bit line BL when data is not written is set not to a power-supply voltage Vcc but to a ground voltage Vss. Therefore, detailed description is not repeated.

In FIG. 23, only supply of the sense current Is by circuits relating to data read, that is, by the data bus DB and data read circuit 51 is illustrated. However, by connecting the other ends of the bit lines BL1 to BLm with a data bus /DB paired with the data bus DB and setting voltage level of the data bus DB and the voltage level of the data bus /DB to a high-voltage state (Vcc) and a low voltage state (Vss) one to one and similarly circulating the data-write current ±Iw described for the first to third embodiments, it is possible to execute the same data write operation.

Moreover, because setting of signal levels of control signals WE and WC under data write and data read is the same as the case in FIG. 20, the illustration is omitted.

Then, the operation for reading data is described below.

Before reading data, each bit line BL is precharged to the ground voltage Vss.

When data is read, a bit line BL corresponding to a selected memory-cell column is connected with the data bus DB through a corresponding column selection gate CSG. The data read circuit 51 pulls up the data bus DB with the power-supply voltage Vcc connected with a voltage different from the ground voltage Vss and supplies the sense current is for reading data.

As a result, a current path is formed between the data read circuit 51, data bus DB, column selection gate CSG, bit line BL, magnetic tunnel junction portion MTJ, access transistor ART, source line SL, current cutoff transistor 71, and ground voltage Vss and the sense current Is is circulated.

Thereby, a voltage change corresponding to the resistance value of the magnetic tunnel junction portion MTJ to be changed by the level of storage data is generated in the bit line BL and data bus DB.

The data read circuit 51 sets the level of read data DOUT in accordance with the voltage level of the data bus DB. Thus, it is possible to convert the difference between resistance values of the magnetic tunnel junction portion MTJ corresponding to the stored data level to a voltage difference and read the voltage difference.

When data is read, a corresponding write word line WWL is selectively activated to H level in response to a row selection result and a read word line RWL electrically connected with the write word line WWL is also activated to H level. Thus, because the read word line RWL shunted by the write word line WWL made of a low-resistance material is activated, it is possible to reduce the effective wiring resistance of the read word line RWL and control the signal propagation delay of the read word line RWL.

As described above, by setting the precharge voltage of the bit line BL to the ground voltage Vss, it is possible to charge only a bit line corresponding to a selected memory-cell column up to the power-supply voltage Vcc. That is, it is unnecessary to supply a charge current for precharging the bit line BL up to the power-supply voltage Vcc to other memory-cell columns whenever reading data. As a result, it is possible to reduce the power consumption of the memory array 10.

Moreover, because the voltage level of the bit line BL after end of data write is equalized with the precharge level (ground voltage Vss), it is unnecessary to execute new precharge operation under data read and thereby, it is possible to accelerate data read.

Referring to FIG. 23 again, as already described, because the sense current Is circulates through the path between the data bus DB, bit line BL, memory cell MC, source line SL, and ground voltage Vss, resistance values of sense-current paths are changed depending on the position of a selected memory-cell row and thereby, the value of the sense current may be fluctuated.

Thus, when the sense current fluctuates depending on the position of a selected memory cell, it is impossible to equally keep operational margins under data read in a memory array and it is difficult to sufficiently secure every operational margin of the MRAM device. As a result, a problem may occur in an extreme case that a malfunction occurs and the yield is deteriorated.

Figure 25:
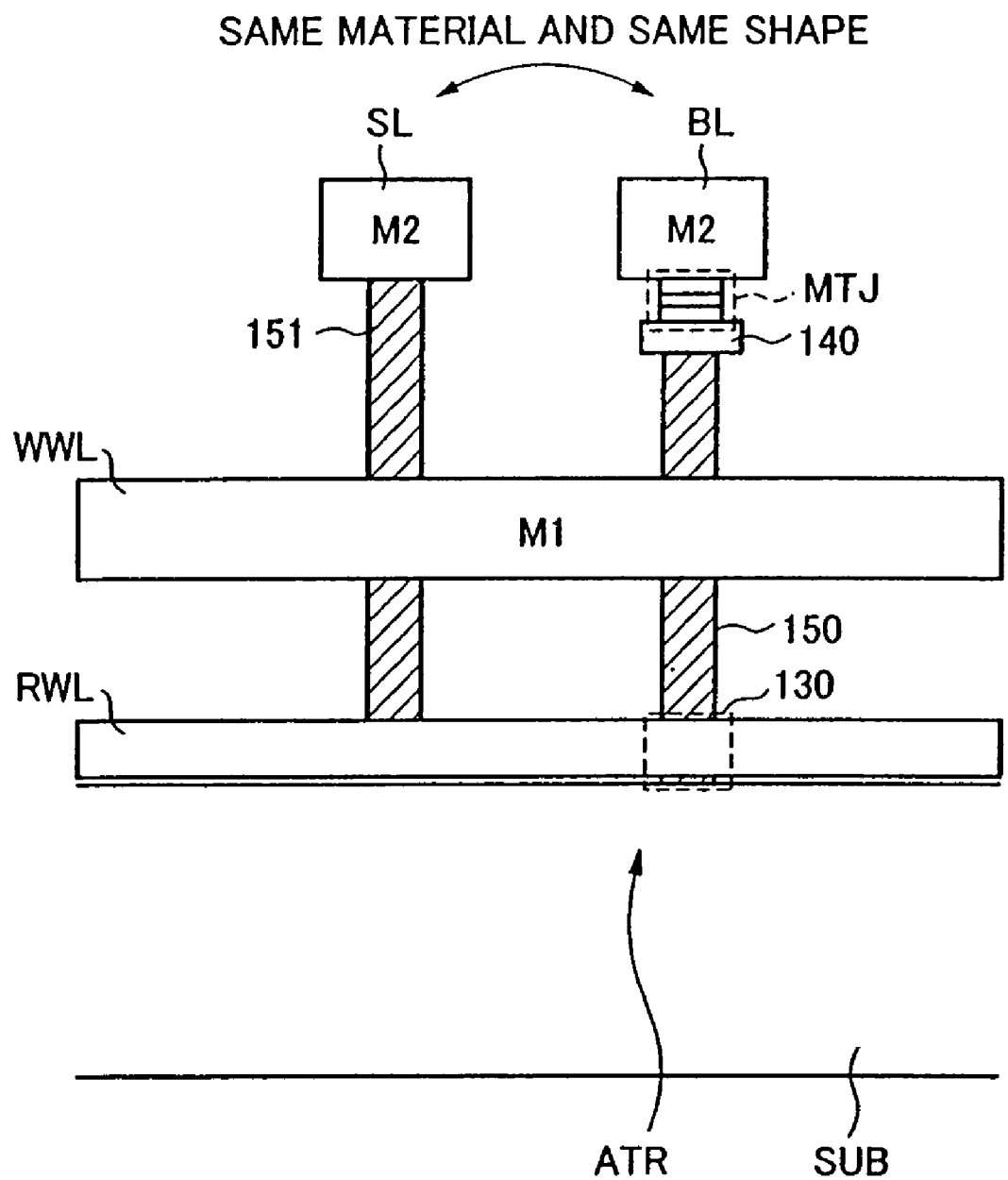
FIG. 25 is a structural drawing showing a setting example of a source lines SL of the fourth embodiment.

Referring to FIG. 25, in the case of the configuration of the fourth embodiment, a source line SL is set on the same metallic wiring layer (M2) with the same shape and same material as the case of a bit line BL. Thereby, resistance values of the source line SL and bit line BL for unit length are designed to the same value.

By arranging source lines SL and bit lines BL as described above and as shown in FIG. 24, forming the joint (that is, current-cutoff transistor 71) between each source line SL and the ground voltage Vss and the joint between the data bus DB to which the sense current Is is supplied and each bit line BL (that is, column selection gate CSG) at one end and the other end of a memory array, it is possible to keep the sum of resistance values of bit lines BL and source lines SL included in the path of the sense current Is almost constant independently of the position of a selected memory-cell row.

Thereby, it is possible to prevent the value of the sense current Is from fluctuating depending on the selected memory-cell row. As a result, it is possible to equally keep operational margins under data read in a memory array and sufficiently secure every operational margin of the MRAM device.

Moreover, it is necessary to design a source line SL so that the resistance value of the source line SL for unit length becomes equal to that of a bit line BL. As long as the above condition is satisfied, it is possible to set each wiring to metallic wiring layers different from each other.

First Modification of the Fourth Embodiment

Figure 26:
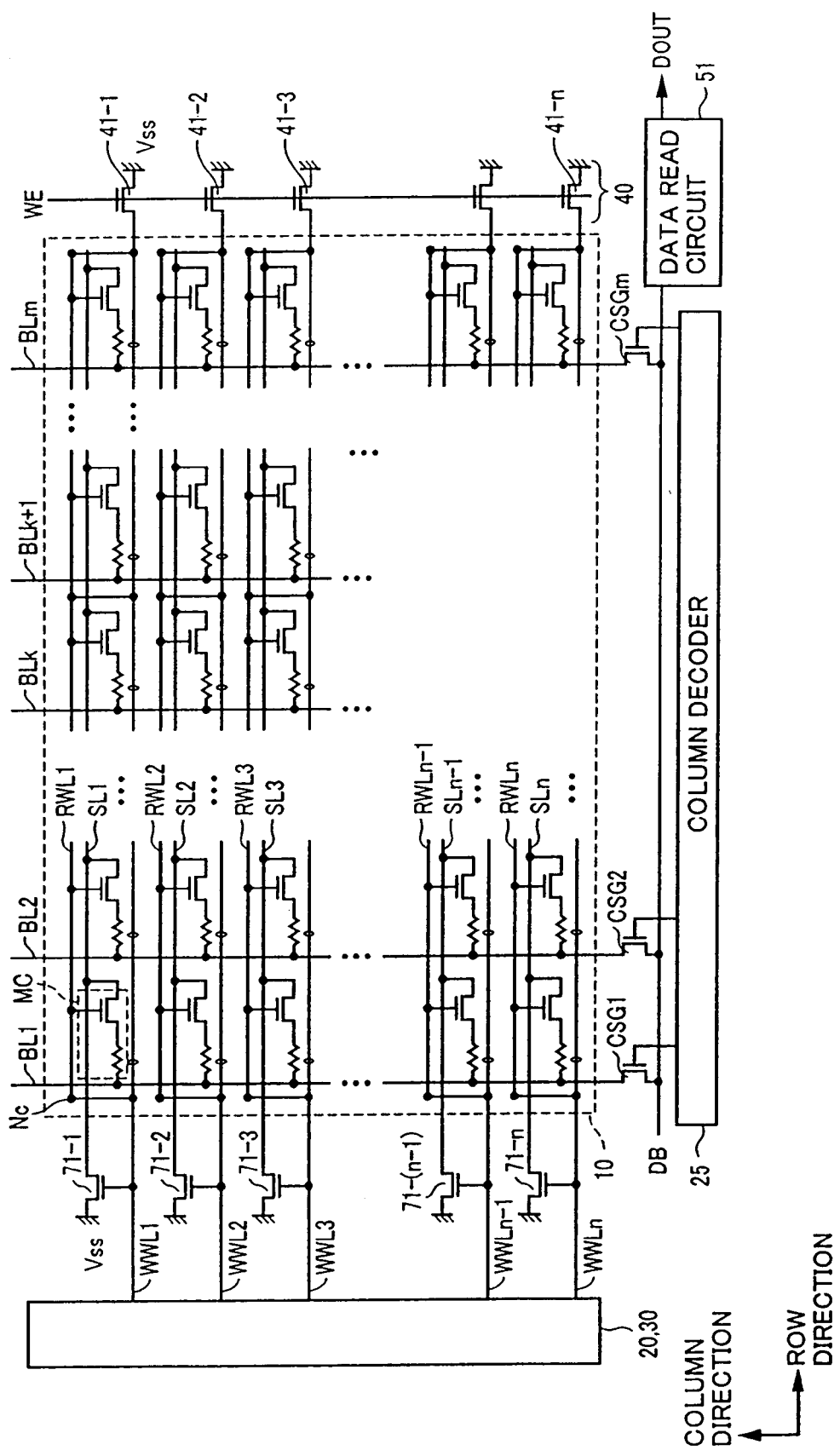
FIG. 26 is an illustration for explaining a configuration relating to data read by the memory array and its peripheral circuit of the first modification of the fourth embodiment of the present invention.

Referring to FIG. 26, in the case of the configuration of the first modification of the fourth embodiment, a source line SL is set almost in parallel with a read word line RWL and a write word line WWL. In the whole memory array 10, source lines SL1 to SLn are set correspondingly to each memory-cell row.

The current-cutoff transistors 71 are set between the source lines SL1 to SLn and the ground voltage Vss one each. FIG.

25 shows current-cutoff transistors 71-1 to 71-3, 71-(n−1), and 71-n corresponding to first to third, (n−1)th, and nth rows.

By using the above configuration, it is possible to use a write-word-line voltage or a row decode signal for a control signal of the current-cutoff transistor 71 for controlling connection/disconnection between the source line SL and the ground voltage Vss in order to avoid unnecessary power consumption from occurring by cutting off a leak-current path when data is written. As a result, it is unnecessary to generate control signals WE1 to WEm in FIG. 19 and thus, it is possible to simplify the configuration of peripheral circuits.

Because configurations of other portions are the same as those of the memory array 10 of the fourth embodiment shown in FIG. 23, detailed description is not repeated. Moreover, because data read and data write for each memory cell MC set to the memory array 10 can be executed similarly to the case of the fourth embodiment, detailed description is not repeated.

Moreover, similarly to the bit line BL and source line SL of the fourth embodiment, by designing each source line SL and a data bus DB so that wiring resistances of the source line SL and the data bus DB for unit length become the same value and as shown in FIG. 26, forming the joint (that is, current-cutoff transistor 71) between each source line SL and the ground voltage Vss and the joint between the data bus DB and the data read circuit 51 at one end and the other end of a memory array, it is possible to keep the sum of resistance values of bit lines BL and source lines SL included in the path of the sense current Is almost constant independently of the position of a selected memory-cell column.

As a result, it is possible to prevent the value of the sense current Is from being fluctuated depending on the selected memory-cell column. Therefore, it is possible to equally keep operational margins under data read in the memory array and sufficiently secure every operational margin of the MRAM device.

Similarly to the description of the fourth embodiment, it is necessary to design each source line SL and the data bus DB so that resistances of the source line SL and data bus DB for unit length become the same value. As long as the condition is satisfied, it is possible to set each wiring on metallic wiring layers different from each other.

Second Modification of the Fourth Embodiment

Referring to FIG. 27, in the case of the configuration of the second modification of the fourth embodiment, dummy bit lines DMBL connected with the ground voltage Vss are newly arranged along the column direction. The source lines SL1 to SLn are electrically connected with the dummy bit lines DMBL one to one through the current-cutoff transistors 71-1 to 71-n.

Because the configuration of other portions is the same as the case of the memory array 10 of the first modification of the first embodiment shown in FIG. 26, detailed description is not repeated. Moreover, because data read and data write for memory cells MC arranged on the memory array 10 can be executed similarly to the case of the fourth embodiment, detailed description is not repeated.

In the case of the configuration of the first modification of the fourth embodiment shown in FIG. 26, it is possible to control the fluctuation of the sense current depending on a selected memory-cell column and arrange operational margins under data read in a memory array by properly arranging source lines SL and a data bus DB.

In the case of the configuration in FIG. 26, however, because wiring lengths of bit lines BL included in sense-current paths are changed depending on the position of a selected memory-cell row, the resistance value of the current path fluctuates and thereby, the value of the sense current may be also fluctuated.

Therefore, in the case of the configuration of the second modification of the fourth embodiment, the data bus DB and source lines SL are arranged similarly to the case of the first modification of the fourth embodiment and design is made so that wiring resistance values for unit length become equal to each other even between each dummy bit line DMBL and bit line BL. Moreover, as shown in FIG. 27, the joint between the dummy word line DMBL and the ground voltage Vss and the joint (that is, column selection gate CSG) between the data bus DB to which the sense current Is is supplied and each bit line BL are formed at one end and the other end of a memory array. As a result, it is possible to keep the sum of wiring resistances of bit lines BL and dummy bit lines DMBL included in the path of the sense current Is almost constant independently of the position of a selected memory-cell column. Thereby, it is possible to prevent the sense current Is from being fluctuated depending on a selected memory-cell row.

By arranging bit lines BL, dummy bit lines DMBL, source lines SL, and the data bus DB as described above, it is possible to make the sum of wiring resistances of sense-current paths almost constant independently of selected memory-cell row and memory-cell column, that is, the position of a selected memory cell. As a result, it is possible to more stably secure every operational margin of the MRAM device under data read.

Fifth Embodiment

Figure 28:
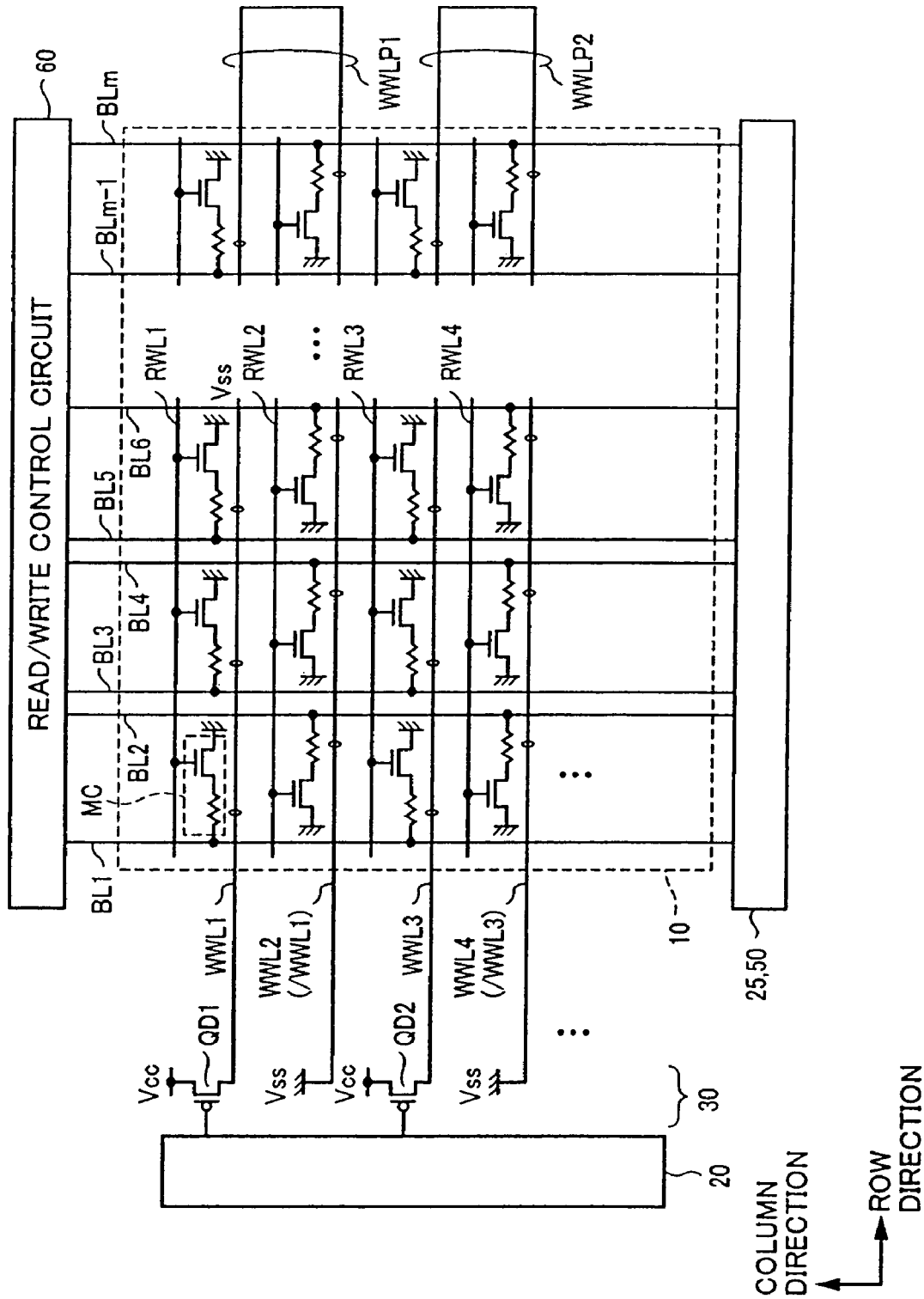
FIG. 28 is a conceptual illustration for explaining the arrangement of write word lines of a fifth embodiment.

Referring to FIG. 28, in the case of the configuration of the fifth embodiment, write word lines WWL arranged correspondingly to each memory-cell row constitute a write-word-line pair every set of two write word lines WWL.

For example, write word lines WWL1 and WWL2 adjacent to each other constitute a write-word-line pair WWLP1. The write word line WWL2 functions as a complementary write word line /WWL1 for supplying a data-write current in the direction opposite to the write word line WWL1 when data is written. The write word line WWL1 is electrically connected with the power-supply voltage Vcc through a transistor QD1. The write word line WWL2 (/WWL1) is electrically connected with the ground voltage Vss.

Write word lines WWL are similarly arranged in the subsequent memory-cell rows. A write-word-line pair WWLP2 is constituted of a write word line WWL3 and a write word lined WWL4 (/WWL3) electrically connected with the power-supply voltage Vcc through a transistor QD2 and a write word line WWL corresponding to an odd row is electrically connected with the power-supply voltage Vcc through a driver transistor every two memory cell rows. A write word line WWL corresponding to an even row is electrically connected with the ground voltage Vss.

Each driver transistor is activated correspondingly to a row selection result. For example, when the first or second memory-cell row is selected, the driver transistor QD1 is turned on. Thereby, data-write currents are supplied to the write word lines WWL1 and WWL2 (/WWL1) constituting the write-word-line pair WWLP1 in the opposite directions to each other. Thus, in the case of the configuration of the fifth embodiment, selection of a memory-cell row is executed every write-word-line pair formed every two memory-cell rows.

Hereafter, write-word-line pairs and driver transistors are generally shown by symbol WWLP for the former and symbol QD for the latter. A specific write-word-line pair is shown by, for example, WWLP1 and a specific driver transistor is shown by, for example, QD1. Moreover, one of write word lines constituting a write-word-line pair WWLP, that is, a write word line corresponding to an odd memory-cell row is generally shown by WWL and the other of the write word lines constituting the pair WWLP, that is, a write word line corresponding to an even memory-cell row is generally shown by /WWL.

Write word lines WWL and /WWL for forming the same write-word-line pair are electrically connected each other in a region in which a driver transistor QD is set and a region at the opposite side to the former region at the both sides of the memory array 10. Thereby, a data-write current Ip is supplied to WWL and /WWL constituting a write-word-line pair corresponding to a selected memory-cell row as a reciprocating current.

When a data-write magnetic field is applied to MTJ memory cells from the data-write current Ip and ±Iw which are supplied in accordance with a column selection result, they are arranged every other column in each memory-cell row so that data is not written in a plurality of memory cells at the same time.

Thus, by forming a reciprocating current path by a write-word-line pair, it is possible to simplify the configuration of a word-line driver 30 because it is permitted to set a driver transistor QD every two rows.

Moreover, a peripheral magnetic field by a data-write current +Ip circulating through a write word line WWL corresponding to a selected memory-cell row and a peripheral magnetic field by a data-write current −Ip circulating through a write word line /WWL work so as to be cancelled each other. Therefore, it is possible to reduce magnetic-field noises to the peripheral portion of memory cells.

First Modification of the Fifth Embodiment

Figure 29:
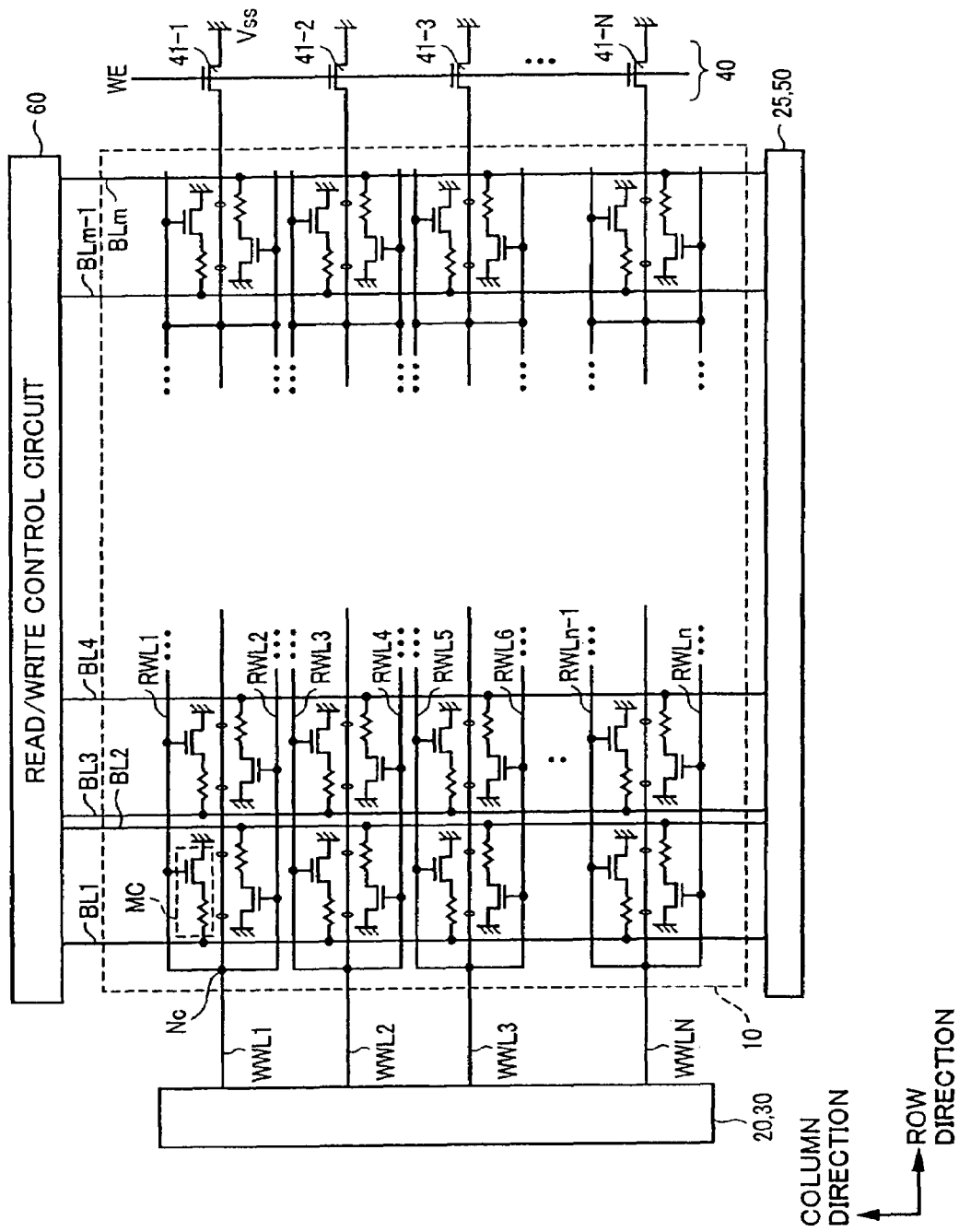
FIG. 29 is an illustration for explaining a configuration of the memory array and its peripheral circuit of the first modification of the fifth embodiment.

Referring to FIG. 29, in the case of the configuration of the first modification of the fifth embodiment, a write word line WWL is shared by adjacent memory-cell rows. For example, a write word line WWL is shared by first and second memory-cell rows. Write word lines WWL1 are similarly arranged for subsequent memory-cell rows. Write word lines WWL1 to WWLN (N: natural number shown by n/2) are connected with a ground voltage Vss through current control transistors 41-1 to 41-N.

Moreover, each write word line WWL is electrically connected with corresponding read word lines RWL for two rows. For example, read word lines RWL1 and RWL2 corresponding to first and second memory-cell rows are electrically connected with the write word line WWL1. Thereby, the substantial resistance value of a read word line RWL under data read is reduced by shunt. Therefore, it is possible to reduce the propagation delay of a read word line RWL and accelerate data read.

Furthermore, by sharing a write word line WWL, it is possible to decrease the number of arranged write word lines WWL in the whole of a memory array 10. As a result, because the write word lines WWL can be arranged by using a layout region for two rows, it is possible to secure a large-enough sectional area by sufficiently securing the wiring width of the word line WWL.

Thereby, in the case of a write word line WWL to which a comparatively large current must be supplied, it is possible to stabilize operations by avoiding a hazard such as a short circuit between wirings or disconnection of a wiring due to electromigration by reducing the current density.

Second Modification of the Fifth Embodiment

Figure 30:
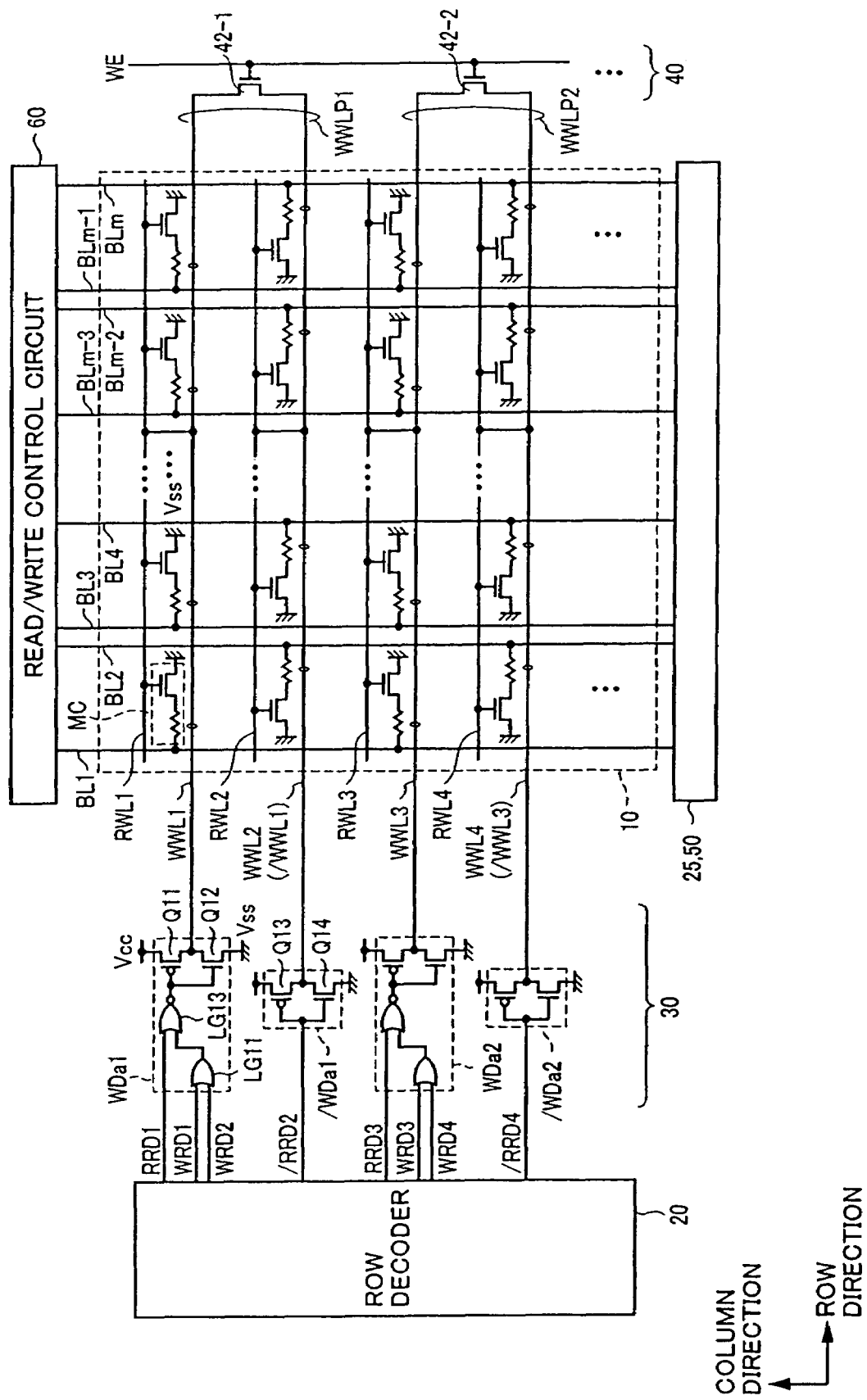
FIG. 30 is an illustration for explaining a configuration of the memory array and its peripheral circuit of the second modification of the fifth embodiment.

Referring to FIG. 30, in the case of the configuration of the second modification of the fifth embodiment, each read word line RWL is electrically connected with a write word line WWL. Thereby, it is possible to reduce the propagation delay under data read by shunting each read word line RWL by a write word line WWL.

As already described, in the case of the above configuration, write word lines WWL are selectively driven by a word-line driver 30.

In the case of the configuration in FIG. 30, a pair is formed every two memory-cell rows and a write-word-line pair WWLP is formed by two write word lines WWL. For example, a write-word-line pair WWLP1 is formed by write word lines WWL1 and WWL2 (/WWL1) corresponding to first and second rows.

Two write word lines WWL and /WWL constituting the same write-word-line pair WWLP are electrically connected each other through a short-circuit transistor 42. That is, the short-circuit transistor 42 is set correspondingly to each write-word-line pair WWLP. Each short-circuit transistor 42 is turned on in response to a control signal WE activated to H level under data write. Short-circuit transistors are generally shown by symbol 42. A specific short-circuit transistor is shown by, for example, 42-1.

FIG. 30 shows a short-circuit transistor 42-1 typically set correspondingly to the first and second memory-cell rows and a short-circuit transistor 42-2 set correspondingly to the third and fourth memory-cell rows.

Figure 31:
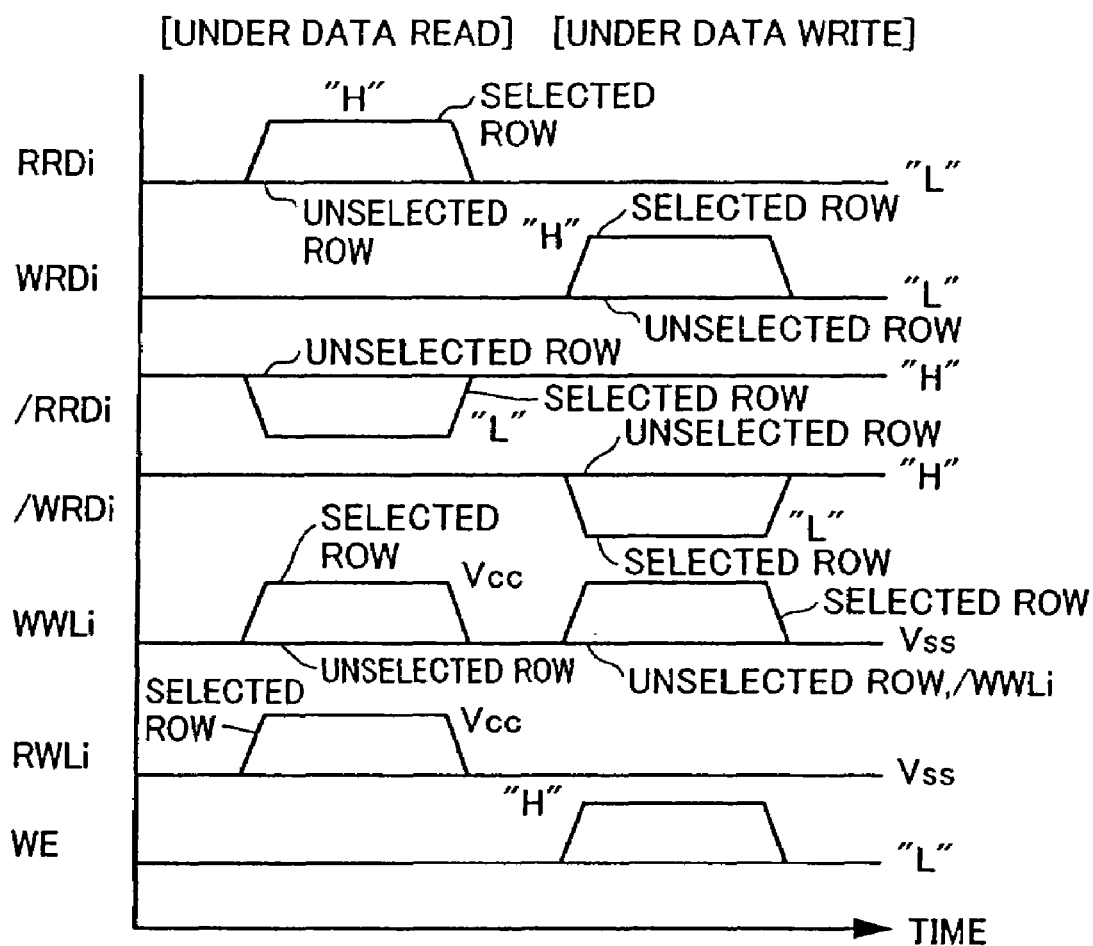
FIG. 31 is a timing chart for explaining the row-selecting operation of a memory array of the second modification of the fifth embodiment.

FIG. 31 is a timing chart for explaining row-selecting operations for data read and data write in a memory array having the configuration shown in FIG. 30.

A read low decode signal RRDi corresponding to the i-th (i: odd natural number of 1 to n) memory-cell row is activated to H level when the i-th memory-cell row is selected as an object for data read. Similarly, a write low decode signal WRDi is activated to H level when the i-th memory-cell row is selected as an object for data write under data write. A read low decode signal /RRDi is an inverted signal of the read low decode signal RRDi and a write low decode signal /WRDi is an inverted signal of the write low decode signal WRDi.

A write word line WWLi is activated to H level when either of an i-th and (i+1)-th memory-cell rows corresponding to the same write word line WWLP is selected. The other write word line /WWLi constituting the same word line pair and a write word line WWL corresponding to an unselected memory-cell row are respectively set to L level (ground voltage Vss).

Moreover, because each short-circuit transistor 42 is turned on under data write, it is possible to supply a data-write current Ip as a reciprocating current by write word lines WWL and /WWL for forming a write-word-line pair WWLP corresponding to a selected memory-cell row.

That is, under data write, it is necessary to set write word lines WWL and /WWL forming a write-word-line pair corresponding to a selected memory-cell row to the power-supply voltage Vcc and ground voltage Vss.

Because a read word line RWLi is electrically connected with a write word line WWLi, its voltage level is set to the same value as the write word line WWLi.

Therefore, it is necessary to independently execute activation (H level) of each write word line WWL under data read. Therefore, it is necessary to turn off each short-circuit transistor 42 and selectively set only a write word line WWL corresponding to a selected memory-cell row to the power-supply voltage Vcc (H-level voltage).

Thus, it is necessary to provide word drivers having configurations different from each other for write word lines WWL corresponding to an odd row and an even row.

In FIG. 30, the configuration of a write word driver Wda1 corresponding to a write word line WWL1 and the configuration of a write word driver /Wda1 corresponding to a write word line WWL2 (/WWL1) are typically described below.

Referring to FIG. 30 again, the write word driver WDa1 has a logic gate LG11 for outputting a result of the logical sum (OR) operation between write low decode signals WRD1 and WRD2, a logic gate LG13 for outputting a result of the NOR operation between an output signal and a read low decode signal RRD1 of the logic gate LG11, and a P-type MOS transistor Q11 and an N-type MOS transistor Q12 electrically connected between the power-supply voltage Vcc, ground voltage Vss, and write word line WWL1, respectively. An output signal of the logic gate LG13 is input to gates of the transistors Q11 and Q12.

By using the above configuration, the write word driver WDa1 electrically connects the write word line WWL1 with the power-supply voltage Vcc in response to the change of an output signal of the logic gate LG13 when either of the write low decode signals WRD1 or WRD2 is activated under data write to H level. When both the write low decode signals WRD1 and WRD2 are inactivated to L level, an output signal of the logic gate LG13 is set to L level. Therefore, the write word driver WDa1 electrically connects the write word line WWL1 with the ground voltage Vss.

The write word driver /WDa1 provided for the write word line WWL2 (/WWL1) has a P-type MOS transistor Q13 and an N-type MOS transistor Q14 electrically connected between the power-supply voltage Vcc, ground voltage Vss, and write word line WWL2, respectively. A read low decode signal /RRD2 is input to gates of the transistors Q13 and Q14.

The read low decode signal /RRD2 is set to H level under data write independently of a row selection result. Therefore, the write word driver /WDa1 electrically connects the write word line WWL2 (/WWL1) with the ground voltage Vss when the transistor Q14 is turned on.

Because the short-circuit transistor 42-1 is turned on under data write in response to activation (H level) of a control signal WE, a reciprocating current path is formed by the write word lines WWL1 and WWL2 (/WWL1) and a data current Ip is supplied when the first or second memory-cell row is selected and the write word lines WWL1 is set to the power-supply voltage Vcc.

On the other hand, both the write low decode signals WRD1 and WRD2 are inactivated under data read. Therefore, the write word driver WDa1 electrically connects the write word line WWL1 with the power-supply voltage Vcc in response to the change of an output signal of the logic gate LG13 to L level when the read low decode signal RRD1 is activated to H level. Thereby, the read word line RWL1 electrically connected with the write word line WWL1 is also activated to H level.

Similarly, the write word driver /WDa1 electrically connects the write word line WWL2 with the power-supply voltage Vss through the transistor Q13 in response to the activation (L level) of the read low decode signal /RRD2.

Because the short-circuit transistor 42-1 is turned off under data read, the write word lines WWL1 and WWL2 are independently activated to H level. Correspondingly, the read word lines RWL1 and RWL2 are independently activated to H level (power-supply voltage Vcc) in accordance with a row selection result.

Also for the subsequent memory-cell rows, a write word driver having the same configuration as the write word driver WDa1 is provided for odd-row write word lines and a write word driver having the same configuration as the write word driver /WDa1 is provided for write word lines /WWL corresponding to even rows.

By using the above configuration, it is possible to accelerate data read by shunting a read word line RWL with a write word line WWL having a small wiring resistance, circulate a data-write current Ip under data write by a write word pair forming a reciprocating path, and reduce magnetic noises to the outside of a memory cell.

Third Modification of the Fifth Embodiment

Figure 32:
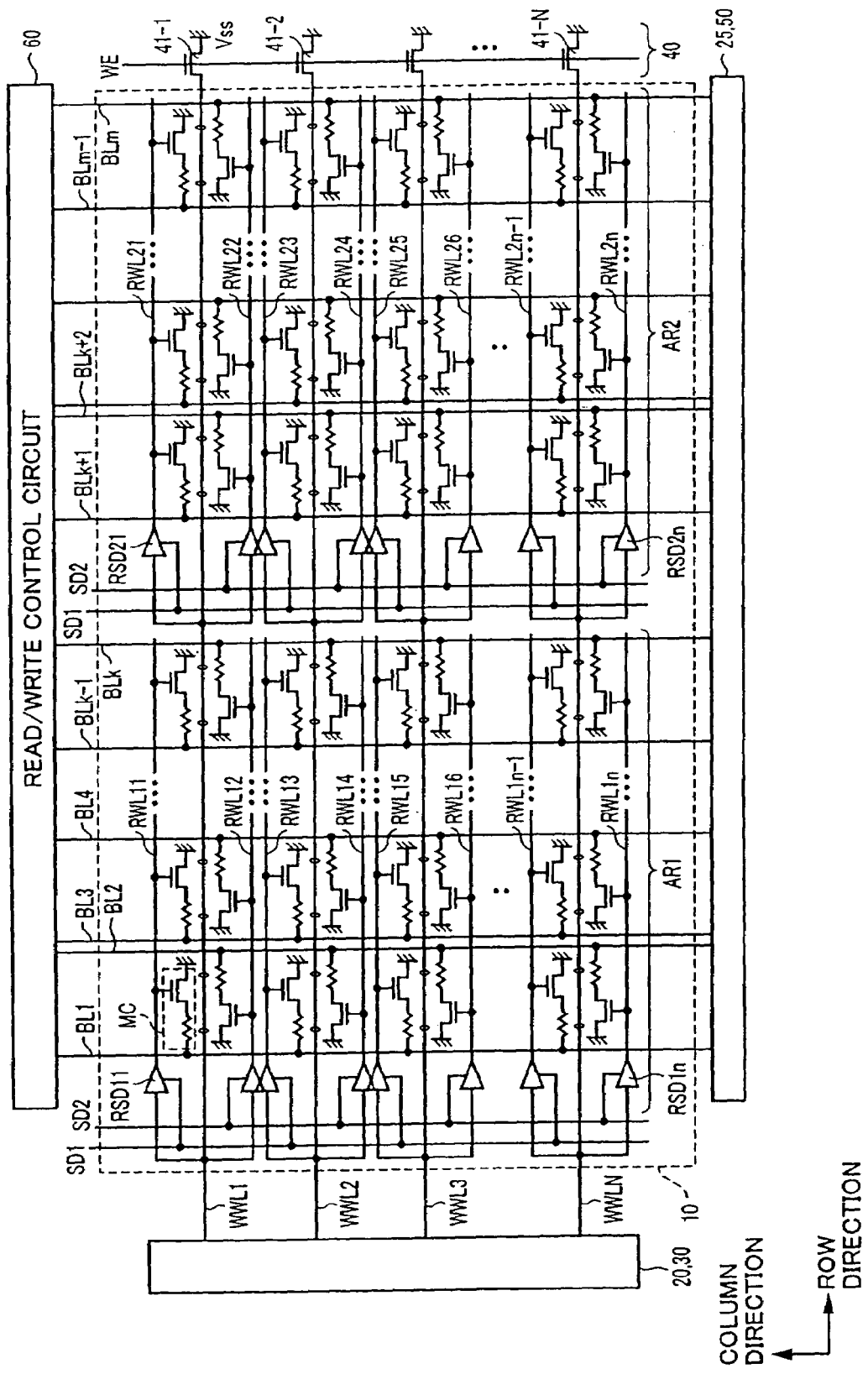
FIG. 32 is an illustration for explaining a configuration of the memory array and its peripheral circuit of the third modification of the fifth embodiment.

Referring to FIG. 32, in the case of the configuration of the third modification of the fifth embodiment, read word lines are hierarchically arranged similarly to the case of the configuration of the second embodiment shown in FIG. 8. Similarly to the case of the fourth embodiment, a write word line WWL is shared by adjacent memory-cell rows.

Similarly to the case of FIG. 8, sub-word drivers RSD11 to RSD1n and RSD21 to RSD2n are arranged in regions AR1 and AR2 in which read word lines RWL are independently arranged. Sub-word drivers corresponding to two memory-cell rows sharing the same write word line WWL respectively activate a corresponding read word line RWL in accordance with the activation of the shared write word line WWL.

However, a sub-word driver corresponding to an odd-numberth memory-cell row operates in response to the activation of a control signal SD1. Similarly, a sub-word driver corresponding to an even-numberth memory-cell row operates in response to the activation of a control signal SD2. The control signal SD1 is activated when the odd-numberth memory-cell row is selected. The control signal SD2 is activated when the even-numberth memory-cell row is selected.

Therefore, a write word line WWL is shared by adjacent memory cells and it is possible to hierarchically divide, arrange, and shorten a read word line RWL without new main read word lines.

Because the configuration of other portions is the same as the case in FIG. 8, detailed description is not repeated.

As a result, data read can be accelerated by reducing the wiring resistance of each read word line RWL and a sectional area can be easily secured by sharing a write word line WWL and thereby securing the wiring pitch of the line WWL. Therefore, it is possible to reduce the electromigration probability of the write word line WWL and improve the operational reliability.

Moreover, read word lines RWL are hierarchically arranged and it is also possible to share a write word line WWL in the configuration in FIG. 9 for independently executing the data-read operation and the data-write operation in the regions AR1 and AR2, respectively.

Fourth Modification of the Fifth Embodiment

In the case of the configuration of the fourth modification of the fifth embodiment, read word lines RWL are hierarchically arranged and a data-write current Ip is supplied to a reciprocating path formed by a write-word-line pair WWLP formed every two memory-cell rows similarly to the case of the configuration shown in FIG. 30.

Figure 33:
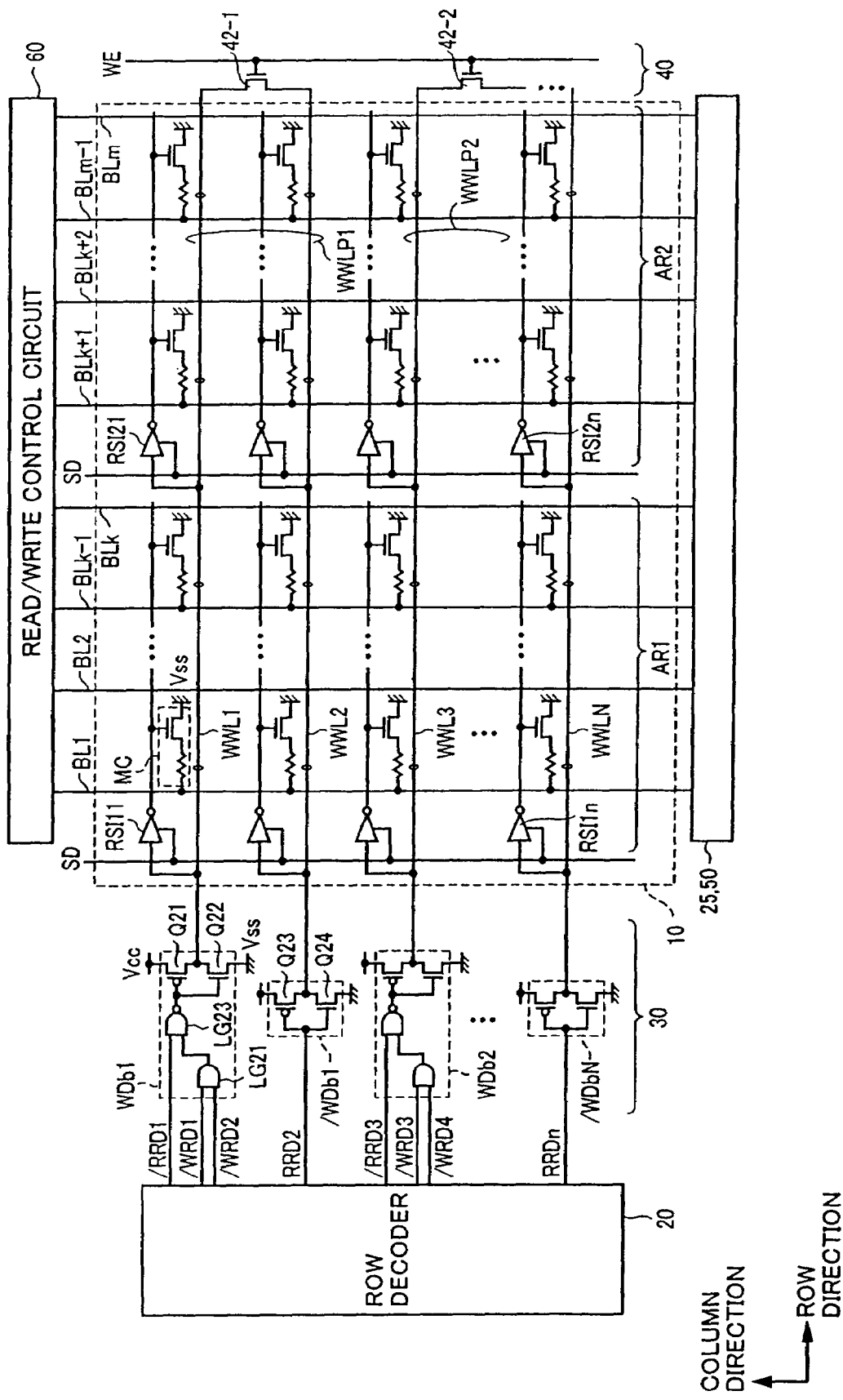
FIG. 33 is an illustration for explaining a configuration of the memory array and its peripheral circuit of the fourth modification of the fifth embodiment.

Referring to FIG. 33, sub-word drivers RSI11 to RSI1*n* and RSI21 to RSI2*n* respectively constituted of an inverter are arranged in regions AR1 and AR2 in which read word lines RWL are independently arranged. The sub-word drivers RSI11 to RSI1*n* and RSI21 to RSI2*n* respectively operate in response to the activation of a control signal SD. When the control signal SD is inactive, each read word line RWL is kept inactive independently of the voltage of a corresponding write word line WWL.

The sub-word drivers RSI11 to RSI1*n* and RSI21 to RSI2*n* are different from the sub-word drivers RSD11 to RSD1*n* shown in FIG. 32, each of which drives a corresponding read word line RWL by inverting the voltage level of a corresponding write word line WWL.

Figure 34:
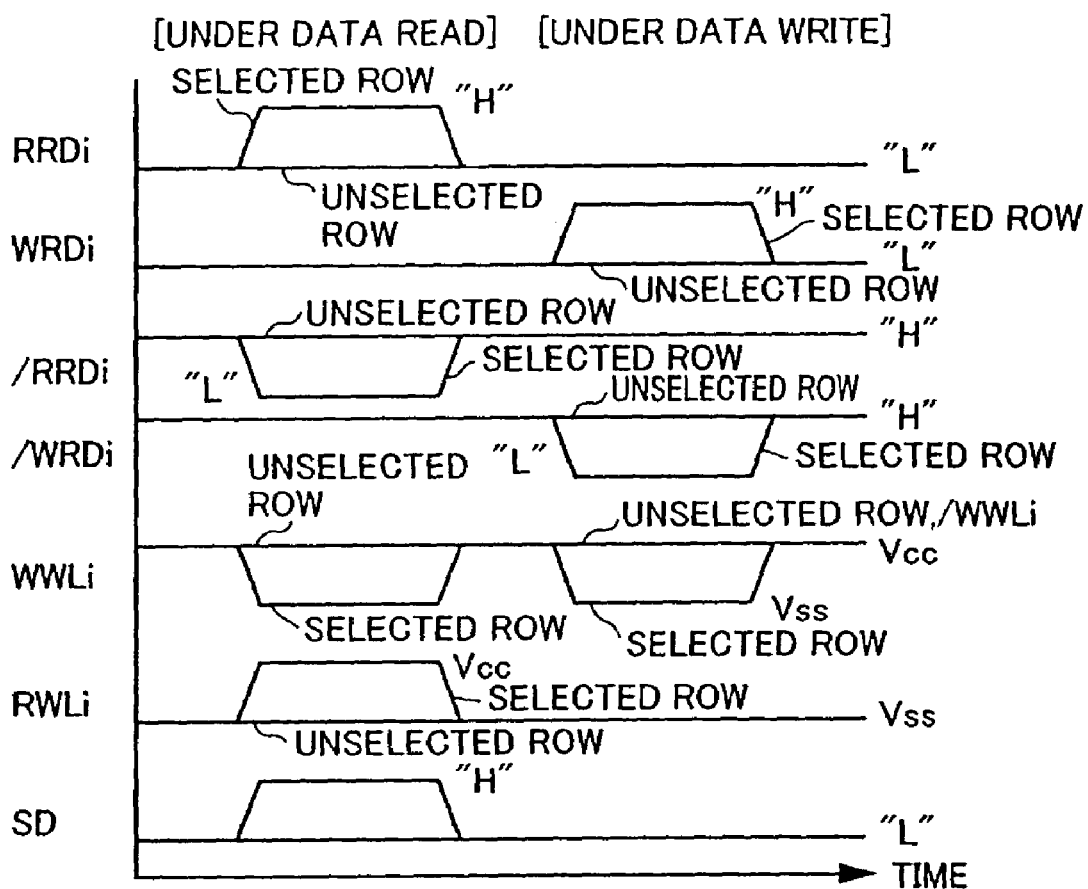
FIG. 34 is a timing chart for explaining the row-selecting operation of a memory array of the fourth modification of the fifth embodiment.

FIG. 34 shows a timing chart for explaining row-selecting operations under data read and data write in a memory array having the configuration shown in FIG. 33.

Read low decode signals RRDi and /RRDi and write low decode signal WRDi and /WRDi are set similarly to the case of FIG. 31.

In the case of the configuration shown in FIG. 33, it is necessary to set the voltage of a write word line corresponding to an unselected row to the power-supply voltage Vcc in order to set a read word line RWL corresponding to an unselected row to the ground voltage Vss under data read.

Therefore, a write word line WWL corresponding to a selected memory-cell row is activated to L level under data read. Similarly to the case of FIG. 30, because each short-circuit transistor 42 is turned off under data read, it is possible to independently set the voltage of a write word line WWL every memory-cell row.

Moreover, because a control signal SD is activated (H level) under data read, a read word line RWL is activated to H level (power-supply voltage Vcc) in a selected memory-cell row. Thus, it is possible to selectively activate one read word line RWL corresponding to a row selection result.

Under data write, when either of the i-th or (i+1)-th memory-cell rows corresponding to the same write-word-line pair WWLP is selected, a write word line WWLi is activated to L level (ground voltage Vss). The other write word line /WWLi constituting the same write-word-line pair and a write word line WWL corresponding to an unselected memory-cell row are respectively set to H level (power-supply voltage Vss).

Similarly to the case of FIG. 30, because the short-circuit transistor 42 is turned on under data write, it is possible to circulate a data-write current Ip as a reciprocating current by write word lines WWL and /WWL forming a write-word-line pair WWLP corresponding to a selected memory-cell row.

However, because a control signal SD is inactivated (L level) under data write, each read word line RWL is set to an inactive state (L level: power-supply voltage Vcc).

Therefore, similarly to the case of FIG. 30, it is necessary to provide word drivers having configurations different from each other for write word lines WWL corresponding to an odd row and an even row. In FIG. 33, the configuration of a write word driver WDb1 corresponding to a write word line WWL1 and that of a write word driver /WDb1 corresponding to a write word line WWL2 (/WWL1) are typically described.

Referring to FIG. 33 again, the write word driver WDb1 has a logic gate LG21 for outputting a result of the logical product (AND) operation between write low decode signals /WRD1 and /WRD2, a logic gate LG23 for outputting a result of the NAND operation between an output signal and a read low decode signal /RRD1 of the logic gate LG21, and a P-type MOS transistor Q21 and an N-type MOS transistor Q22 electrically connected between the power-supply voltage Vcc, ground voltage Vss, and write word line WWL1, respectively. An output signal of the logic gate LG23 is input to gates of the transistors Q21 and Q22.

By using the above configuration, the write word driver WDb1 electrically connects the write word line WWL1 with the ground voltage Vss in response to the change of an output signal of the logic gate LG23 to H level when either of the write low decode signals /WRD1 and /WRD2 is activated to L level under data write. When both the write low decode signals /WRD1 and /WRD2 are inactivated to H level, an output signal of the logic gate LG23 is set to L level. Therefore, the write word driver WDb1 electrically connects the write word line WWL1 with the power-supply voltage Vcc.

The write word driver /WDb1 provided for the write word line WWL2 (/WWL1) has a P-type MOS transistor Q23 and an N-type MOS transistor Q24 electrically connected between the power-supply voltage Vcc, ground voltage Vss, and write word line WWL2, respectively. A read low decode signal RRD2 is input to gates of the transistors Q23 and Q24.

The read low decode signal RRD2 is inactivated to L level under data write independently of a row selection result. Therefore, the write word driver /WDb1 electrically connects the write word line WWL2 (/WWL1) with the power-supply voltage Vcc.

Because the short-circuit transistor 42-1 is turned on under data write in response to activation (H level) of a control signal WE, reciprocating current path is generated by the write word lines WWL1 and WWL2 (/WWL1) and a data-write current Ip is supplied when the first or second memory-cell row is selected and the write word lines WWL1 is set to the ground voltage Vss.

Because both the write low decode signals /WRD1 and /WRD2 are set to H level under data read, the write word driver WDb1 electrically connects the write word line WWL1 with the ground voltage Vss in response to the change of an output signal of the logic gate LG22 to H level when the read low decode signal/RRD1 is activated to L level. Thereby, the read word line RWL1 electrically connected with the write word line WWL1 is also activated to H level by the corresponding sub-word driver RSI11 or RSI21.

Under data read, the write word driver /WDb1 electrically connects the write word line WWL2 with the ground voltage Vss through the transistor Q23 in response of the activation (H level) of the read low decode signal/RRD2.

Because the short-circuit transistor 42-1 is turned off under data read, the write word lines WWL1 and WWL2 are independently activated in accordance with a row selection result. Correspondingly, the read word lines RWL1 and RWL2 are also activated to H level (power-supply voltage Vcc) by a corresponding sub-word driver.

A write word driver having the same configuration of the write word driver WDb1 is set to write word lines of subsequent odd memory-cell rows and a write word driver having the same configuration as the write word driver /WDb1 is set to write word lines /WWL corresponding to subsequent even memory-cell rows.

By using the above configuration, it is possible to accelerate data read by hierarchical read word lines RWL and reduce magnetic noises due to the reciprocating path of data-write current Ip.

Sixth Embodiment

Figure 35:
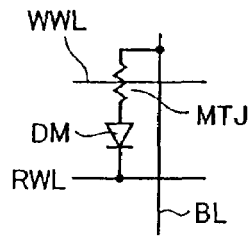
FIG. 35 is an illustration showing a configuration of an MTJ memory cell of a sixth embodiment.
Figure 48:
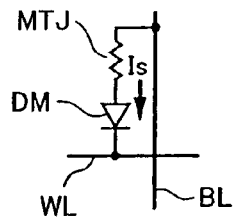
FIG. 48 is a schematic illustration showing a configuration of an MTJ memory cell using a diode.
Figure 49:
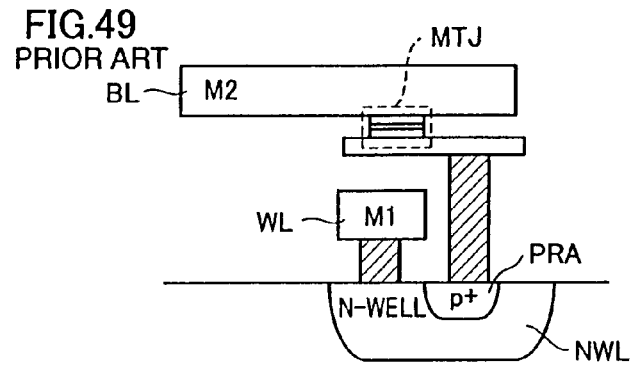
FIG. 49 is a structural drawing when setting the MTJ memory cell shown in FIG. 48 on a semiconductor substrate.

Referring to FIG. 35, an MTJ memory cell MCD of the sixth embodiment is provided with a magnetic tunnel junction portion MTJ and an access diode DM similarly to the configuration shown in FIG. 48. The configuration of the MTJ memory cell MCD is different from the configuration shown in FIG. 48 in that read word lines RWL are arranged separately from write word lines WWL. Bit lines BL are arranged so as to intersect with write word lines WWL and read word lines RWL and electrically connected with the magnetic tunnel junction portion MTJ.

The access diode DM is connected between the magnetic tunnel junction portion MTJ and read word lines RWL by assuming the direction from the magnetic junction MTJ toward the read word lines RWL as the forward direction. The write word lines WWL are set nearby the magnetic tunnel junction portion MTJ without being connected with other wirings.

Figure 36:
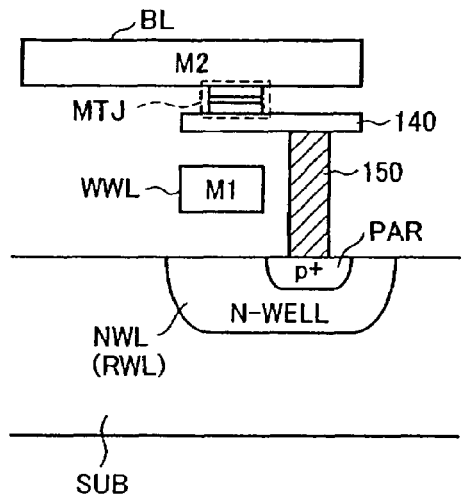
FIG. 36 is a structural drawing when setting an MTJ memory cell MCD on a semiconductor substrate.

Referring to FIG. 36, an N-type region NWL formed on a main semiconductor substrate SUB corresponds to the cathode of an access diode DM. When MTJ memory cells are arranged on the semiconductor substrate as a row, it is possible to connect the access diode DM shown in FIG. 25 with read word lines RWL by electrically connecting the N-type regions NWL each other for MTJ memory cells included in the same row without setting read word lines RWL. FIG. 36 shows a case of forming an N well as an N-type region. However, it is also possible to use an n+ diffusion region having a smaller resistance value instead of the N-type well. Or, it is permitted to arrange read word lines RWL on other metallic-wiring layer.

A P-type region PAR formed on the N-type region NWL corresponds to the anode of the access diode DM. The P-type region PAR is electrically connected with a magnetic tunnel junction portion MTJ through a barrier metal 140 and a metallic film 150.

Write word lines WWL and bit lines BL are arranged on metallic wiring layers M1 and M2. The bit lines BL are arranged so as to connect with the magnetic tunnel junction portion MTJ.

The distance between the bit lines BL and the magnetic tunnel junction portion MTJ is smaller than the distance between the write word lines WWL and the magnetic tunnel junction portion MTJ. Therefore, even when circulating the same quantity of current, the magnetic field generated by a data-write current circulating through a bit line BL is larger than the magnetic field generated by a data-write current circulating through a write word line WWL.

Therefore, to supply data-write magnetic fields having almost the same intensity to the magnetic tunnel junction portion MTJ, it is necessary to supply a data-write current larger than the current circulating through a bit line BL to a write word line WWL. Bit lines BL and write word lines WWL are formed on a metallic wiring layer in order to decrease wiring resistance values. However, when the current density of a wiring excessively increases, a disconnection due to electromigration or a short circuit between wirings occurs which may affect the operational reliability. Therefore, it is preferable to control the current density of a wiring through which a data-write current circulates.

Therefore, when arranging MTJ memory cells MCD of the sixth embodiment on a semiconductor substrate, it is possible to control the current density of a write word line WWL to which a large data-write current must be supplied and improve the reliability of an MRAM device by making the sectional area of a write word line WWL larger than that of a bit line BL closer to a magnetic tunnel junction portion MTJ.

Moreover, it is effective for improvement of reliability to form a metallic wiring (write word line WWL in the case of FIG. 3) to which a larger data-write current must be supplied out of a material having a high electromigration resistance. For example, when other metallic wiring is formed out of an aluminum alloy (Al alloy), it is permitted to form a metallic wiring for which electromigration resistance must be considered out of copper (Cu).

Figure 37:
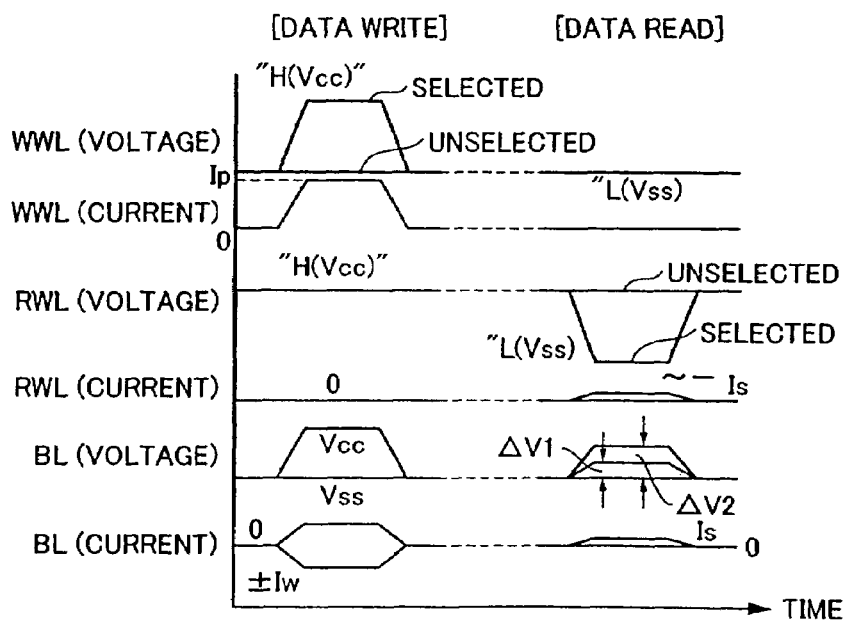
FIG. 37 is a timing chart for explaining the read operation and write operation for an MTJ memory cell MCD.

Referring to FIG. 37, the voltage of a read word line RWL, that is, an N-type region NWL is set to H level (power-supply voltage Vcc) under data write. No current circulates through the read word line RWL under data read.

The power-supply voltage Vcc is applied to a write word line WWL corresponding to a selected memory cell and a data-write current Ip is circulated. Moreover, by setting one end of a bit line BL to the power-supply voltage Vcc and the other end of the line BL to the ground voltage Vss in accordance with the level of write data, it is possible to circulate a data-write current ±Iw corresponding to the level of write data.

Figure 42:
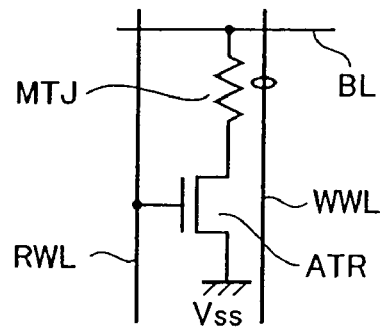
FIG. 42 is a schematic illustration showing a configuration of a memory cell having a magnetic tunnel junction.
Figure 43:
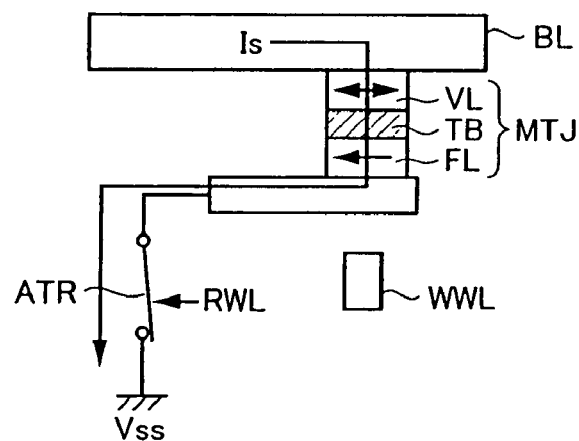
FIG. 43 is a conceptual illustration for explaining the data read operation from an MTJ memory cell.
Figure 44:
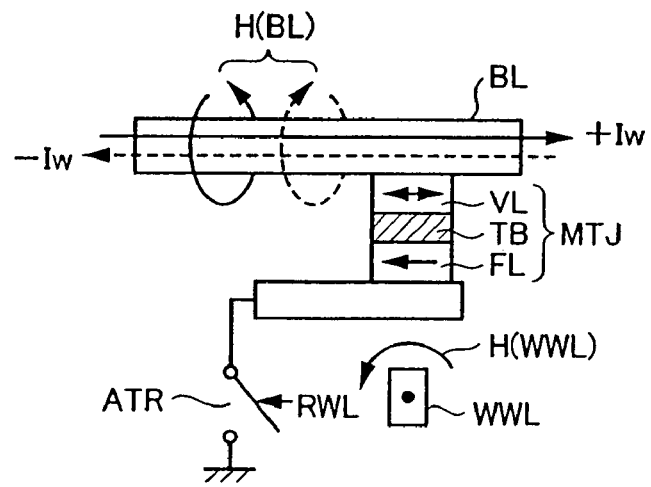
FIG. 44 is a conceptual illustration for explaining the data write operation for an MTJ memory cell.
Figure 45:
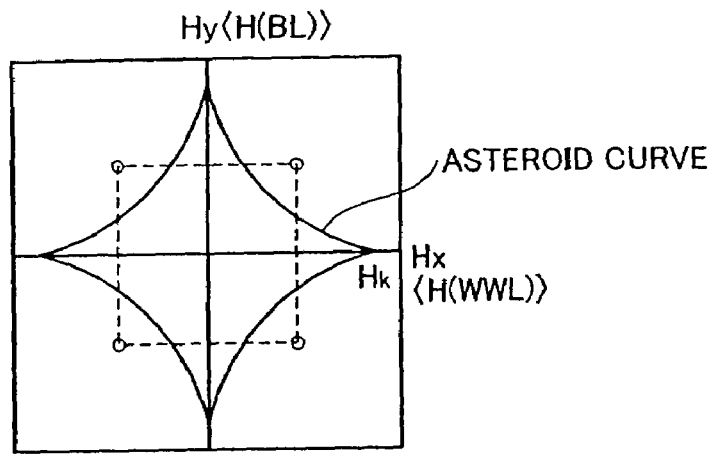
FIG. 45 is a conceptual illustration for explaining the relation between data-write current direction and magnetic-field direction under data write.
Figure 46:
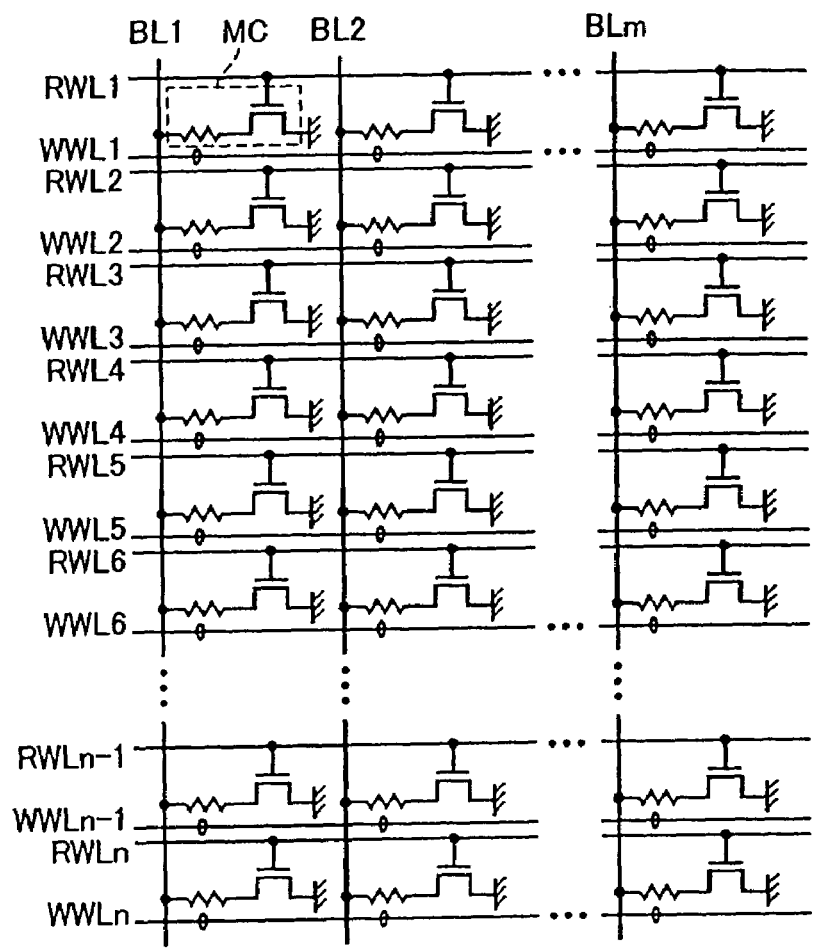
FIG. 46 is a conceptual illustration showing MTJ memory cells integrated as a row.
Figure 47:
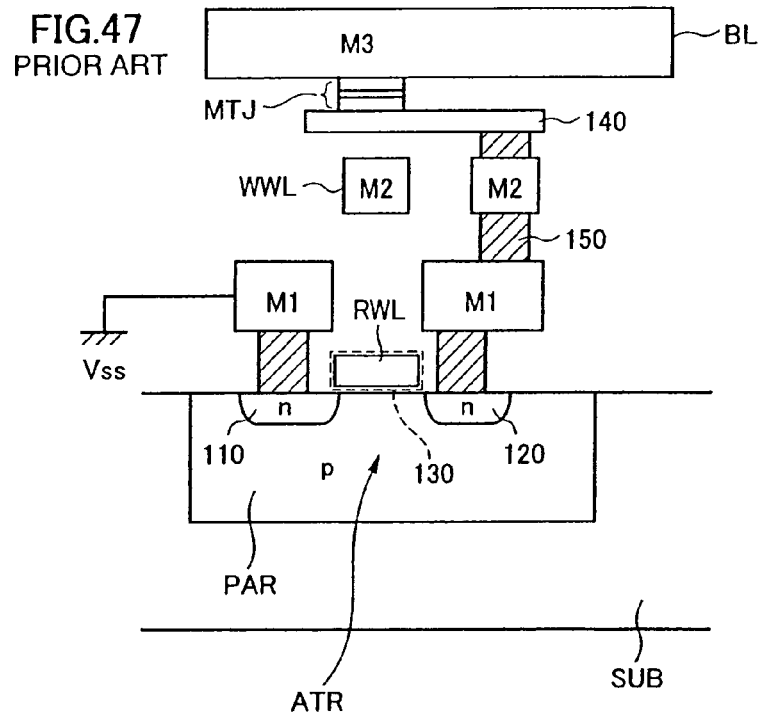
FIG. 47 is a structural drawing of MTJ memory cells arranged on a semiconductor substrate.

Data is written in an MTJ memory cell by the data-write currents Ip and ±Iw thus circulated. In this case, because a read word line RWL is set to the power-supply voltage Vcc, an access diode DM is securely turned off under data write. Therefore, it is possible to stabilize the data write operation compared to the case of the MTJ memory cell shown in FIG. 42.

Then, the data read operation is described below.

A bit line BL is precharged to the ground voltage Vss before data read.

A read word line RWL corresponding to a memory cell MCD from which data will be read is driven to an active state (L level: ground voltage Vss) under data read. Correspondingly, because an access diode DM is set to a forward bias, it is possible to execute data read by circulating a sense current Is through the path formed between bit line BL, magnetic tunnel junction portion MTJ, access diode DM, and read word line RWL (ground voltage Vss).

Specifically, by amplifying a voltage change generated in the bit line BL by the sense current Is, it is possible to read data from the magnetic tunnel junction portion MTJ.

Figure 38:
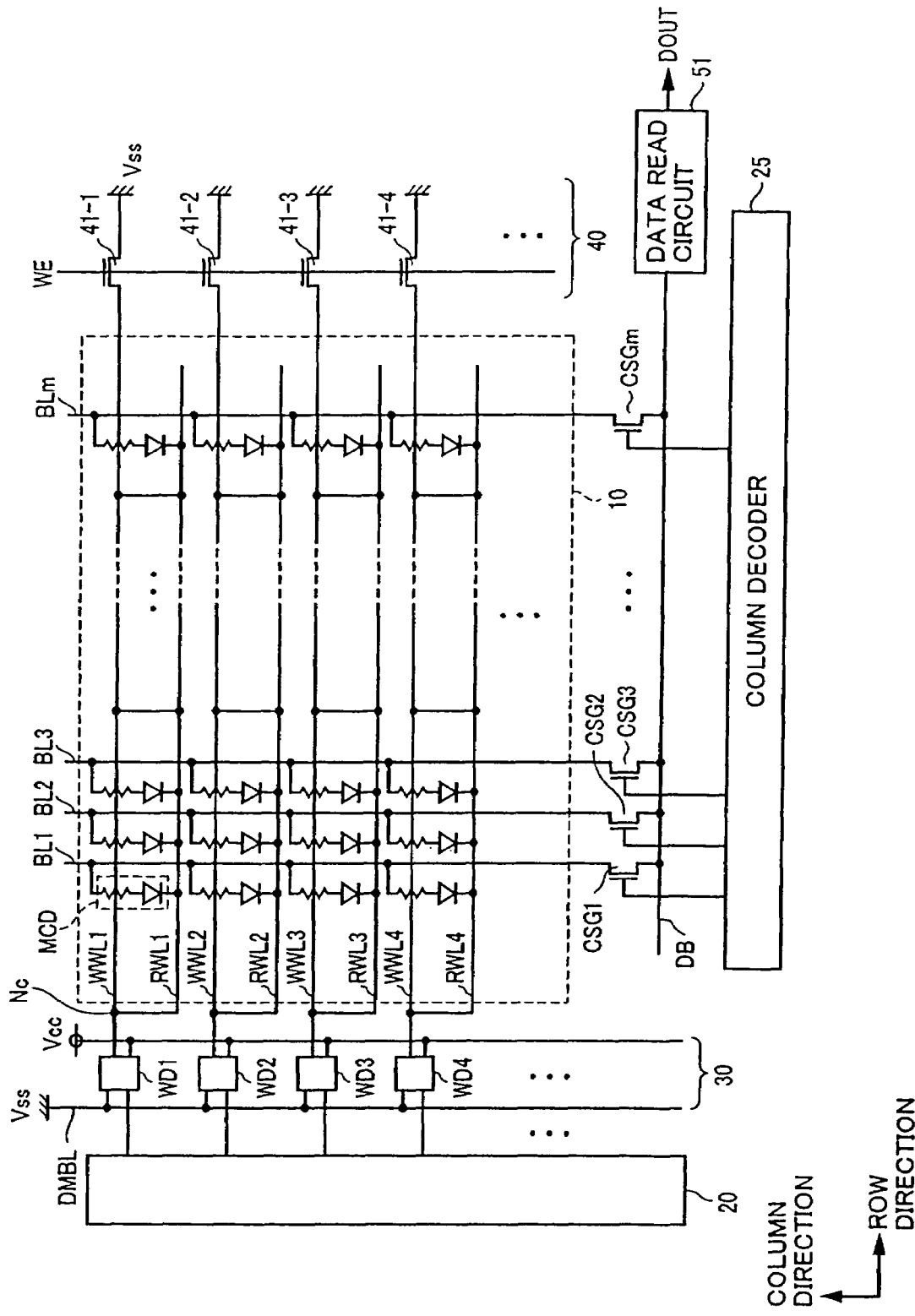
FIG. 38 is an illustration for explaining a configuration of a memory array and its peripheral circuit of the sixth embodiment.

Referring to FIG. 38, in the case of the configuration of the memory array 10 of the sixth embodiment, memory cells MCD having the configuration shown in FIG. 35 are arranged in a matrix. Write word lines WWL and read word lines RWL are arranged correspondingly to rows of the memory cells MCD. A current control transistor is set between each write word line WWL and the ground voltage Vss. Each current control transistor is turned on in response to the activation of a control signal WE.

FIG. 38 typically shows read word lines RWL1 to RWL4, write word lines WWL1 to WWL4, and current control transistors 41-1 to 41-4 corresponding to first to fourth memory-cell rows.

Each read word line RWL is electrically connected with a write word line WWL corresponding to the same memory-cell row. Thereby, a read word line RWL formed in an N-type region and having a comparatively-high resistance value is shunted by a write word line WWL formed by a metallic wiring having a low resistance value. By connecting the both lines RWL and WWL each other at a plurality of nodes, it is possible to further decrease a time constant. Thereby, it is possible to reduce the signal propagation delay of a read word line RWL and accelerate the data read operation.

A word-line driver 30 has a word driver corresponding to each write word line WWL. FIG. 38 typically shows word drivers WD1 to WD4 corresponding to first to fourth memory-cell rows. Moreover, symbol WD is used to generally call these word drivers.

Each word driver WD receives the power-supply voltage Vcc and ground voltage Vss from a power-supply node and a ground node. Particularly, the ground voltage Vss is supplied through a dummy bit line DMBL set in the same direction as a bit line BL.

When a corresponding memory-cell row is selected under data read and data write, each word driver WD electrically connects a corresponding write word line WWL with the power supply voltage Vcc. A corresponding write word line WWL is connected with the ground voltage Vss when it is unselected.

By using the above configuration, it is possible to supply a data-write current Ip to a write word line WWL corresponding to a selected memory-cell row.

Though a circuit configuration for supplying a data-write current ±Iw to a bit line BL is not illustrated, it is possible to supply the data-write current ±Iw by controlling voltages at the both ends of the bit line BL similarly to the case of the first embodiment.

A sense current Is under data read is supplied by a data read circuit 51 similarly to the case of the fourth embodiment. The sense current Is is supplied through a data bus DB and a column selection gate CSG set between the data bus DB and a bit line BL.

Under data read, a read word line RWL corresponding to an unselected row is set to a high-voltage state (H level) and a read word line RWL corresponding to a selected row is activated to the ground voltage Vss. Thereby, the PN junction of an access diode DM is set to a forward bias and a sense current Is is supplied to the current path formed between data bus DB, column selection gate CSG, bit line BL, magnetic tunnel junction portion MTJ, access diode DM, lead word line RWL, word driver WD, dummy bit line DMBL, and ground voltage Vss.

Therefore, by designing the arrangement of a data bus DB and a read word line RWL similarly to the arrangement of the source line SL and data bus DB in FIG. 26, it is possible to keep resistance values of sense-current paths almost constant independently of the position of a memory-cell column.

Moreover, by designing the arrangement of a dummy bit line DMBL and a bit line BL similarly to the case of FIG. 27, it is possible to keep the sum of resistance values of the sense current path independently of the position of a selected memory-cell row similarly to the case of the embodiment and its modification.

Thus, also in the case of a memory array in which MTJ memory cells suitable for high integration are arranged, it is possible to control the fluctuation of a sense current depending on the position of a selected memory cell and stably secure the operational margin under data read from an MRAM device.

First Modification of the Sixth Embodiment

Figure 39:
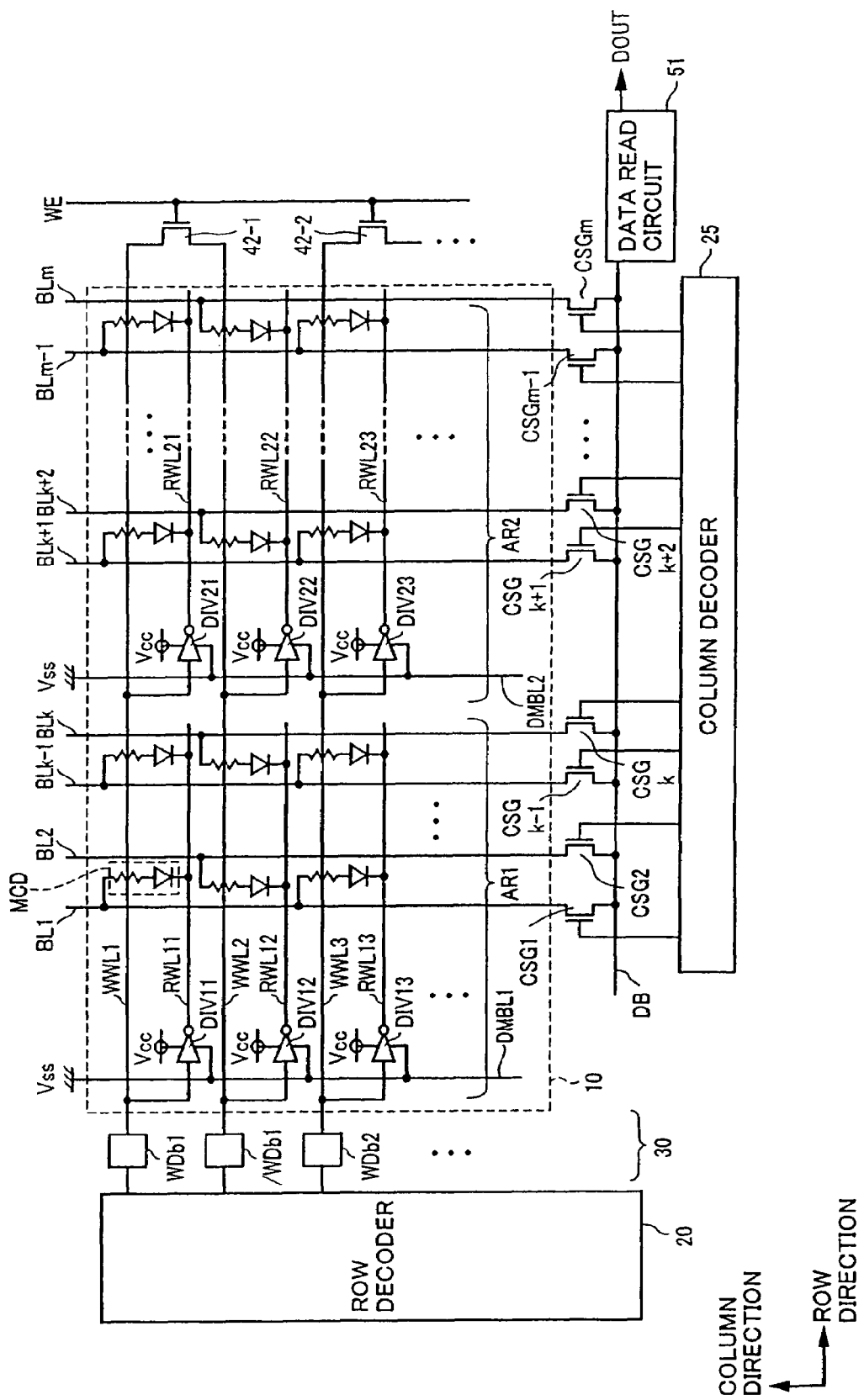
FIG. 39 is an illustration for explaining a configuration of a memory array and its peripheral circuit of the first modification of the sixth embodiment.

Referring to FIG. 39, in the case of the configuration of first modification of the sixth embodiment, a data-write current is circulated by using a write word line-pair forming a reciprocating-current path similarly to the case of the fifth embodiment and its second and fourth modifications.

Each read word line RWL is independently formed in regions AR1 and AR2 similarly to the case of FIG. 2. Each read word line RWL is driven by a drive inverter for inverting the voltage state of a write word line WWL corresponding to the same memory-cell row. Drive inverters are arranged correspondingly to read word lines RWL. Write word lines WWL are set to the regions AR1 and AR2 in common. Thereby, the wiring resistance of a read word line RWL can be reduced by shortening the line RWL, it is possible to accelerate data read.

Moreover, when a write word line WWL is set to an unselected state (L level), the voltage of a corresponding read word line RWL is set to H level. Therefore, the backward bias state of an access diode DM is secured. The ground voltage Vss is supplied to drive inverters by the dummy bit lines DMBL1 and DMBL2 provided similarly to the case of FIG. 38 correspondingly to the regions AR1 and AR2.

FIG. 39 typically shows read word lines RWL11 to RWL13 and RWL21 to RWL23, write word lines WWL11 to WWL13 and WWL21 to WWL23, and drive inverters DIV11 to DIV13 and DIV21 to DIV23 which correspond to first to third memory cell rows. Write word lines WWL1 and WWL2 (/WWL1) form a write-word-line pair WWLP1 and the short-circuit transistor 42-1 is set between the lines WWL1 and WWL2(/WWL1). Read word lines, write word lines, and drive inverters are similarly arranged for the subsequent memory-cell rows.

A write word driver having the same configuration as the write word driver WDb1 shown in FIG. 33 is set to a write word line WWL corresponding to an odd-numberth memory-cell row. Similarly, a write word driver having the same configuration as the write word driver /WDb1 shown in FIG. 33 is set to a write word line WWL corresponding to an even-numberth memory-cell row.

A circuit configuration for supplying data-write current ±Iw to a bit line BL is not illustrated. However, it is possible to circulate the data-write current ±Iw by controlling voltages at the both ends of the bit line BL similarly to the case of the first embodiment.

By using the above configuration, it is possible to form a reciprocating-current path by a write-word-line pair WWLP corresponding to a selected memory-cell row and circulate a data-write current Ip under data write. Thus, it is possible to simplify the configuration of peripheral circuits and reduce the magnetic-field noise.

Moreover, by designing the arrangement of a data bus DB and a read word line RWL similarly to the arrangement of the source line SL and data bus DB in FIG. 26, it is possible to keep resistance values of sense-current paths almost constant independently of the position of a selected memory-cell column in the regions AR1 and AR2.

Furthermore, by designing the arrangement of the dummy bit lines DMBL1 and DMBL2 and a bit line BL similarly to the arrangement described for FIG. 27, it is possible to keep the sum of resistance values of the sense-current paths independently of the position of a selected memory-cell row in the regions AR1 and AR2.

Furthermore, though not illustrated, by setting the data bus DB and the data read circuit 51 every region in which read word lines RWL are independently arranged, it is possible to keep the sum of resistance values of sense-current paths independently of the position of a selected memory cell in the memory array 10.

Thus, even when using a configuration of forming a reciprocating-current path and supplying a data-write current to write word lines WWL in an memory array in which MTJ memory cells MCD suitable for high integration are arranged, it is possible to control the fluctuation of the sense current depending on the position of a selected memory cell and stably secure the operational margin under data read from an MRAM device.

Second Modification of the Sixth Embodiment

Figure 40:
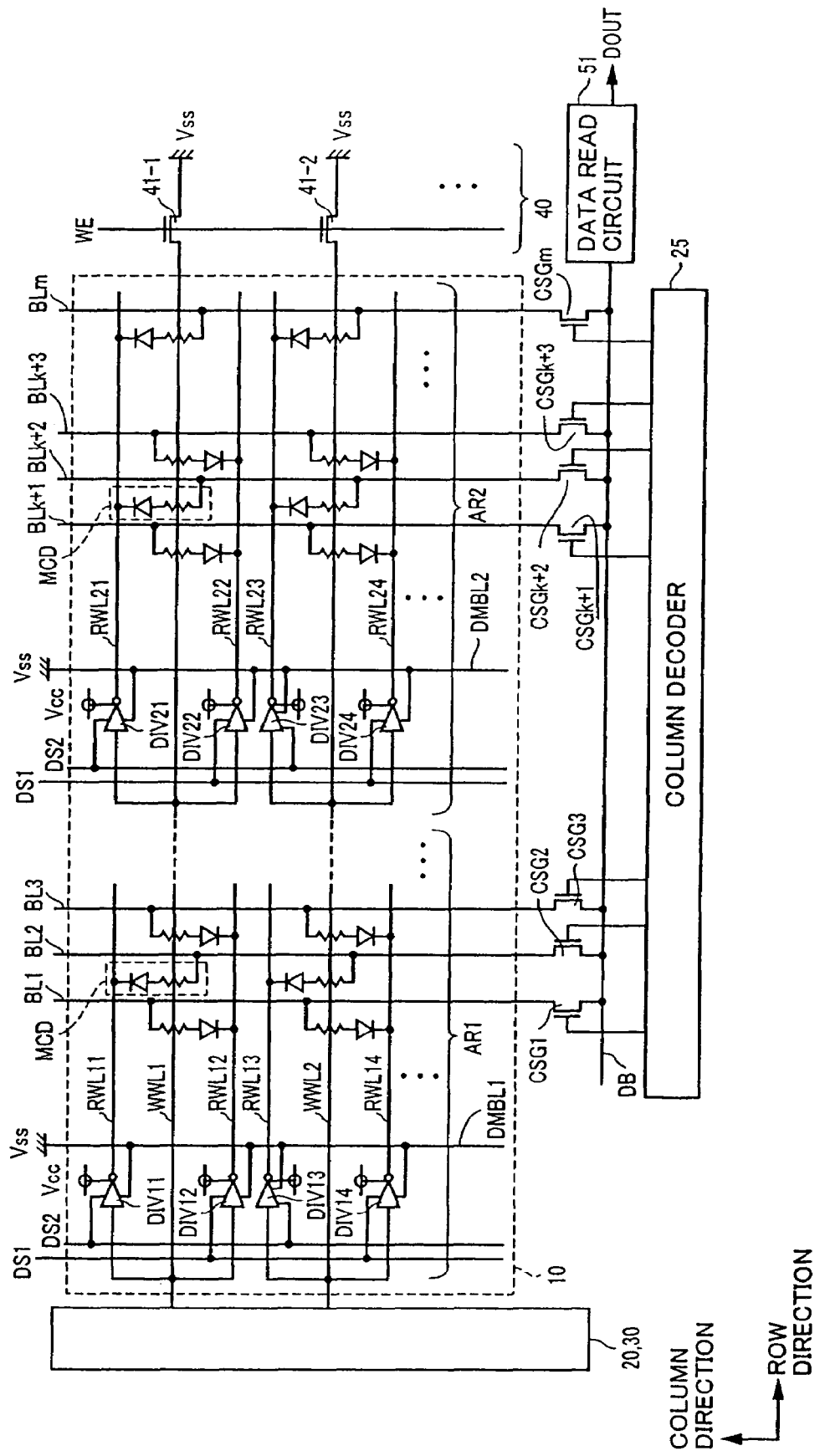
FIG. 40 is an illustration for explaining a configuration of a memory array and its peripheral circuit of the second modification of the sixth embodiment.

Referring to FIG. 40, in the case of the configuration of the second modification of the sixth embodiment, a write word line WWL is shared similarly to the case of the first and third modifications of the fifth embodiment. A write word line WWL is shared every two adjacent memory-cell rows.

Similarly to the case of FIG. 39, read word lines RWL are independently arranged in regions AR1 and AR2 and write word lines WWL are provided for the regions AR1 and AR2 in common. Read word lines RWL are hierarchically arranged to the write word lines WWL. Thereby, because the wiring resistance of a read word line RWL can be decreased by shortening the line RWL, it is possible to accelerate data read.

Each read word line RWL is driven by a drive inverter for inverting the voltage state of a corresponding write word line WWL. Drive inverters are arranged correspondingly to read word lines RWL. Ground voltage Vss is supplied to each drive inverter by dummy bit lines DMBL1 and DMBL2 arranged similarly to the case of FIG. 39.

Drive inverters corresponding to two memory-cell rows sharing the same write word line WWL respectively set the voltage of a corresponding read word line RWL to H level when the common write word line WWL is set to an unselected state (L level). Therefore, it is possible to securely set each access diode DM corresponding to an unselected memory-cell row to a backward bias.

A current control transistor is set between each write word line WWL and the ground voltage Vss. Each current control transistor is turned on in response to the activation of a control signal WE.

FIG. 40 typically shows read word lines RWL11 to RWL14 and RWL21 to RWL24, drive inverters DIV11 to DIV14 and DIV21 to DIV24, write word lines WWL1 and WWL2, and current control transistors 41-1 and 41-2, corresponding to first to fourth memory-cell rows. The write word line WWL1 is shared by first and second memory-cell rows and the write word line WWL2 is shared by third and fourth memory-cell rows. Read word lines, write word lines, and driver inverters are similarly arranged for the subsequent memory-cell rows.

Though a circuit configuration for supplying a data-write current ±Iw to a bit line BL is not illustrated, it is possible to supply the data-write current ±Iw by controlling voltages at the both ends of the bit line BL similarly to the case of the first embodiment.

By using the above configuration, it is possible to share write word lines WWL and decrease the number of write word lines WWL of the whole memory array 10. As a result, since the write word lines WWL can be arranged by using layout regions for two rows, it is possible to secure a sufficient sectional area by, for example, securing a sufficient wiring width.

Thereby, in the case of a write word line WWL to which a comparatively large data-write current must be supplied, it is possible to avoid hazards such as a short circuit between wirings and disconnection of a wiring due to electromigration by reducing the current density and stabilize operations of an MRAM device.

Moreover, by designing the arrangement of a data bus DB and read word lines RWL similarly to the case of the source lines SL and the data bus DB in FIG. 26, it is possible to keep resistance values of sense-current paths almost constant independently of the position of a selected memory-cell column in regions AR1 and AR2, respectively.

Furthermore, by designing the arrangement of dummy bit lines DMBL1 and DMBL2 similarly to the arrangement described for FIG. 27, it is possible to keep the sum of resistance values of sense-current paths almost constant independently of the position of a selected memory-cell row in the regions AR1 and AR2, respectively.

Though not illustrated, by arranging the data bus DB and data read circuit 51 every region in which read word lines RWL are independently arranged, it is possible to keep the sum of resistance values of sense-current paths almost constant independently of the position of a selected memory cell.

Thus, even when using the configuration sharing a write word line WWL between adjacent memory cells in a memory array in which MTJ memory cells MCD suitable for high integration are arranged, it is possible to control the change of the sense current depending on the position of a selected memory cell and stably secure the operational margin under data read from an MRAM device.

Third Modification of the Sixth Embodiment

Figure 41:
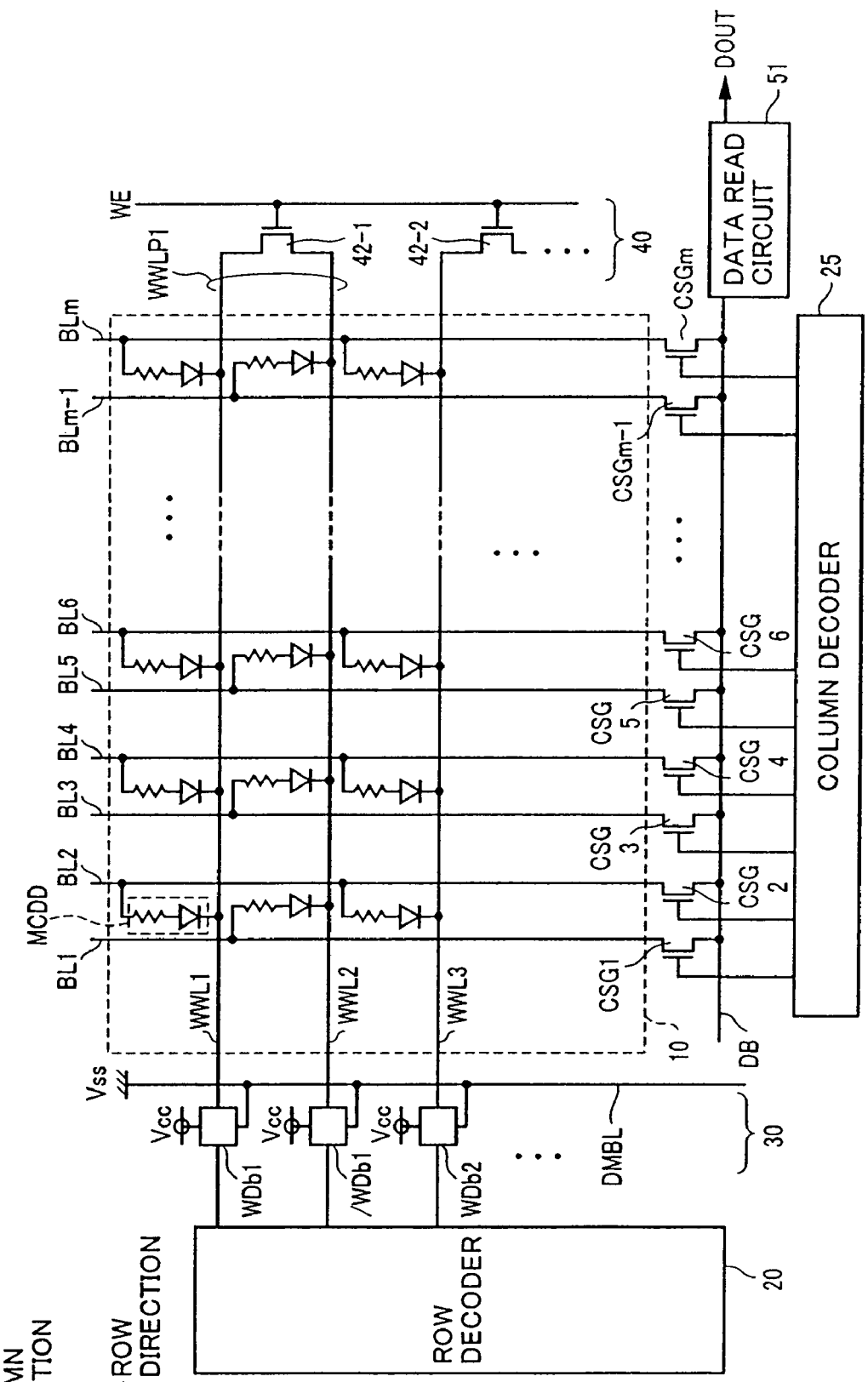
FIG. 41 is an illustration for explaining a configuration of a memory array and its peripheral circuit of the third modification of the sixth embodiment.

Referring to FIG. 41, in the case of the configuration of the third modification of the sixth embodiment, a data-write current is circulated through a reciprocating current path in a memory array in which the MTJ memory cell MCDD shown in FIG. 48 is arranged.

Word lines WL and bit lines BL are arranged for memory cell rows and memory-cell columns of memory cells MCDD arranged in a matrix.

Each word line WL is driven by a word driver. A word driver having the same configuration as the write word driver WDb1 shown in FIG. 33 is set to a word line WL corresponding to an odd-numberth memory-cell row. Similarly, a word driver having the same configuration as the write word driver /WDb1 shown in FIG. 33 is set to a word line WL corresponding to an even-numberth memory-cell row. The ground voltage Vss is supplied to each word driver through a dummy bit line DMBL provided in the same direction as a bit line BL.

Therefore, under data write, two write word lines WWL corresponding to an odd row and an even row and forming a write-word-line pair corresponding to a selected memory-cell row are set to the ground voltage Vss and power-supply voltage Vcc. Moreover, when each short-circuit transistor is turned on, a data-write current is circulated through the write-word-line pair corresponding to the selected memory-cell row as reciprocating current.

Under data read, however, each short-circuit transistor is turned off and only a word line WL corresponding to a selected memory-cell row is selectively set to the ground voltage Vss (L-level voltage).

FIG. 41 typically shows word lines WL1 to WL3 and word drivers WDb1, /WDb1 and WDb2 corresponding to first to third memory-cell rows. Write word lines WWL1 and WWL2 (/WWL1) form a write-word-line pair WWLP1 and a short-circuit transistor 42-1 is set between the lines WWL1 and WWL2. Read word lines, write word lines, and drive inverters are similarly arranged for the subsequent memory-cell rows.

A circuit configuration for supplying a data-write current ±Iw to a bit line BL is not illustrated. However, it is possible to supply the data-write current ±Iw by controlling voltage at the both ends of the bit line BL similarly to the case of the first embodiment.

By using the above configuration, it is possible to supply a data-write current Ip by a word line WL for forming a reciprocating current path even in the case of a memory array in which memory cells MCDD using a single word line WL are arranged. As a result, it is possible to simplify peripheral circuits and reduce magnetic-field noises.

Moreover, by designing the arrangement of a data bus DB and word lines WL similarly to the case of the source lines SL and the data bus DB in FIG. 26, it is possible to keep resistance values of sense-current paths almost constant independently of the position of a selected memory-cell column.

Furthermore, by designing the arrangement of dummy bit lines DMBL and bit lines BL similarly to the case of FIG. 27, it is possible to keep the sum of resistance values of sense-current paths independently of the position of a selected memory-cell row similarly to the case of the fourth embodiment and its modifications.

Thus, in the case of a memory array in which MTJ memory cells MCDD suitable for high integration are arranged, it is possible to control the fluctuation of a sense current depending on the position of a selected memory cell and stably secure the operational margin under data read from an MRAM device with the configuration that reciprocating current path is formed and data-write current is circulated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a memory array having a plurality of magnetic memory cells arranged in a matrix,
in which each of said magnetic memory cells includes a storage section whose resistance values are changed in accordance with the level of storage data that is written in response to an applied magnetic field generated by first and second data write current;
a plurality of first write current lines arranged along a first direction and passing said first data write current therethrough;
a plurality of second write current lines arranged along a second direction crossing said first direction and passing said second data write current therethrough;
a write current supply circuit disposed at one end of said plurality of first write current lines, wherein
the other end of said plurality of first write current lines is electrically connected to a predetermined voltage that is different from a current source voltage of said write current supply circuit in a connected region arranged across the memory array from said write current supply circuit, and
each of said first write current lines is configured to externally apply a magnetic field induced by said first data write current to a magnetic tunnel junction of each magnetic memory cell.

2. The semiconductor device according to claim 1, wherein said predetermined voltage is ground voltage.

3. A semiconductor device comprising:
a memory array having a plurality of magnetic memory cells arranged in a matrix,
in which each of said magnetic memory cells includes a storage section whose resistance values are changed in accordance with the level of storage data that is written in response to an applied magnetic field generated by first and second data write current;
a plurality of first write current lines arranged along a first direction and passing said first data write current therethrough;
a plurality of second write current lines arranged along a second direction crossing said first direction and passing said second data write current therethrough; and
a write current supply circuit disposed at one end of said plurality of first write current lines, wherein
the other end of said plurality of first write current lines is electrically connected to a predetermined voltage that is different from a current source voltage of said write current supply circuit in a connected region arranged across the memory array from said write current supply circuit, and
said first write current lines are electrically disconnected from the respective magnetic memory cells.

4. The semiconductor device according to claim 3, wherein said predetermined voltage is ground voltage.

* * * * *